(12) United States Patent
Kanda et al.

(10) Patent No.: US 11,211,312 B2
(45) Date of Patent: Dec. 28, 2021

(54) SEMICONDUCTOR DEVICE

(71) Applicant: ROHM CO., LTD., Kyoto (JP)

(72) Inventors: Takumi Kanda, Kyoto (JP); Masaaki Matsuo, Kyoto (JP); Soichiro Takahashi, Kyoto (JP); Yoshitoki Inami, Kyoto (JP); Kaito Inoue, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 16 days.

(21) Appl. No.: 16/642,721

(22) PCT Filed: Nov. 19, 2018

(86) PCT No.: PCT/JP2018/042684
§ 371 (c)(1),
(2) Date: Feb. 27, 2020

(87) PCT Pub. No.: WO2019/098368
PCT Pub. Date: May 23, 2019

(65) Prior Publication Data
US 2020/0266134 A1 Aug. 20, 2020

(30) Foreign Application Priority Data

Nov. 20, 2017 (JP) .............................. JP2017-222602
Nov. 21, 2017 (JP) .............................. JP2017-223349

(51) Int. Cl.
*H01L 23/495* (2006.01)
(52) U.S. Cl.
CPC .. *H01L 23/49562* (2013.01); *H01L 23/49524* (2013.01); *H01L 23/49579* (2013.01)
(58) Field of Classification Search
CPC ......... H01L 23/49562; H01L 23/49524; H01L 23/49579
See application file for complete search history.

(56) References Cited

U.S. PATENT DOCUMENTS

2014/0008781 A1* 1/2014 Nishi ...................... H01L 24/36
257/691
2019/0103402 A1* 4/2019 Tsuchimochi .......... H01L 23/08

FOREIGN PATENT DOCUMENTS

DE  21 2018 000 087 U1  5/2019
JP  3-191554 A  8/1991
(Continued)

OTHER PUBLICATIONS

International Search Report issued in PCT/JP2018/042684, dated Jan. 22, 2019.

*Primary Examiner* — Peniel M Gumedzoe
(74) *Attorney, Agent, or Firm* — Hamre, Schumann, Mueller & Larson, P.C.

(57) ABSTRACT

A semiconductor device includes a first conductive plate, a second conductive plate, first switching elements, second switching elements, a first supply terminal and a second supply terminal. The first and second conductive plates are spaced apart from each other in a first direction. The first switching elements are bonded to the first conductive plate, and are electrically connected to the second conductive plate. The second switching elements are bonded to the second conductive plate. The first supply terminal is bonded to the first conductive plate. The second supply terminal has a region that overlaps with the first supply terminal as viewed in a plan view. The second supply terminal is spaced apart from the first conductive plate and the first supply terminal in a thickness direction perpendicular to the first direction. The second supply terminal is electrically connected to the second switching elements.

24 Claims, 37 Drawing Sheets

(56) References Cited

FOREIGN PATENT DOCUMENTS

| JP | 9-102578 A | 4/1997 |
|---|---|---|
| JP | 2006-165498 A | 6/2006 |
| JP | 2007-59737 A | 3/2007 |
| JP | 2007-73743 A | 3/2007 |
| JP | 2009-158787 A | 7/2009 |
| JP | 2014-17319 A | 1/2014 |
| JP | 2015-76442 A | 4/2015 |

* cited by examiner

SEMICONDUCTOR DEVICE

TECHNICAL FIELD

The present invention relates to a semiconductor device provided with a plurality of switching elements.

BACKGROUND ART

Conventionally, a variety of semiconductor devices (power modules) provided with a plurality of switching elements (power MOSFETs or IGBTs) have been proposed. Such semiconductor devices can be used to form part of an apparatus for performing power conversion such as a DC-DC converter. For example, Patent Document 1 below discloses an example of a conventional semiconductor device provided with a plurality of switching elements. In this conventional semiconductor device, a conductive layer made of a metal foil is formed on an insulating substrate, and the plurality of switching elements are joined to this conductive layer.

Heat is generated by the switching elements while the switching elements operate, and the temperature of the conductive layer increases. Since, a thin metal foil is used as the conductive layer in the above-described conventional semiconductor device, the conductive layer has relatively high resistance to heat conduction. Accordingly, the conductive layer tends to stay to be in a high temperature state in the vicinity of switching elements in operation.

PRIOR ART DOCUMENTS

Patent Document

Patent Document 1: JP-2009-158787A

SUMMARY OF INVENTION

Problem to be Solved by Invention

In view of the above-described circumstances, the present invention aims to provide a semiconductor device that has an improved heat dissipation, compared to conventional ones.

Means for Solving Problem

A semiconductor device that is provided according to a first aspect of the present invention includes: an insulating layer that has a main surface oriented in a thickness direction; a first conductive plate and a second conductive plate that are bonded to the main surface, and are spaced apart from each other in a first direction perpendicular to the thickness direction; a plurality of first switching elements that are electrically bonded to the first conductive plate, and are electrically connected to the second conductive plate; a plurality of second switching elements that are electrically bonded to the second conductive plate; a first supply terminal that is electrically bonded to the first conductive plate; and a second supply terminal that is spaced apart from both the first conductive plate and the first supply terminal in the thickness direction, and is electrically connected to the plurality of second switching elements, where the first conductive plate and the second conductive plate have a thickness that is larger than a thickness of the insulating layer.

A semiconductor device that is provided according to a second aspect of the present invention includes: a first conductive plate that has a first main surface perpendicular to a thickness direction of the first conductive plate; a second conductive plate that has a second main surface perpendicular to the thickness direction, and is spaced apart from the first conductive plate in a first direction perpendicular to the thickness direction; a plurality of first switching elements that are electrically bonded to the first conductive plate, and are electrically connected to the second conductive plate; and a plurality of second switching elements that are electrically bonded to the second conductive plate; a first supply terminal that is electrically bonded to the first conductive plate; and a second supply terminal that has a region that overlaps with the first supply terminal as viewed in the thickness direction, and is spaced apart from the first conductive plate and the first supply terminal in the thickness direction, where the second supply terminal is electrically connected to the plurality of second switching elements.

The other features and advantages of the present invention will become apparent from the detailed description given below with reference to the accompanying drawings.

MODE FOR CARRYING OUT INVENTION

Embodiments of the present invention will be described with reference to the accompanying drawings.

Figure 6:
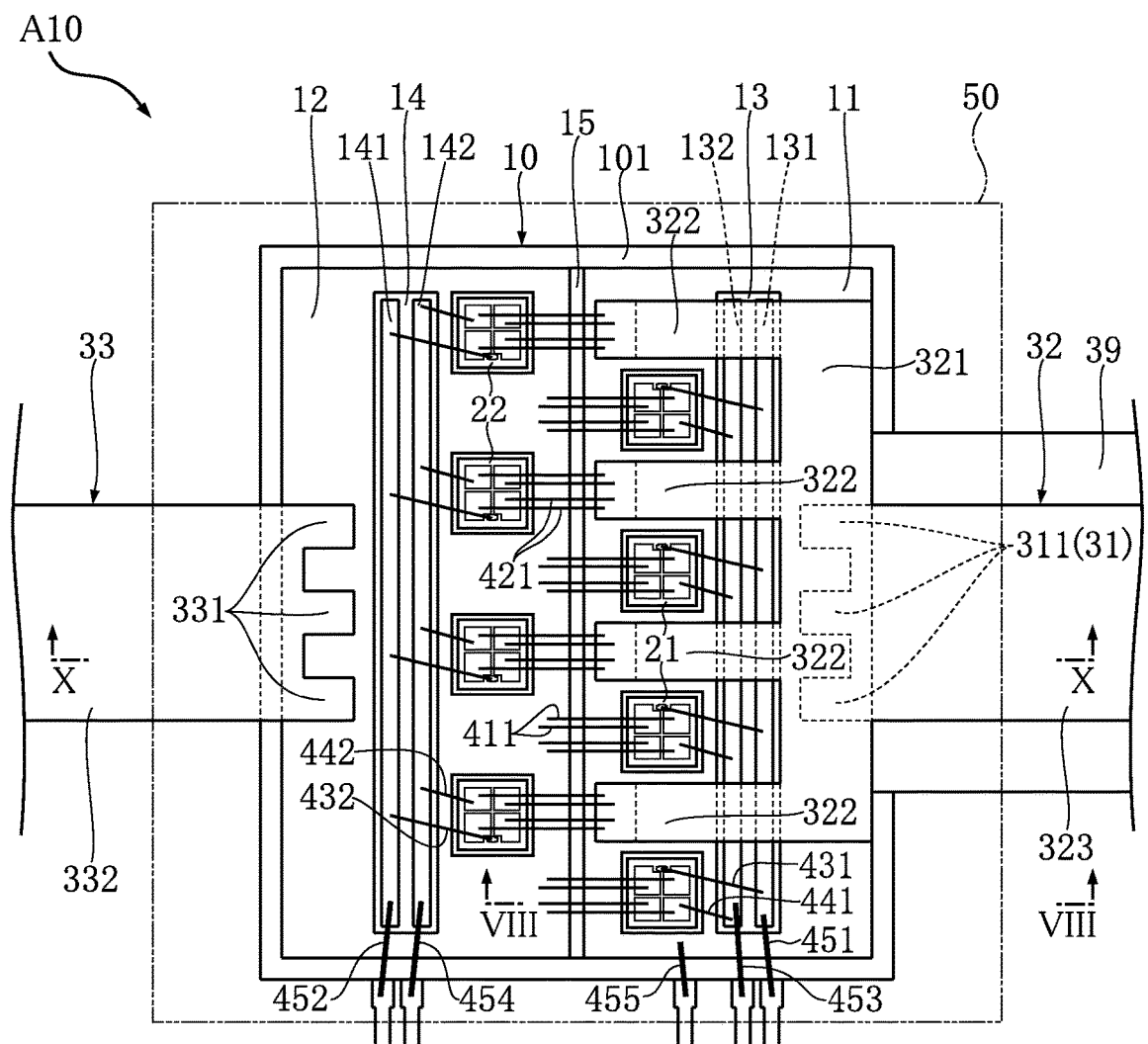
FIG. 6 is a plan view of the semiconductor device, with a sealing resin being transparent.
Figure 7:
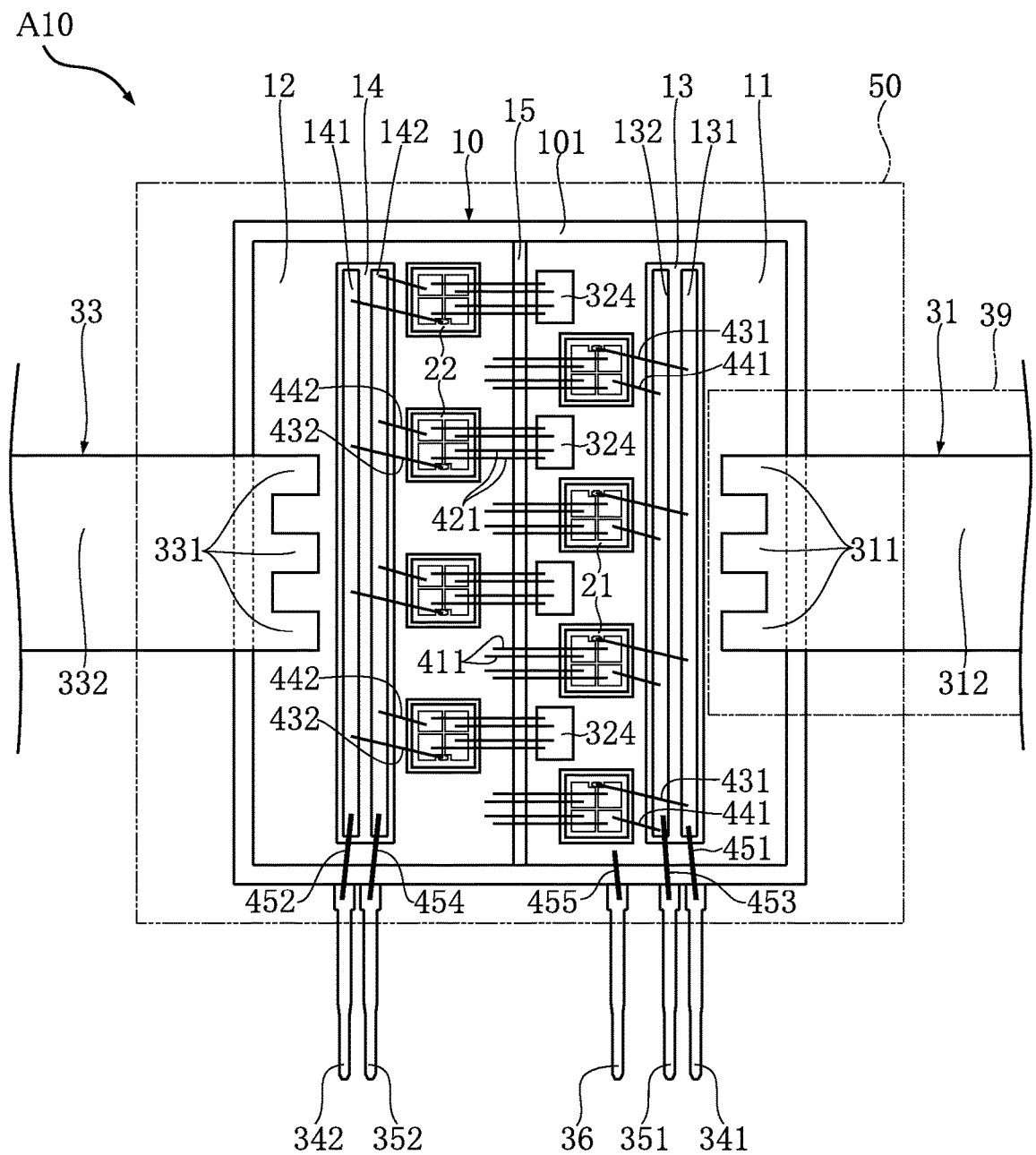
FIG. 7 is a plan view that corresponds to FIG. 6, with a second supply terminal omitted and a terminal insulating member being transparent.
Figure 8:
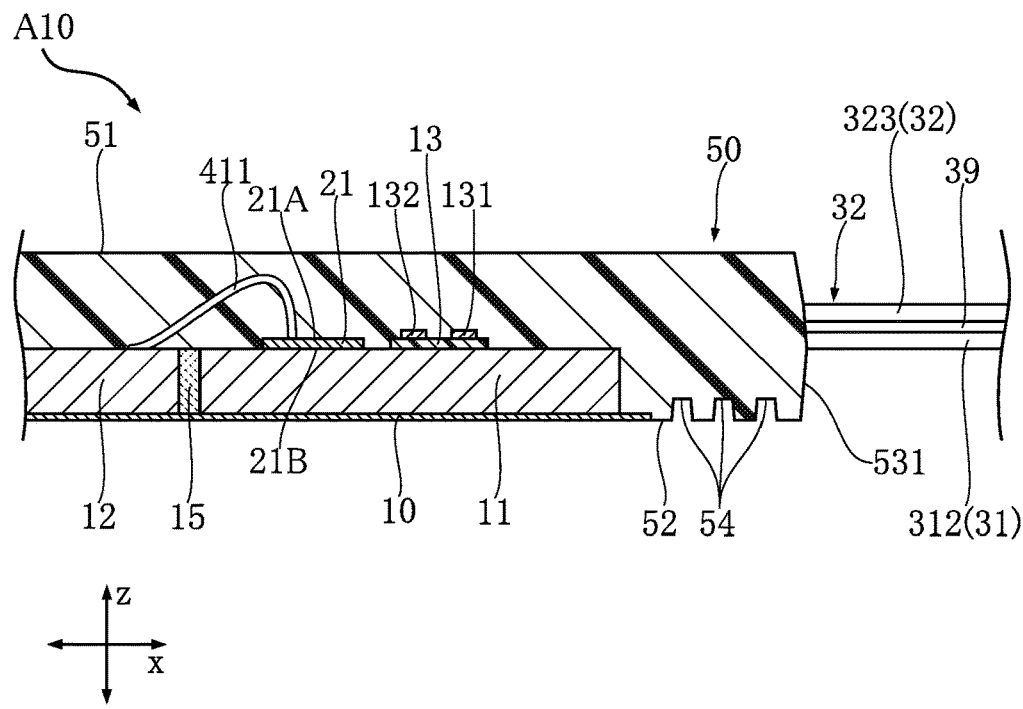
FIG. 8 is a cross-sectional view taken along a line VIII-VIII in FIG. 6.

A semiconductor device A10 according to a first embodiment of a first aspect will be described with reference to FIGS. 1 to 13. The semiconductor device A10 is provided with an insulating layer (insulating substrate) 10, a first conductive plate 11, a second conductive plate 12, a plurality of first switching elements 21, a plurality of second switching elements 22, a first supply terminal 31, and a second supply terminal 32. In addition thereto, the semiconductor device A10 is provided with an insulating material 15 (see e.g. FIG. 9), a terminal insulating member 39 (see e.g. FIG. 1), a plurality of first conductive wires 411, a plurality of second conductive wires 421, and a sealing resin 50. In FIG. 6, the sealing resin 50 is transparent, for convenience of understanding. Furthermore, in FIG. 7, the second supply terminal 32 is omitted and the terminal insulating member 39 is transparent. The sealing resin 50 that is transparent in FIGS. 6 and 7, and the terminal insulating member 39 that is transparent in FIG. 7 are indicated by virtual lines (dashed-two dotted lines).

Figure 1:
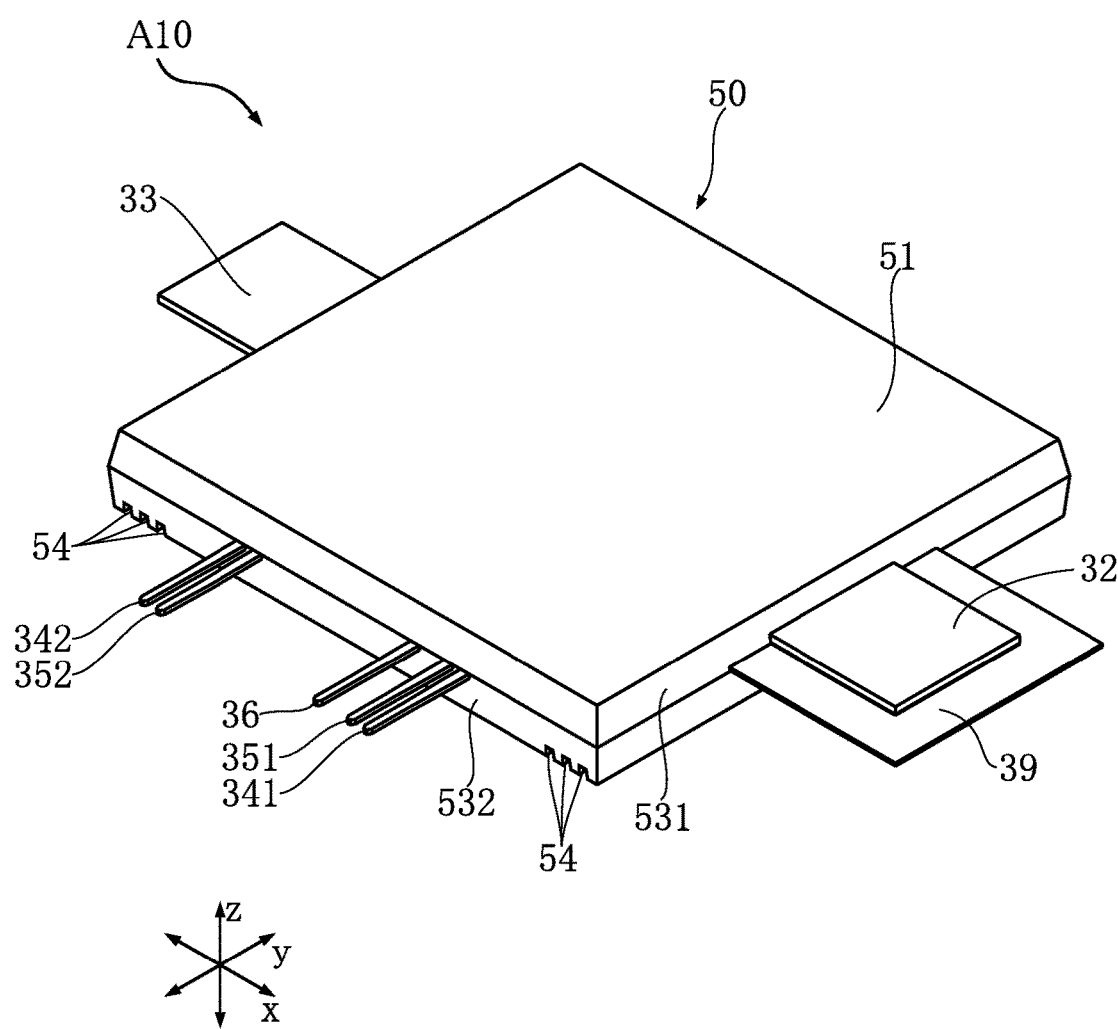
FIG. 1 is a perspective view illustrating a semiconductor device according to a first embodiment of a first aspect.

The semiconductor device A10 is a power module for performing power conversion. As shown in FIG. 1 for example, the semiconductor device A10 has a relatively small thickness (size in a thickness direction z). A direction that is perpendicular to the thickness direction z and in which the first supply terminal 31 (or the second supply terminal 32) and an output terminal 33 extend is referred to as a "first direction x". Furthermore, a direction that is perpendicular to both the thickness direction z and the first direction x is referred to as a "second direction y". Note that, in the following description, the expression "as viewed in the thickness direction" has the same meaning as the expression "as viewed in a plan view".

Figure 9:
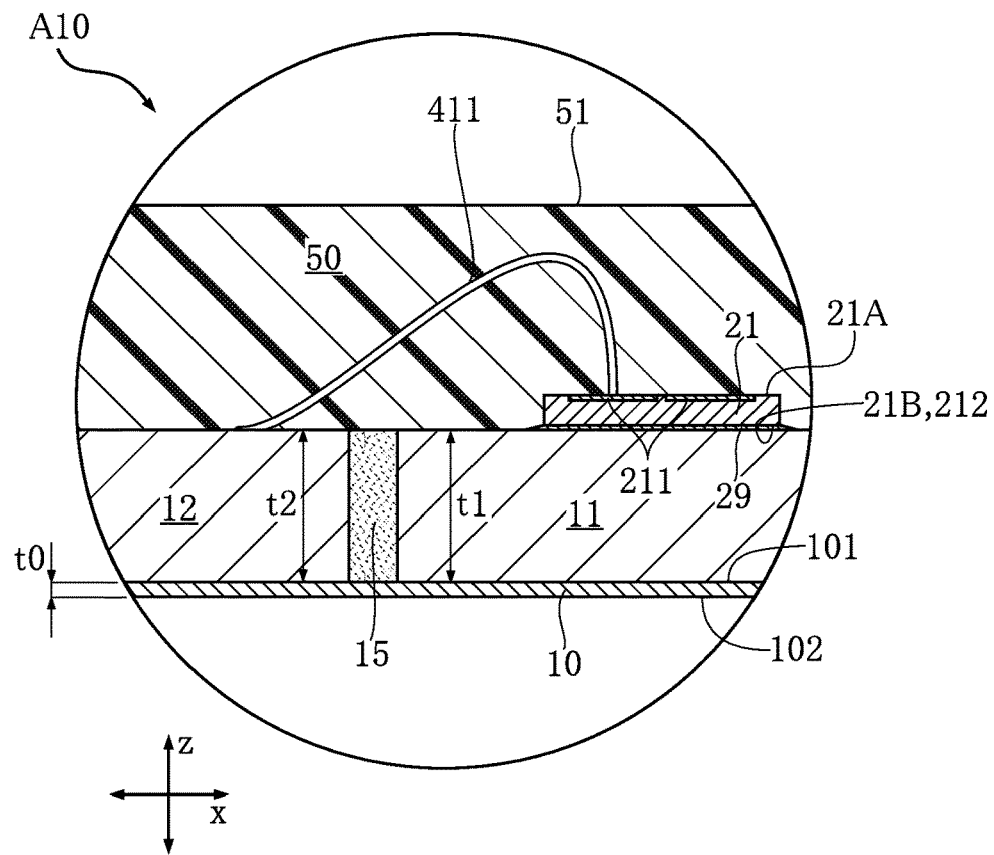
FIG. 9 is an enlarged view of a portion shown in FIG. 8.

As shown in FIGS. 6 to 11, an insulating layer 10 is a plate-shaped electrically insulating member on which the first conductive plate 11 and the second conductive plate 12 are mounted. The insulating layer 10 is made of a material that has relatively high thermal conductivity. Examples of the constituent material of the insulating layer 10 include a ceramic such as $Al_2O_3$ (alumina) or AlN (aluminum nitride), and a heat dissipation sheet whose main component is a synthetic resin. The insulating layer 10 has a thickness t0 (size in the thickness direction z) of 0.25 to 0.5 mm if the constituent material thereof is a ceramic, and of 100 to 200 μm if the constituent material thereof is a heat dissipation sheet. The first conductive plate 11 and the second conductive plate 12 are electrically insulated from the outside of the semiconductor device A10 by the insulating layer 10. The insulating layer 10 has a main surface 101 and a back surface 102 that are spaced apart from each other in the thickness direction z. In FIG. 9 for example, the main surface 101 is oriented upward, and the back surface 102 is oriented downward.

As shown in FIGS. 6 to 10A, the first conductive plate 11 is an electrically conductive member that is made of metal and is plate-shaped, and on which the plurality of first switching elements 21 are mounted. The first conductive plate 11 is bonded to the main surface 101 of the insulating layer 10. The constituent material of the first conductive plate 11 is Cu (copper). The first conductive plate 11 has a thickness t1 that is 1.5 to 10 mm and is larger than the thickness t0 of the insulating layer 10. In other words, the thickness t1 of the first conductive plate 11 is three to one hundred times as large as the thickness t0 of the insulating layer 10. The thickness t1 of the first conductive plate 11 is larger than the thickness (0.25 to 0.8 mm) of a conductive layer that is made of, for example, a metal foil.

As shown in FIGS. 6 to 10A (excluding FIG. 9), a first substrate 13, which has electrical insulating properties, is bonded to the first conductive plate 11. The first substrate 13 is located between the plurality of first switching elements 21 and the first supply terminal 31 in the first direction x, and extends in the second direction y. The first substrate 13 is a ceramic substrate whose constituent material is, for example, $Al_2O_3$ or the like, or a printed-wiring board. The first substrate 13 is bonded, using an adhesive (not-shown), to the side of the first conductive plate 11 that is opposite to the insulating layer 10 in the thickness direction z. A first gate layer 131 and a first detection layer 132 are arranged on the first substrate 13. The first gate layer 131 and the first detection layer 132 are electrically conductive, and extend in the second direction y. The first gate layer 131 and the first detection layer 132 are made of a Cu foil, for example. In the first direction x, the first gate layer 131 is located at a position closer to the first supply terminal 31 than the first detection layer 132 is. In the shown example, the first gate layer 131 is adjacent to the first supply terminal 31 in the first direction x. Similarly, the first detection layer 132 is adjacent to the plurality of first switching elements 21 in the first direction x.

As shown in FIGS. 6, 7, 10B, and 11, the second conductive plate 12 is an electrically conductive member that is made of metal and is plate-shaped, and on which the plurality of second switching elements 22 are mounted. The second conductive plate 12 is bonded to the main surface 101 of the insulating layer 10. The constituent material of the second conductive plate 12 is the same as the constituent material of the first conductive plate 11. Furthermore, the second conductive plate 12 has a thickness t2 that is equal to the thickness t1 of the first conductive plate 11. Accordingly, the thickness t2 of the second conductive plate 12 is larger than the thickness t0 of the insulating layer 10, and is larger than the thickness of a conductive layer made of a metal foil. The second conductive plate 12 is spaced apart from the first conductive plate 11 in the first direction x, and is electrically insulated from the first conductive plate 11.

Figure 10A:
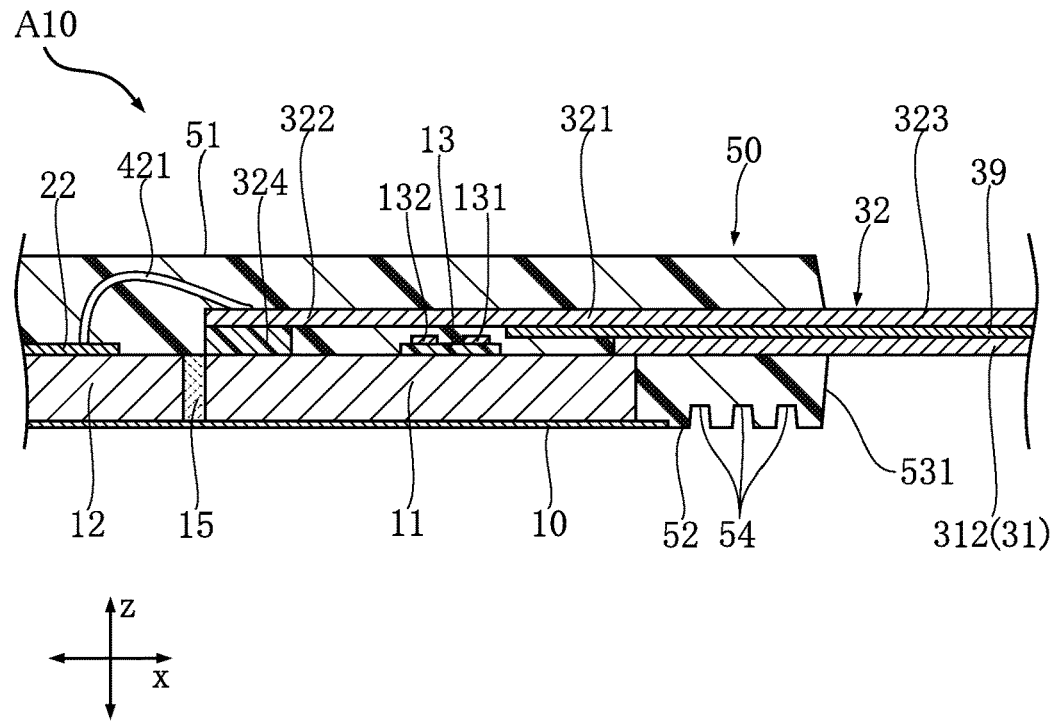
FIG. 10A is a cross-sectional view taken along a line X-X in FIG. 6, illustrating the vicinity of a first conductive plate.
Figure 10B:
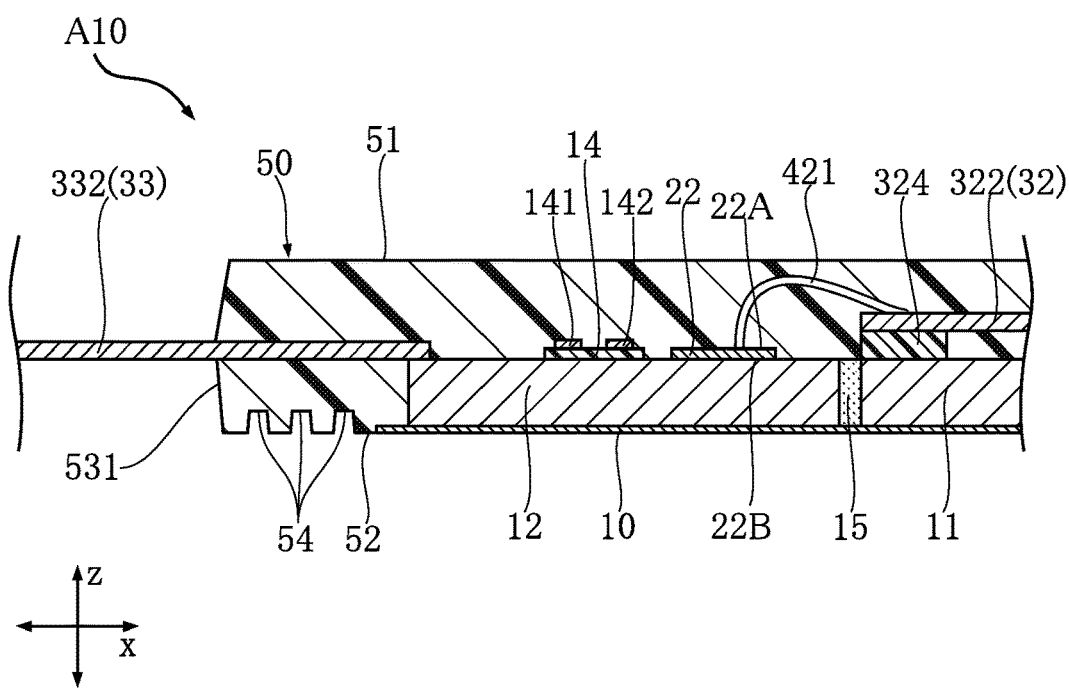
FIG. 10B is a cross-sectional view taken along the line X-X in FIG. 6, illustrating the vicinity of a second conductive plate.

As shown in FIGS. 6, 7, and 10B, a second substrate 14, which has electrical insulating properties, is bonded to the second conductive plate 12. The second substrate 14 is located between the plurality of second switching elements 22 and the output terminal 33 in the first direction x, and extends in the second direction y. The constituent material of the second substrate 14 is the same as the constituent material of the first substrate 13. The second substrate 14 is bonded, using an adhesive (not-shown), to the side of the second conductive plate 12 that is opposite to the insulating layer 10 in the thickness direction z. A second gate layer 141 and a second detection layer 142 are arranged on the second substrate 14. The second gate layer 141 and the second detection layer 142 are electrically conductive, and extend in the second direction y. The second gate layer 141 and the second detection layer 142 are made of a Cu foil, for example. In the shown example, the second gate layer 141 is adjacent to the output terminal 33 in the first direction x. The second detection layer 142 is adjacent to the plurality of second switching elements 22 in the first direction x.

As shown in FIGS. 6 to 11, the insulating material 15 is an electrically insulating member that is interposed between the first conductive plate 11 and the second conductive plate 12 in the first direction x. The insulating material 15 is made of a material that has relatively high thermal conductivity, as with the insulating layer 10. The constituent material of the insulating material 15 is, for example, a ceramic such as $Al_2O_3$, $Si_3N_4$ (silicon nitride), or AlN.

The plurality of first switching elements 21 are semiconductor elements, and are electrically bonded to the first conductive plate 11, as shown in FIGS. 6 to 9 (that is, each first switching element 21 is fixed to the first conductive plate 11 and is electrically connected to the first conductive plate 11). Furthermore, the plurality of first switching elements 21 are electrically connected to the second conductive plate 12. The plurality of first switching elements 21 are bonded to the side of the first conductive plate 11 that is opposite to the insulating layer 10 in the thickness direction z. In the semiconductor device A10, the first switching elements 21 are electrically connected to the second conductive plate 12 via the first conductive wire 411. In the semiconductor device A10, each of the plurality of first switching elements 21 is a power MOSFET (Metal-Oxide-Semiconductor Field-Effect Transistor) whose main component is SiC (silicon carbide). The plurality of first switching elements 21 each may also be an IGBT (Insulated Gate Bipolar Transistor). The plurality of first switching elements 21 are lined up in the second direction y. In the shown example, the number of the plurality of first switching elements 21 is four, but the number is not limited to this. The first switching elements 21 each have a main surface 21A and a back surface 21B.

As shown in FIG. 9, the main surface 21A is oriented in the same direction as that of the main surface 101 of the insulating layer 10. The main surface 21A is provided with a main surface electrode 211 and a gate electrode 213 (see FIG. 12). The back surface 21B is oriented toward the opposite side of the main surface 21A, and faces the first conductive plate 11. The back surface 21B is provided with a back surface electrode 212.

Figure 12:
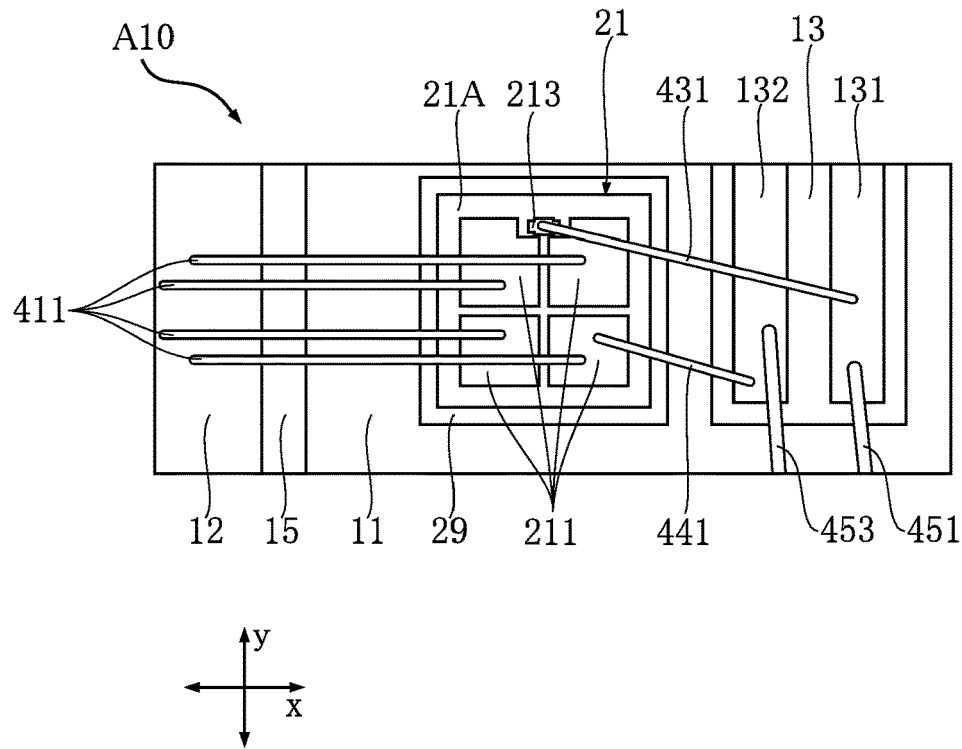
FIG. 12 is a plan view illustrating a first switching element.

Source currents (or emitter currents if the first switching elements 21 are IGBTs) flow through the main surface electrode 211. As shown in FIG. 12, the main surface electrode 211 is divided into four regions provided on the main surface 21A. A configuration is such that a source current flows through each of the regions.

A drain current (or a collector current if the first switching elements 21 are IGBTs) flows through the back surface electrode 212. As shown in FIG. 9, the back surface electrode 212 is electrically connected to the first conductive plate 11 via an element joining layer 29.

A gate voltage for driving the first switching element 21 is applied to the gate electrode 213. As shown in FIG. 12, in the semiconductor device A10, the gate electrode 213 is located between two regions of the main surface electrode 211 that are spaced apart from each other in the first direction x. The gate electrode 213 is smaller in size than all of the regions of the main surface electrode 211.

As shown in FIGS. 6, 7, 10B, and 11, the plurality of second switching elements 22 are semiconductor elements electrically bonded to the second conductive plate 12. The plurality of second switching elements 22 are bonded to the side of the second conductive plate 12 that is opposite to the insulating layer 10 in the thickness direction z. The second switching elements 22 are electrically connected to the second supply terminal 32 via the second conductive wires 421. The second switching elements 22 are the same elements as the first switching elements 21. The plurality of second switching elements 22 are lined up in the second direction y. In the shown example, the number of the plurality of second switching elements 22 is four, but the number is not limited to this. The second switching elements 22 each have a main surface 22A and a back surface 22B.

Figure 11:
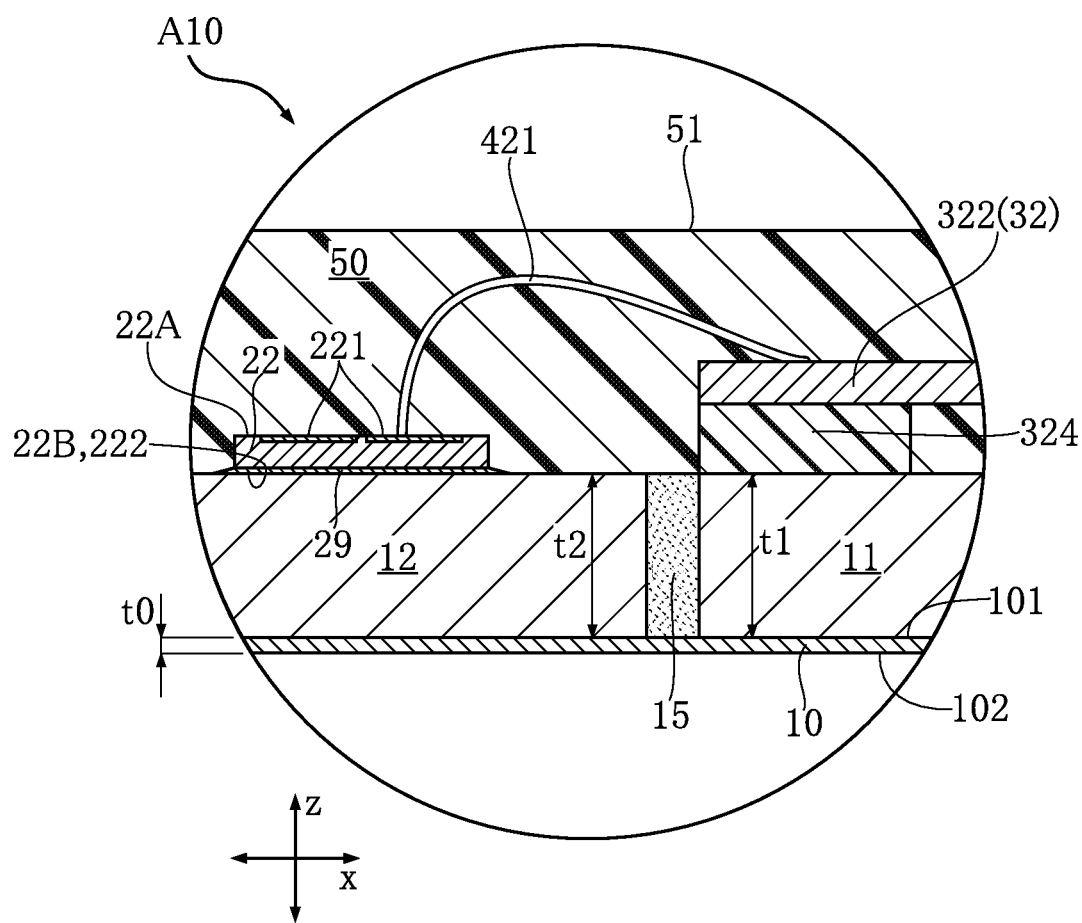
FIG. 11 is an enlarged view of a portion shown in FIG. 10B.

As shown in FIG. 11, the main surface 22A is oriented in the same direction as that of the main surface 101 of the insulating layer 10. The main surface 22A is provided with a main surface electrode 221 and a gate electrode 223 (see FIG. 13). The back surface 22B is oriented toward a side opposite to the main surface 22A, and faces the second conductive plate 12. The back surface 22B is provided with a back surface electrode 222.

Figure 13:
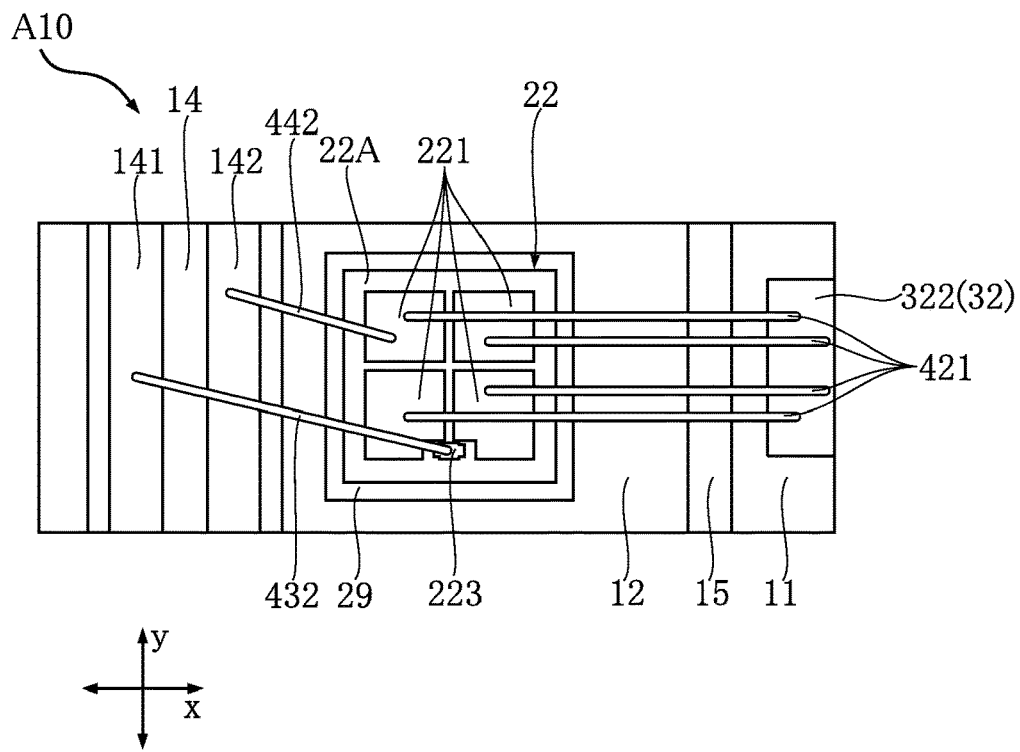
FIG. 13 is a plan view illustrating a second switching element.

Source currents (or emitter currents if the second switching elements 22 are IGBTs) flow through the main surface electrode 221. As shown in FIG. 13, in the semiconductor device A10, the main surface electrode 221 is divided into four regions provided on the main surface 22A. A configuration is such that a source current flows through each of the regions.

A drain current (or a collector current if the second switching elements 22 are IGBTs) flows through the back surface electrode 222. As shown in FIG. 11, the back surface electrode 222 is electrically connected to the second conductive plate 12 via an element joining layer 29.

A gate voltage for driving the second switching element 22 is applied to the gate electrode 223. As shown in FIG. 13, in the semiconductor device A10, the gate electrode 223 is located between two regions of the main surface electrode 221 that are spaced apart from each other in the first direction x. The gate electrode 223 is smaller in size than all of the regions of the main surface electrode 221.

As shown in FIG. 9, the element joining layer 29 is interposed between the back surface 21B of the first switching element 21 and the first conductive plate 11. Furthermore, as shown in FIG. 11, the element joining layer 29 is interposed between the back surface 22B of the second switching element 22 and the second conductive plate 12. The element joining layers 29 are electrically conductive. The element joining layers 29 are lead-free solders whose main component is Sn (tin), for example. The first switching elements 21 are electrically bonded to the first conductive plate 11 through die bonding using the element joining layers 29. Similarly, the second switching elements 22 are bonded to the second conductive plate 12 through die bonding using the element joining layers 29.

As shown in FIGS. 3 to 7 (excluding FIG. 6), the first supply terminal 31 is an electrically conductive member that is made of metal, is plate-shaped, and is electrically bonded to the first conductive plate 11. The first supply terminal 31 serves as a positive electrode (P terminal) of the semiconductor device A10. The constituent material of the first supply terminal 31 is Cu, for example. The surface of the first supply terminal 31 may also be plated with Ni (nickel). The first supply terminal 31 has a thickness set to 0.5 to 1.5 mm. The first supply terminal 31 has comb tooth-shaped portions 311 and an external connection portion 312 (see FIG. 7). The comb tooth-shaped portions 311 are adjacent to the first substrate 13 in the first direction x, and overlap with the first conductive plate 11 as viewed in a plan view. The comb tooth-shaped portions 311 are bonded to the side of the first conductive plate 11 that is opposite to the insulating layer 10 in the thickness direction z. The method of joining the comb tooth-shaped portions 311 to the first conductive plate 11 may be solder joining or ultrasonic joining. The external connection portion 312 is band-shaped and extends, from the comb tooth-shaped portions 311, to a side away from the second conductive plate 12 in the first direction x. The external connection portion 312 is partially exposed to the outside from the semiconductor device A10.

As shown in FIGS. 1 to 6, and 10A, the second supply terminal 32 is an electrically conductive member that is made of metal, is plate-shaped, and has a region that overlaps with the first supply terminal 31 as viewed in a plan view. The second supply terminal 32 is spaced apart from all of the first conductive plate 11, the second conductive plate 12, and the first supply terminal 31 in the thickness direction z (see FIG. 10A). Accordingly, the second supply terminal 32 is electrically insulated from all of the first conductive plate 11, the second conductive plate 12, and the first supply terminal 31. The second supply terminal 32 is electrically connected to the plurality of second switching elements 22 (see FIG. 6). The second supply terminal 32 serves as a negative electrode (N terminal) of the semiconductor device A10. The constituent material and the thickness of the second supply terminal 32 are the same as the constituent material and the thickness of the first supply terminal 31. The surface of the second supply terminal 32 may also be plated with Ni. As shown in FIG. 6, the second supply terminal 32 has a first band-shaped portion 321 (that extends in the second direction y), a plurality of second band-shaped portions 322 that are parallel to each other (each second band-shaped portion extending in the first direction x), and an external connection portion 323 (that extends in the first direction x). The first band-shaped portion 321 and the external connection portion 323 overlap with the first supply terminal 31 as viewed in a plan view. The first band-shaped portion 321 is located between a peripheral edge of the first conductive plate 11 (peripheral edge that intersects with the first supply terminal 31), and the first substrate 13. The plurality of second band-shaped portions 322 extend from the first band-shaped portion 321 toward the second conductive plate 12, and are lined up at a distance from each other in the second direction y. In the shown example, the number of the plurality of second band-shaped portions 322 is four, but the number is not limited to this. The external connection portion 323 is band-shaped and extends, from the first band-shaped portion 321, to a side away from the second conductive plate 12 in the first direction x. The external connection portion 323 is partially exposed to the outside from the semiconductor device A10.

As shown in FIGS. 10A to 11, an insulator 324 is interposed between the leading end of the second band-shaped portion 322 of the second supply terminal 32, and the first conductive plate 11. The insulator 324 is an electrically-insulating adhesive. The constituent material of the insulator 324 is, for example, an epoxy resin or polyimide. The second band-shaped portions 322 are bonded to the first conductive plate 11 via the insulators 324. Due to the insulators 324, the second supply terminal 32 is bonded to the first conductive plate 11, and is electrically insulated from the first conductive plate 11.

As shown in FIGS. 1 to 6, and 10A, the terminal insulating member 39 is plate-shaped, and is interposed between the first supply terminal 31 and the second supply terminal 32 in the thickness direction z. The terminal insulating member 39 has electrical insulating properties. The constituent material of the terminal insulating member 39 is a ceramic such as $Al_2O_3$, for example. The terminal insulating member 39 has a thickness set to 0.1 to 1.0 mm. In the semiconductor device A10, the terminal insulating member 39 is in contact with both the first supply terminal 31 and the second supply terminal 32. More specifically, the terminal insulating member 39 is in contact with the entire upper surface of the first supply terminal 31 (see FIGS. 4 and 7), and is in contact with a part of the lower surface of the second supply terminal 32 (that is, the entire lower surface of the external connection portion 323 and a part of the lower surface of the first band-shaped portion 321) (see FIGS. 4, 6, and 7). The plurality of second band-shaped portions 322 of the second supply terminal 32 are not in contact with the terminal insulating member 39 (see FIG. 10A).

As shown in FIG. 6, (part of) every second band-shaped portion 322 of the second supply terminal 32 is located between two adjacent first switching elements 21. In other words, a corresponding single second band-shaped portion 322 extends between two adjacent first switching elements 21 toward the second conductive plate 12. Furthermore, each of the second switching elements 22 faces the corresponding single second band-shaped portion 322 in the first direction x. Accordingly, the plurality of first switching elements 21 and the plurality of second switching elements 22 are staggered. In the shown example, the plurality of first switching elements 21 are shifted, in the second direction y, with respect to the plurality of second switching elements 22. Furthermore, the first switching elements 21 are laid out without overlapping with any second switching element 22 as viewed in the first direction x.

As shown in FIGS. 1 to 7, the output terminal 33 is an electrically conductive member that is made of metal, is plate-shaped, and is electrically bonded to the second conductive plate 12. Electric power input to the semiconductor device A10 from the first supply terminal 31 and the second supply terminal 32 is converted by the plurality of first switching elements 21 and the plurality of second switching elements 22, and the converted power is output to the output terminal 33. The constituent material and the thickness of the output terminal 33 are the same as the constituent material and the thickness of the first supply terminal 31. The surface of the output terminal 33 may also be plated with Ni. The output terminal 33 has comb tooth-shaped portions 331 and an external connection portion 332. The comb tooth-shaped portions 331 are adjacent to the second substrate 14 in the first direction x, and overlap with the second conductive plate 12 as viewed in a plan view. The comb tooth-shaped portions 331 are bonded to the side of the second conductive plate 12 that is opposite to the insulating layer 10 in the thickness direction z. The method of joining the comb tooth-shaped portions 331 to the second conductive plate 12 may be solder joining or ultrasonic joining. The external connection portion 332 is band-shaped and extends, from the comb tooth-shaped portions 331, to a side away from the first conductive plate 11 in the first direction x. Therefore, the external connection portion 332 extends toward the side opposite to the side to which the external connection portion 312 of the first supply terminal 31 and the external connection portion 323 of the second supply terminal 32 extend. The external connection portion 332 is partially exposed to the outside from the semiconductor device A10.

Figure 2:
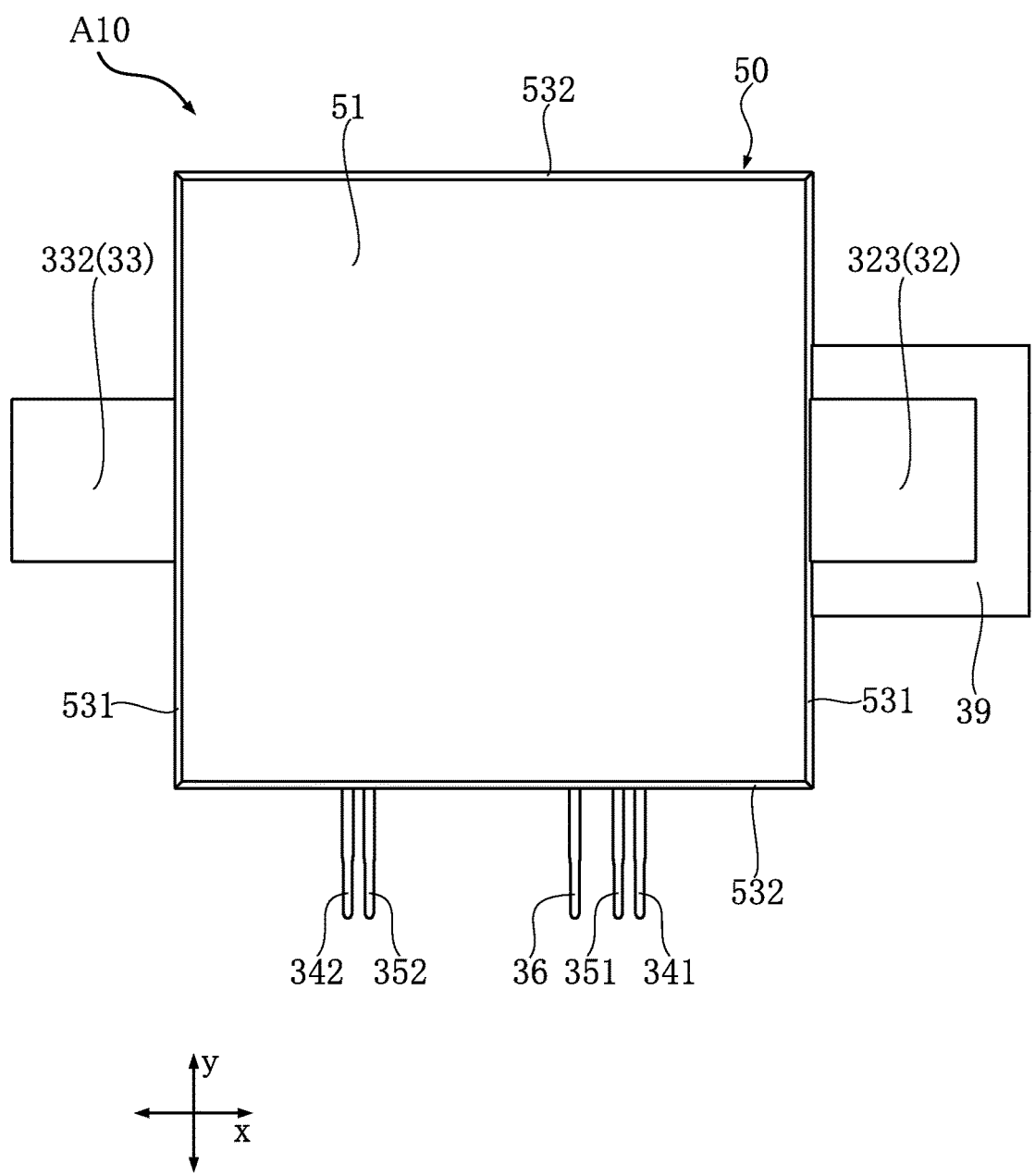
FIG. 2 is a plan view of the semiconductor device.
Figure 3:
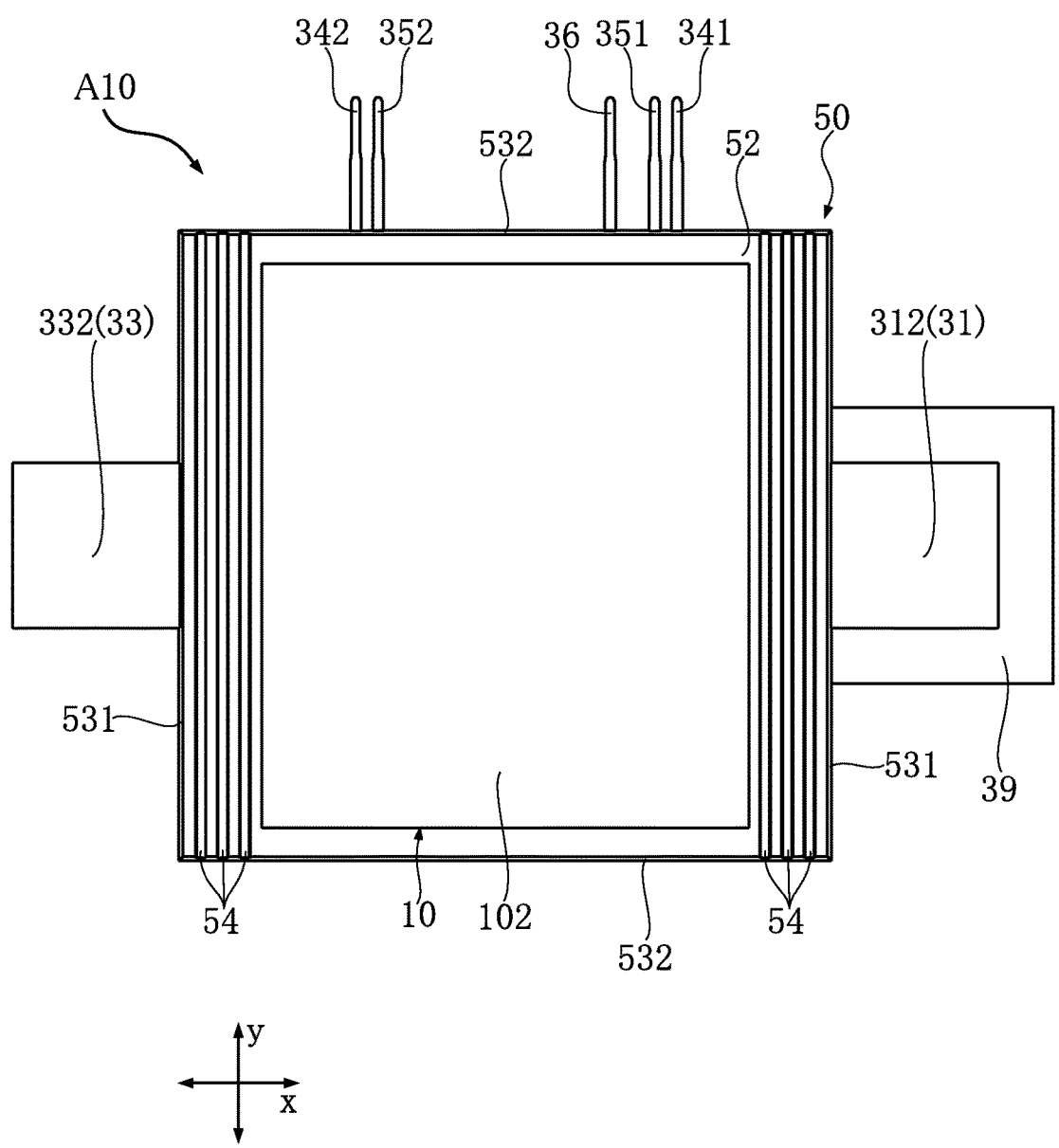
FIG. 3 is a bottom view of the semiconductor device.

As shown in e.g. FIG. 6, the semiconductor device A10 is provided with a first gate terminal 341. The first gate terminal 341 is electrically conductive, and is arranged opposing, in the second direction y, the first gate layer 131 while extending to a side away from the first gate layer 131. The first gate terminal 341 is spaced apart from the first conductive plate 11. Furthermore, as shown in FIGS. 2 and 3, the first gate terminal 341 is partially exposed to the outside of the semiconductor device A10. The constituent material of the first gate terminal 341 is, for example, Cu. The surface of the first gate terminal 341 is plated with Sn.

As shown in e.g. FIG. 6, the semiconductor device A10 is provided with a first terminal wire 451. The first terminal wire 451 is electrically conductive, and connects the first gate terminal 341 and the first gate layer 131. The constituent material of the first terminal wire 451 is, for example, Al (aluminum). The first gate terminal 341 is electrically connected to the first gate layer 131 via the first terminal wire 451.

As shown in FIG. 12 for example, the semiconductor device A10 is provided with first gate wires 431. The first gate wires 431 are electrically conductive, and connect the gate electrodes 213 of the first switching elements 21 and the first gate layer 131 to each other. The constituent material of the first gate wire 431 is Al, for example. The gate electrodes 213 are electrically connected to the first gate layer 131 via the first gate wires 431. Accordingly, the first gate terminal 341 is electrically connected to the gate electrodes 213. The semiconductor device A10 has a configuration in which the plurality of first switching elements 21 are driven upon application of a gate voltage to the first gate terminal 341.

As shown in FIG. 7, the semiconductor device A10 is provided with a second gate terminal 342. The second gate terminal 342 is electrically conductive, and is arranged opposing, in the second direction y, the second gate layer 141 while extending to a side away from the second gate layer 141. As shown in FIGS. 2 and 3, the second gate terminal 342 is partially exposed to the outside of the semiconductor device A10. The constituent material of the second gate terminal 342 is the same as the constituent material of the first gate terminal 341. The surface of the second gate terminal 342 is plated with Sn.

As shown in FIG. 7, the semiconductor device A10 is provided with a second terminal wire 452. The second terminal wire 452 is electrically conductive, and connects the second gate terminal 342 and the second gate layer 141. The constituent material of the second terminal wire 452 is the same as the constituent material of the first terminal wire 451. The second gate terminal 342 is electrically connected to the second gate layer 141 via the second terminal wire 452.

As shown in FIGS. 7 and 13, the semiconductor device A10 is provided with second gate wires 432. The second gate wires 432 are electrically conductive, and connect the gate electrodes 223 of the second switching elements 22 and the second gate layer 141. The constituent material of the second gate wires 432 is the same as the constituent material of the first gate wires 431. The gate electrodes 223 are electrically connected to the second gate layer 141 via the second gate wires 432. Accordingly, the second gate terminal 342 is electrically connected to the gate electrodes 223. In the semiconductor device A10, the plurality of second switching elements 22 are driven upon application of a gate voltage to the second gate terminal 342.

As shown in FIG. 7, the semiconductor device A10 is provided with a first detection terminal 351. The first detection terminal 351 is electrically conductive, and is arranged opposing, in the second direction y, the first detection layer 132 while extending to a side away from the first detection layer 132. As shown in FIGS. 2 and 3, the first detection terminal 351 is partially exposed to the outside of the semiconductor device A10. The first detection terminal 351 is spaced apart from the first gate terminal 341 in the first direction x. The constituent material of the first detection terminal 351 is the same as the constituent material of the first gate terminal 341. The surface of the first detection terminal 351 is plated with Sn.

As shown in FIG. 7, the semiconductor device A10 is provided with a third terminal wire 453. The third terminal wire 453 is electrically conductive, and connects the first detection terminal 351 and the first detection layer 132. The constituent material of the third terminal wire 453 is the same as the constituent material of the first terminal wire 451. The first detection terminal 351 is electrically connected to the first detection layer 132 via the third terminal wire 453.

As shown in FIGS. 7 and 12, the semiconductor device A10 is provided with first detection wires 441. The first detection wires 441 are electrically conductive, and connect the main surface electrodes 211 of the first switching elements 21 and the first detection layer 132. The constituent material of the first detection wires 441 is, for example, Al. Each first detection wire 441 is connected to one of the regions of the corresponding main surface electrode 211. The main surface electrodes 211 are electrically connected to the first detection layer 132 via the first detection wires 441. Accordingly, the first detection terminal 351 is electrically connected to the main surface electrodes 211. In the semiconductor device A10, a source current (or emitter current) that is input to the plurality of first switching elements 21 is detected by the first detection terminal 351.

As shown in FIG. 7, the semiconductor device A10 is provided with a second detection terminal 352. The second detection terminal 352 is electrically conductive, and is arranged opposing, in the second direction y, the second detection layer 142 while extending to a side away from the second detection layer 142. As shown in FIGS. 2 and 3, the second detection terminal 352 is partially exposed to the outside of the semiconductor device A10. The second detection terminal 352 is spaced apart from the second gate terminal 342 in the first direction x. The constituent material of the second detection terminal 352 is the same as the constituent material of the first gate terminal 341. The surface of the second detection terminal 352 is plated with Sn.

As shown in FIG. 7, the semiconductor device A10 is provided with a fourth terminal wire 454. The fourth terminal wire 454 is electrically conductive, and connects the second detection terminal 352 and the second detection layer 142. The constituent material of the fourth terminal wire 454 is the same as the constituent material of the first terminal wire 451. The second detection terminal 352 is electrically connected to the second detection layer 142 via the fourth terminal wire 454.

As shown in FIGS. 7 and 13, the semiconductor device A10 is provided with second detection wires 442. The second detection wires 442 are electrically conductive, and connect the main surface electrodes 221 of the second switching elements 22 and the second detection layer 142. The constituent material of the second detection wires 442 is the same as the constituent material of the first detection wires 441. Each second detection wire 442 is connected to one of the regions of the corresponding main surface electrode 221. The main surface electrodes 221 are electrically connected to the second detection layer 142 via the second detection wires 442. Accordingly, the second detection terminal 352 is electrically connected to the main surface electrodes 221. In the semiconductor device A10, a source current (or a drain current) that is input to the plurality of second switching elements 22 is detected by the second detection terminal 352.

As shown in FIG. 7, the semiconductor device A10 is provided with a device current detection terminal 36. The device current detection terminal 36 is electrically conductive, and is arranged between the first detection terminal 351 and the second detection terminal 352 in the first direction x, and is arranged opposing the first conductive plate 11 in the second direction y. The device current detection terminal 36 extends to a side away from the first conductive plate 11 in the second direction y. As shown in FIGS. 2 and 3, the device current detection terminal 36 is partially exposed to the outside of the semiconductor device A10. The constituent material of the device current detection terminal 36 is the same as the constituent material of the first gate terminal 341. The surface of the device current detection terminal 36 is plated with Sn.

As shown in FIG. 7, the semiconductor device A10 is provided with a fifth terminal wire 455. The fifth terminal wire 455 is electrically conductive, and connects the device current detection terminal 36 and the first conductive plate 11. The constituent material of the fifth terminal wire 455 is the same as the constituent material of the first terminal wire 451. The device current detection terminal 36 is electrically connected to the first conductive plate 11 via the fifth terminal wire 455. In the semiconductor device A10, a current that flows through the first conductive plate 11 is detected by the device current detection terminal 36.

As shown in FIGS. 6 to 9, the first conductive wires 411 are electrically conductive members that connect the main surface electrodes 211 of the first switching elements 21 and the second conductive plate 12. The first conductive wires 411 are thin metal wires that extend in the first direction x. The first conductive wires 411 are connected to the respective regions of the main surface electrodes 211. In the semiconductor device A10, the plurality of first switching elements 21 are electrically connected to the second conductive plate 12 via the first conductive wires 411. The constituent material of the first conductive wires 411 is, for example, Al.

As shown in FIGS. 6 to 11 (excluding FIGS. 8 and 9), the second conductive wires 421 are electrically conductive members that connect the second band-shaped portions 322 of the second supply terminal 32 and the main surface electrodes 221 of the second switching elements 22. The second conductive wires 421 are thin metal wires that extend in the first direction x. The second conductive wires 421 are connected to the respective regions of the main surface electrodes 221. In the semiconductor device A10, the second band-shaped portions 322 are electrically connected to the main surface electrodes 221 via the second conductive wires 421. The constituent material of the second conductive wires 421 is the same as the constituent material of the first conductive wires 411.

As shown in FIGS. 1 to 11 (excluding FIGS. 6 and 7), the sealing resin 50 covers the first conductive plate 11, the second conductive plate 12, the plurality of first switching elements 21, and the plurality of second switching elements 22. The sealing resin 50 has electrical insulating properties. The constituent material of the sealing resin 50 is, for example, a black epoxy resin. The sealing resin 50 has a front surface 51, a back surface 52, a pair of first side surfaces 531, and a pair of second side surfaces 532.

As shown in FIGS. 1 to 11 (excluding FIGS. 3, 6, and 7), the front surface 51 is oriented in the same direction as that of the main surface 101 of the insulating layer 10. As shown in FIGS. 3 to 11 (excluding FIGS. 6 and 7), the back surface 52 is oriented in the same direction as that of the back surface 102 of the insulating layer 10. The back surface 102 is exposed from the back surface 52.

As shown in FIGS. 1 to 5, each of the pair of first side surfaces 531 is connected to both the front surface 51 and the back surface 52, and are spaced apart from each other in the first direction x. The external connection portion 312 of the first supply terminal 31, the external connection portion 323 of the second supply terminal 32, and the terminal insulating member 39 are partially exposed from one of the first side surfaces 531. Furthermore, the external connection portion 332 of the output terminal 33 is partially exposed from the other one of the first side surfaces 531. As shown in FIGS. 1 to 5, each of the pair of second side surfaces 532 is connected to both the front surface 51 and the back surface 52, and are spaced apart from each other in the second direction y. Both ends, in the first direction x, of each second side surface 532 are connected to the pair of first side surfaces 531. The first gate terminal 341, the second gate terminal 342, the first detection terminal 351, the second detection terminal 352, and the device current detection terminal 36 are partially exposed from one of the second side surfaces 532.

As shown in FIGS. 1, 3, 4, 10A, and 10B, the sealing resin 50 is provided with a plurality of grooves 54 that are recessed from the back surface 52 in the thickness direction z, and extend in the second direction y. The plurality of grooves 54 are located at both ends, in the first direction x, of the back surface 52. For example, in the example shown in FIG. 3, the plurality of grooves 54 are classified into a first group of grooves (for example, a right-side group of grooves) and a second group of grooves (a left-side group of grooves), and the two groups are spaced apart from each other in the first direction x. In the shown example, the right-side group of grooves is arranged in the vicinity of the right end of the back surface 52, and the left-side group of grooves is arranged in the vicinity of the left end of the back surface 52. Also, both groups of grooves 54 extend continuously from one of the second side surfaces 532 to the other one of the second side surfaces 532.

Figure 14:
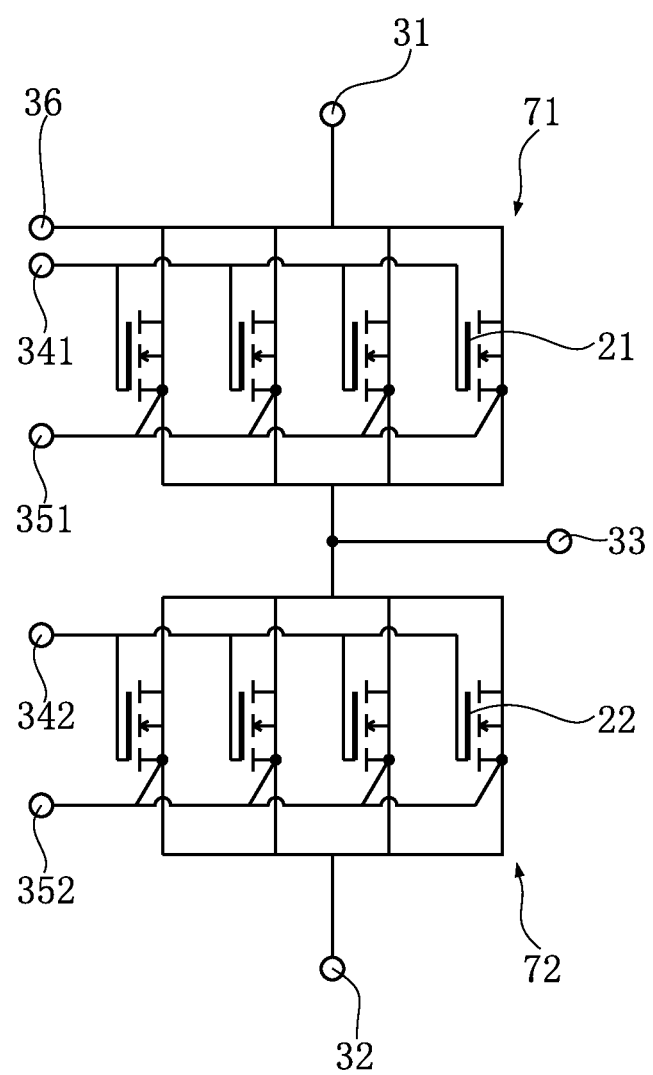
FIG. 14 is a circuit diagram of the semiconductor device.

The following will describe a circuit configuration of the semiconductor device A10 with reference to FIG. 14. As shown in the figure, in the semiconductor device A10, two switching circuits, namely, an upper arm circuit 71 and a lower arm circuit 72, are configured. These circuits constitute a DC-AC converter (inverter), which is a constituent component of a DC-DC converter. The upper arm circuit 71 is constituted by the first conductive plate 11 and the plurality of first switching elements 21. In the upper arm circuit 71, the plurality of first switching elements 21 are connected in parallel to each other between the first supply terminal 31 and the output terminal 33. All of the gate electrodes 213 provided on the first switching elements 21 are connected in parallel to the first gate terminal 341. Using a drive circuit such as a gate driver arranged outside the semiconductor device A10, the plurality of first switching elements 21 are driven at the same time upon application of a gate voltage to the first gate terminal 341.

Furthermore, all of the main surface electrodes 211 mounted on the first switching elements 21 are connected in parallel to the first detection terminal 351. A source current (or emitter current) flowing through the plurality of first switching elements 21 is input to a control circuit arranged outside the semiconductor device A10 via the first detection terminal 351.

The back surface electrodes 212 of the first switching elements 21 are connected in parallel to the device current detection terminal 36. A drain current (or a collector current) that flows through the plurality of first switching elements 21, that is, a current that flows through the first conductive plate 11, is input to the control circuit arranged outside the semiconductor device A10 via the device current detection terminal 36.

The lower arm circuit 72 is constituted by the second conductive plate 12 and the plurality of second switching elements 22. In the lower arm circuit 72, the plurality of second switching elements 22 are connected in parallel to each other between the output terminal 33 and the second supply terminal 32. All of the gate electrodes 223 provided on the second switching elements 22 are connected in parallel to the second gate terminal 342. Using the drive circuit such as a gate driver arranged outside the semiconductor device A10, the plurality of second switching elements 22 are driven at the same time upon application of a gate voltage to the second gate terminal 342.

Furthermore, all of the main surface electrodes 221 provided on the second switching elements 22 are connected in parallel to the second detection terminal 352. A source current (or emitter current) that flows through the plurality of second switching elements 22 is input to the control circuit arranged outside the semiconductor device A10 via the second detection terminal 352.

As a result of a DC power source being connected to the first supply terminal 31 and the second supply terminal 32 and the plurality of first switching elements 21 and the plurality of second switching elements 22 being driven, an AC voltage is output from output terminal 33. In, for example, a boost DC-DC converter, the AC voltage is applied across a voltage inverter, a rectifier, and a smoothing circuit in the stated order, and thus is converted into high-voltage DC power that is higher in voltage than the voltage of the DC power source.

Figure 15:
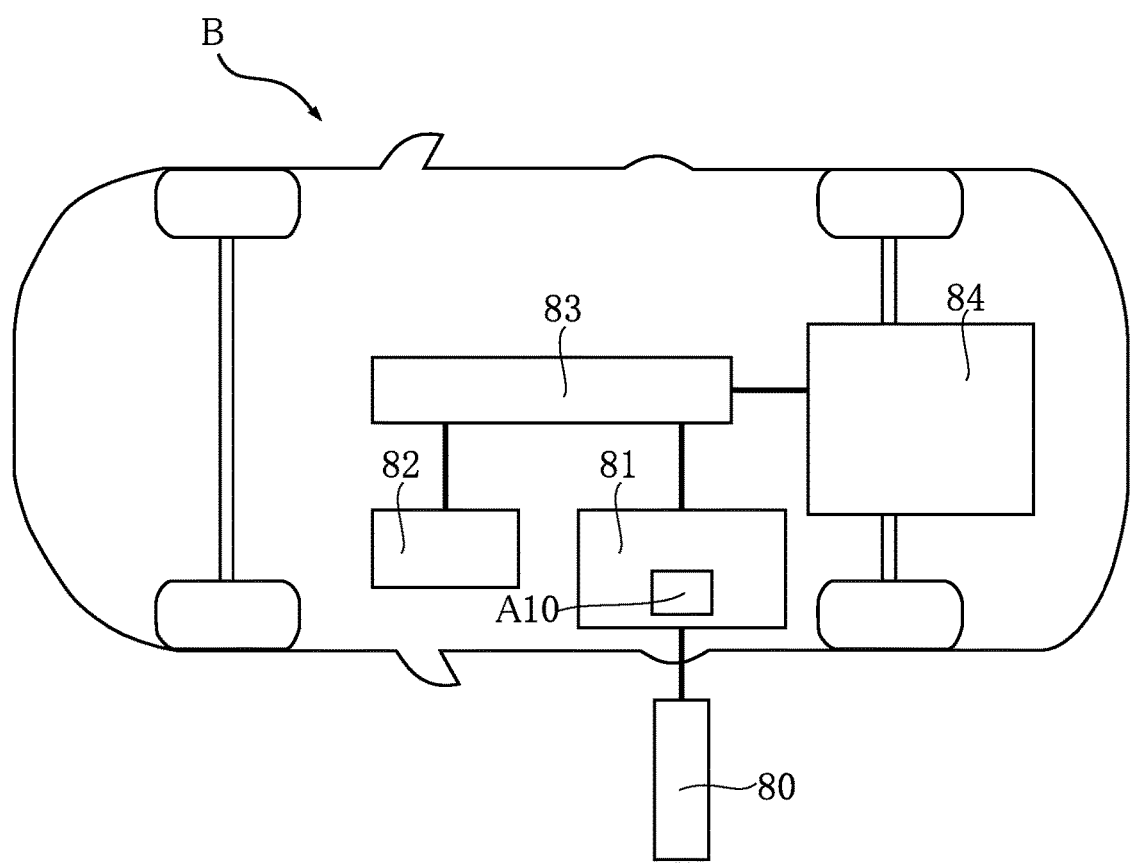
FIG. 15 is a schematic view illustrating an example of usage of the semiconductor device.

The following will describe an example of usage of the semiconductor device A10 with reference to FIG. 15. This figure is a schematic view illustrating an electric automobile B that uses the semiconductor device A10. The electric automobile B is provided with a DC-DC converter 81, an on-board battery charger 82, a storage battery 83, and a driving system 84. The semiconductor device A10 constitutes part of the DC-DC converter 81 (DC-AC converter). If the electric automobile B is placed outdoors and is supplied with DC power from a rapid power feeding facility 80, which is a DC power source, the DC power is converted into high-voltage DC power by the DC-DC converter 81. The DC-DC converter 81 supplies the high-voltage DC power to the storage battery 83. At the same time, power is supplied from the on-board battery charger 82 to the storage battery 83. The on-board battery charger 82 accumulates power supplied from a normal power feeding facility arranged outdoors. The on-board battery charger 82 converts the power into high-voltage DC power and supplies the converted power to the storage battery 83. The storage battery 83 can be charged in a short period of time since the storage battery 83 is supplied with high-voltage DC power from the two systems, namely, the DC-DC converter 81 and the on-board battery charger 82 at the same time. The power accumulated in the storage battery 83 is supplied to the driving system 84 constituted by an inverter, an AC motor, and a transmission. The electric automobile B is driven by the driving system 84.

The following will describe the functions and effects of the semiconductor device A10. According to the configuration of the semiconductor device A10, the first conductive plate 11 and the second conductive plate 12 function as heat dissipation members and electrically conductive members in the semiconductor device A10. Furthermore, the thickness t1 of the first conductive plate 11 and the thickness t2 of the second conductive plate 12 are larger than the thickness t0 of the insulating layer 10 on which these plates are mounted. Accordingly, in the first direction x and the second direction y, which are perpendicular to the thickness direction z, the cross-sectional areas of the first conductive plate 11 and the second conductive plate 12 are larger than the cross-sectional area of a conductive layer made of, for example, a metal foil. Accordingly, in the first direction x and the second direction y, the thermal resistances per unit length of the first conductive plate 11 and the second conductive plate 12 are lower than the thermal resistance per unit length of a conductive layer made of a metal foil. In other words, in the first direction x and the second direction y, heat is more likely to be transferred over a wide range through the first conductive plate 11 and the second conductive plate 12 than a conductive layer made of a metal foil. Therefore, with the semiconductor device A10, it is possible to improve the heat dissipation.

With the improvement in the heat dissipation of the semiconductor device A10, it is possible to reduce the electric resistance of the first conductive plate 11 and the second conductive plate 12. Therefore, with the semiconductor device A10, it is possible to suppress power loss.

It is preferable that the thickness t1 of the first conductive plate 11 and the thickness t2 of the second conductive plate 12 be 1.5 to 10 mm, in order to reduce the thermal resistance per unit length in the first direction x and the second direction y. Alternatively, it is preferable that the thickness t1 of the first conductive plate 11 and the thickness t2 of the second conductive plate 12 be three to one thousand times as large as the thickness t0 of the insulating layer 10, in order to reduce the thermal resistance per unit length in the first direction x and the second direction y.

The semiconductor device A10 is provided with the insulating material 15 that has electrical insulating properties, and is interposed between the first conductive plate 11 and the second conductive plate 12 in the first direction x. Accordingly, heat is transferred to the insulating material 15, a large heat transfer path is secured, and thus it is possible to reduce a deviation between the thermal distribution of the first conductive plate 11 and the thermal distribution of the second conductive plate 12. In view of the circuit configuration of the semiconductor device A10, the first conductive plate 11, which constitutes the upper arm circuit 71, has a higher temperature than that of the second conductive plate 12, which constitutes the lower arm circuit 72. Accordingly, by providing the insulating material 15, it is possible to transfer the heat of the first conductive plate 11 to the second conductive plate 12.

The first band-shaped portion 321 and the plurality of second band-shaped portions 322 of the second supply terminal 32 overlap with the first conductive plate 11, as viewed in a plan view. Furthermore, the second band-shaped portions 322 are electrically connected to the main surface electrodes 221 of the second switching elements 22 via the second conductive wires 421, which extend in the first direction x. Accordingly, it is possible to suppress an increase in size of the semiconductor device A10 as viewed in a plan view.

The plurality of second switching elements 22 are lined up in the second direction y, and each of the second switching elements 22 faces the corresponding single second band-shaped portion 322 in the first direction x. Accordingly, it is possible to shorten the electrical connect ion paths from the plurality of second switching elements 22 to the second supply terminal 32, while suppressing an increase in size, in the second direction y, of the semiconductor device A10. In this case, the plurality of first switching elements 21 are lined up in the second direction y, and part of each of the second band-shaped portions 322 is located between two adjacent first switching elements 21. Accordingly, it is possible to further suppress an increase in size, in the second direction y, of the semiconductor device A10.

The semiconductor device A10 is provided with the second conductive wires 421, which are connected to the second band-shaped portions 322 of the second supply terminal 32 and the main surface electrodes 221 of the second switching elements 22 and extend in the first direction x. Accordingly, the conductive paths from the plurality of second switching elements 22 to the second supply terminal 32 extend in the first direction x. Also, the semiconductor device A10 is provided with the first conductive wires 411, which are connected to the first switching elements 21 and the second conductive plate 12 and extend in the first direction x. Accordingly, the conductive paths from the plurality of first switching elements 21 to the second conductive plate 12 extend in the first direction x. Accordingly, the conductive paths extending in the first direction x are configured in the semiconductor device A10, and thus it is possible to improve the dielectric strength voltage of the semiconductor device A10.

The second band-shaped portions 322 of the second supply terminal 32 are bonded to the first conductive plate 11 via the insulators 324, which have electrical insulating properties. With this, the second supply terminal 32 can be supported on the first conductive plate 11. Furthermore, when the second conductive wires 421 are bonded to the second band-shaped portions 322 using wire bonding, the second band-shaped portions 322 are subjected to a reactive force exerted from the first conductive plate 11, thus making it possible to sufficiently ensure the joining strength between the second conductive wires 421 and the second band-shaped portions 322.

The first substrate 13, which has electrical insulating properties, is bonded to the first conductive plate 11. The first substrate 13 is provided with the first gate layer 131, which is electrically connected to both the gate electrodes 213 of the first switching elements 21 and the first gate terminal 341. Furthermore, the first gate terminal 341, which is electrically connected to the first gate layer 131, is spaced apart from the first conductive plate 11. Accordingly, in the semiconductor device A10, a conductive path for driving the plurality of first switching elements 21 can be configured with the first gate layer 131 electrically insulated from the first conductive plate 11.

The second substrate 14, which has electrical insulating properties, is bonded to the second conductive plate 12. The second substrate 14 is provided with the second gate layer 141, which is electrically connected to both the gate electrodes 223 of the second switching elements 22 and the second gate terminal 342. Furthermore, the second gate terminal 342, which is electrically connected to the second gate layer 141, is spaced apart from the second conductive plate 12. Accordingly, in the semiconductor device A10, a conductive path for driving the plurality of second switching elements 22 can be configured with the second gate layer 141 electrically insulated from the second conductive plate 12.

The semiconductor device A10 includes the sealing resin 50, which covers the first conductive plate 11, the second conductive plate 12, and the like. The first supply terminal 31 and the second supply terminal 32 have portions that extend to a side away from the second conductive plate 12 in the first direction x, and are exposed from the sealing resin 50. Furthermore, the semiconductor device A10 is provided with the output terminal 33, which is electrically bonded to the second conductive plate 12. The output terminal 33 has a portion that extends to a side away from the first conductive plate 11 in the first direction x, and is exposed from the sealing resin 50. Accordingly, the first supply terminal 31 and the second supply terminal 32 are spaced apart from the output terminal 33 in the first direction x, which is the same direction as that of the conductive path of the semiconductor device A10. This can further improve the dielectric strength voltage of the semiconductor device A10.

A semiconductor device A20 according to a second embodiment of the first aspect will be described with reference to FIGS. 16 to 20. In these figures, the same reference numerals are given to the same or similar components as those in the above-described semiconductor device A10, and redundant descriptions thereof are omitted as appropriate. Furthermore, in FIG. 16 out of these figures, the sealing resin 50 is transparent, for convenience of understanding.

The semiconductor device A20 differs from the above-described semiconductor device A10 in that first electrical connection leads 412 are provided in place of the first conductive wires 411, and second electrical connection leads 422 are provided in place of the second conductive wires 421.

Figure 16:
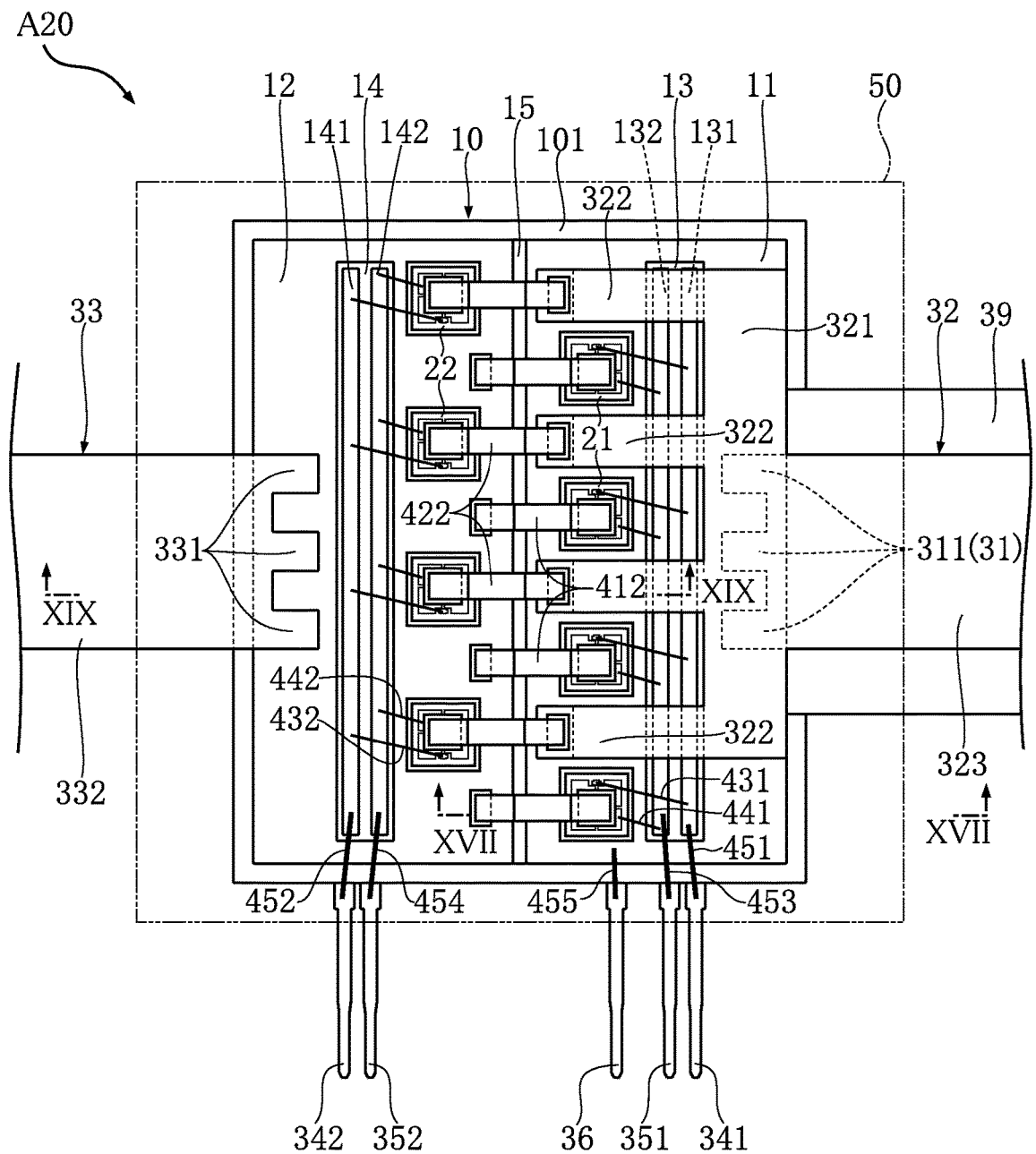
FIG. 16 is a plan view illustrating a semiconductor device according to a second embodiment of the first aspect, with a sealing resin being transparent.
Figure 17:
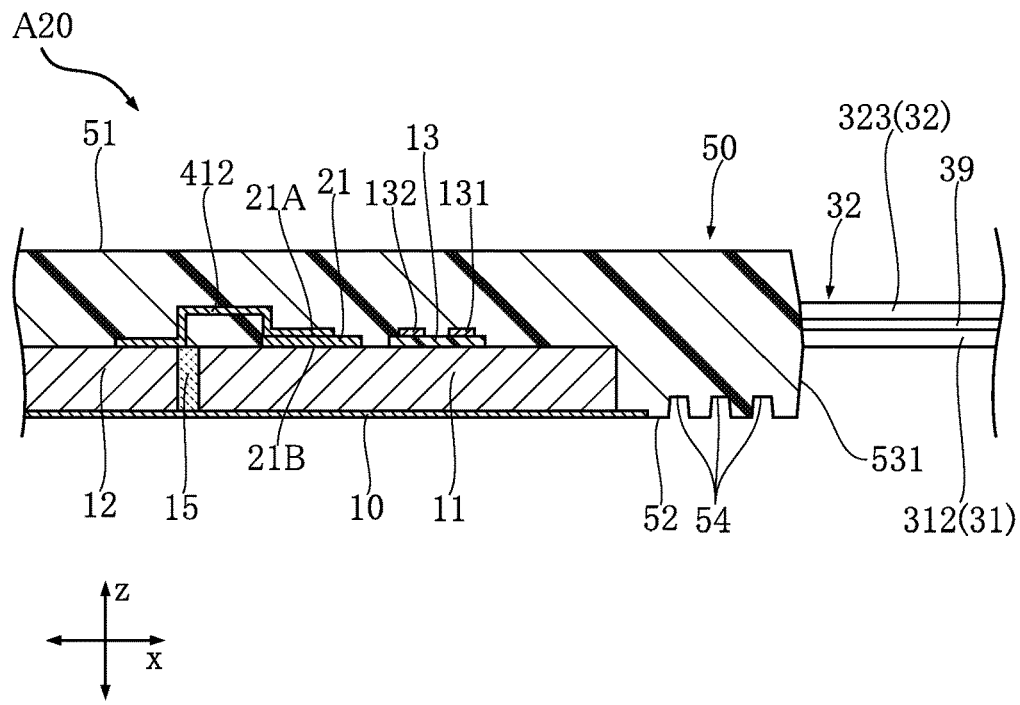
FIG. 17 is a cross-sectional view taken along a line XVII-XVII in FIG. 16.
Figure 18:
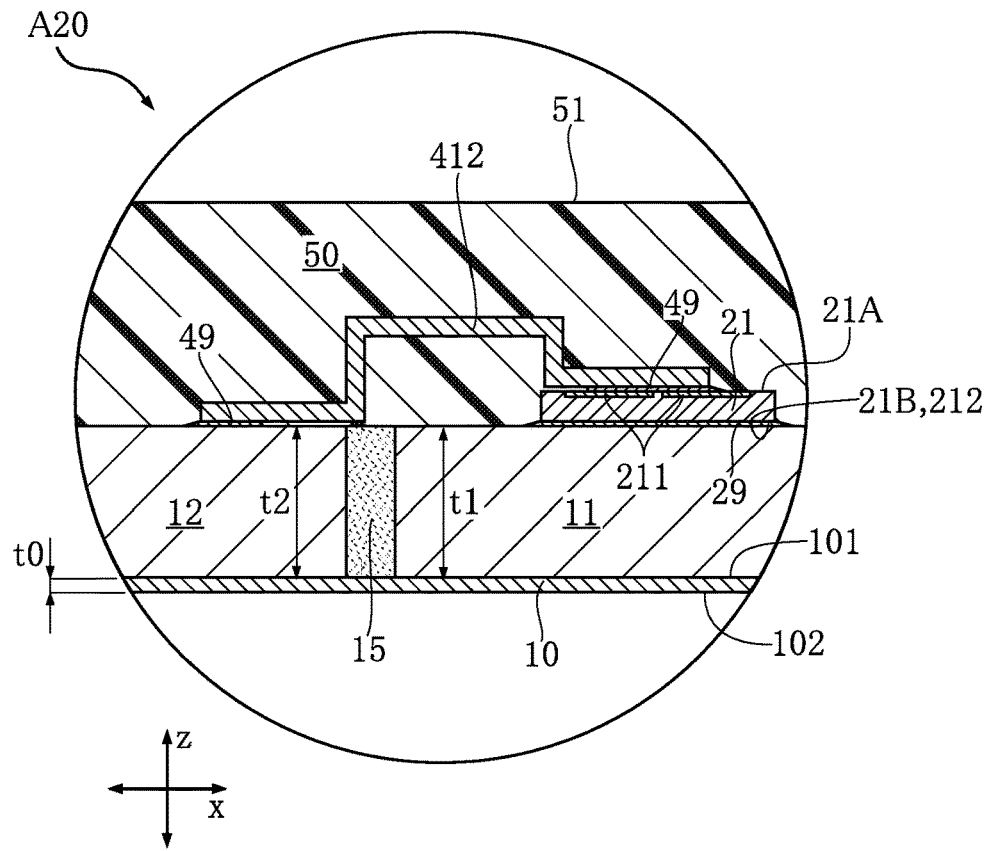
FIG. 18 is an enlarged view of a portion shown in FIG. 17.

As shown in FIGS. 16 to 18, the first electrical connection leads 412 are electrically conductive members that connect the main surface electrodes 211 of the first switching elements 21 and the second conductive plate 12. The first electrical connection leads 412 are metal plates that are band-shaped and extend in the first direction x, and are bent into a hook shape in the thickness direction z. The constituent material of the first electrical connection leads 412 is Cu or a Cu alloy. One end of each first electrical connection lead 412 is electrically bonded to a main surface electrode 211 via a conductive joint layer 49. The other end of the first electrical connection lead 412 is electrically bonded to the second conductive plate 12 via a conductive joint layer 49. The conductive joint layers 49 are electrically conductive. The conductive joint layers 49 are lead-free solder whose main component is Sn, for example.

Figure 19:
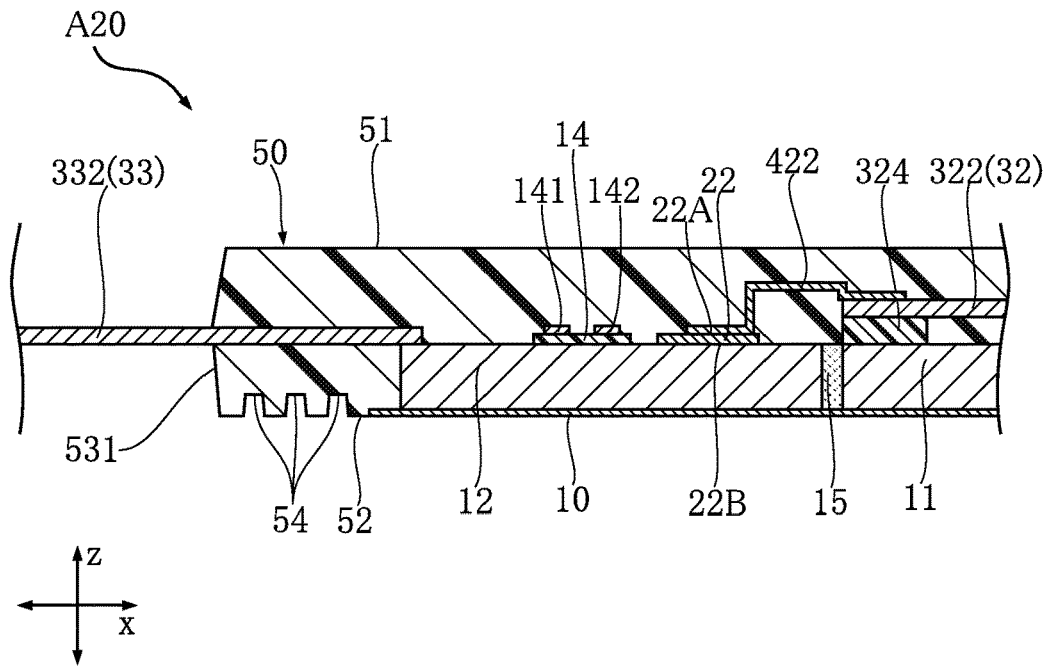
FIG. 19 is a cross-sectional view taken along a line XIX-XIX in FIG. 16.
Figure 20:
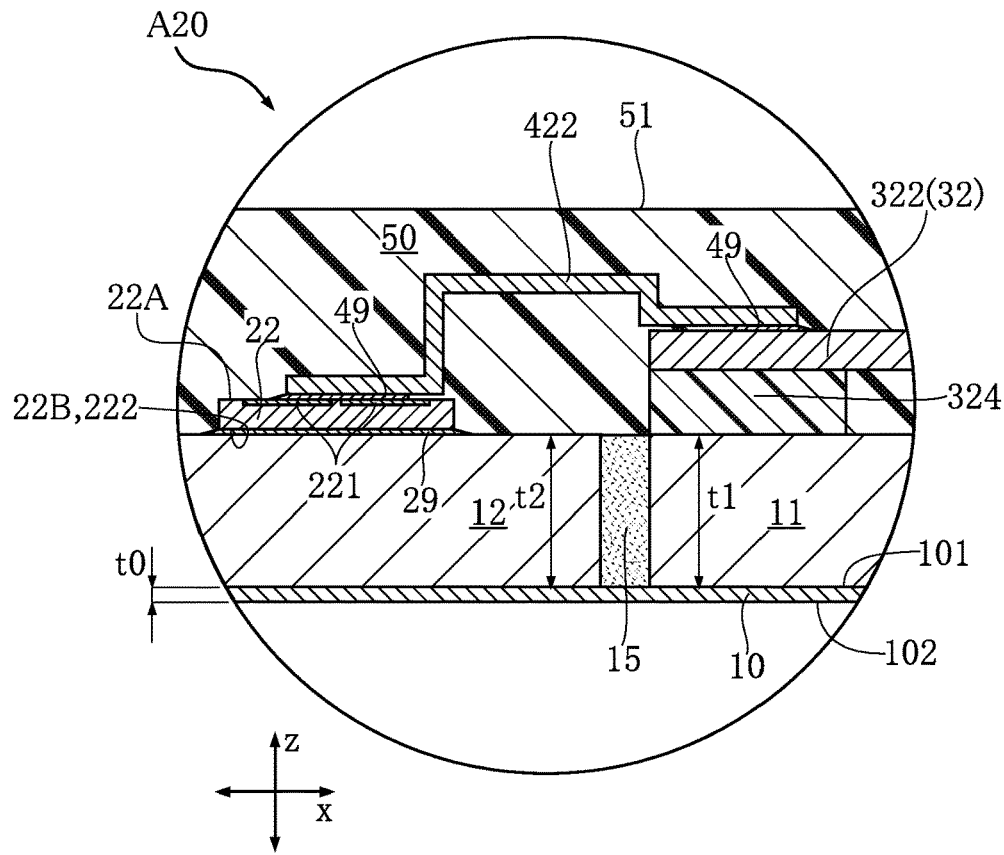
FIG. 20 is an enlarged view of a portion shown in FIG. 19.

As shown in FIGS. 16, 19, and 20, the second electrical connection leads 422 are electrically conductive members that connect the second band-shaped portions 322 of the second supply terminal 32 and the main surface electrodes 221 of the second switching elements 22. The second electrical connection leads 422 are metal plates that are band-shaped and extend in the first direction x, and are bent into a hook shape in the thickness direction z. The constituent material of the second electrical connection leads 422 is the same as the constituent material of the first electrical connection leads 412. One end of each second electrical connection lead 422 is electrically bonded to a second band-shaped portion 322 via a conductive joint layer 49. The other end of the second electrical connection lead 422 is electrically bonded to a main surface electrode 221 via a conductive joint layer 49.

The following will describe the functions and effects of the semiconductor device A20. According to the configuration of the semiconductor device A20, the same insulating layer 10, first conductive plate 11, and second conductive plate 12 as those of the above-described semiconductor device A10 are provided. Accordingly, the first conductive plate 11 and the second conductive plate 12 function as heat dissipation members and electrically conductive members in the semiconductor device A20. Therefore, also with the semiconductor device A20, it is possible to improve the heat dissipation.

The semiconductor device A20 is provided with the first electrical connection leads 412 in place of the first conductive wires 411, and the second electrical connection leads 422 in place of the second conductive wires 421. The cross-sectional areas of the first electrical connection leads 412 and the second electrical connection leads 422 are larger than the cross-sectional areas of the first conductive wires 411 and the second conductive wires 421. Accordingly, the electric resistance of the first electrical connection leads 412 and the second electrical connection leads 422 is lower than the electric resistance of the first conductive wires 411 and the second conductive wires 421. Accordingly, it is possible to suppress power loss of the semiconductor device A20, compared to that of the semiconductor device A10.

Figure 22:
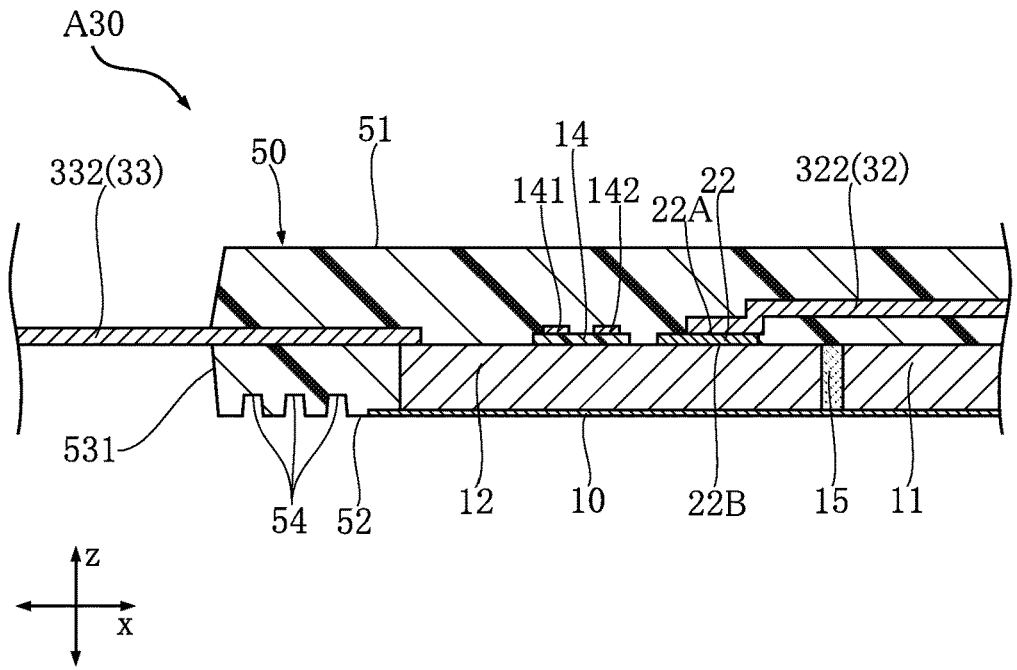
FIG. 22 is a cross-sectional view taken along a line XXII-XXII in FIG. 21.
Figure 23:
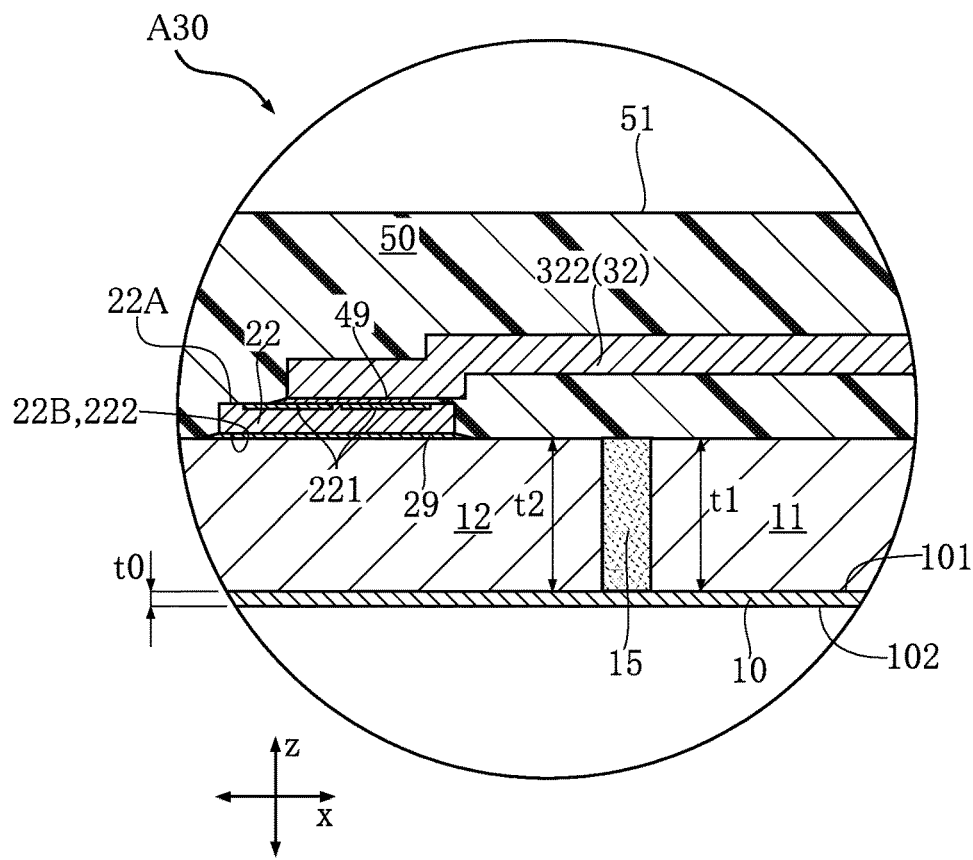
FIG. 23 is an enlarged view of a portion shown in FIG. 22.

A semiconductor device A30 according to a third embodiment of the first aspect will be described with reference to FIGS. 21 to 23. In these figures, the same reference numerals are given to the same or similar components as those in the above-described semiconductor device A10, and descriptions thereof are omitted. Furthermore, in FIG. 21 out of these figures, the sealing resin 50 is transparent, for convenience of understanding.

The semiconductor device A30 differs from the above-described semiconductor device A10 in that the first electrical connection leads 412 are provided in place of the first conductive wires 411, and differs in the configuration of the second band-shaped portions 322 of the second supply terminal 32. Note that the configuration of the first electrical connection leads 412 is the same as that of the first electrical connection leads 412 of the above-described semiconductor device A20, and thus a description thereof is omitted.

Figure 21:
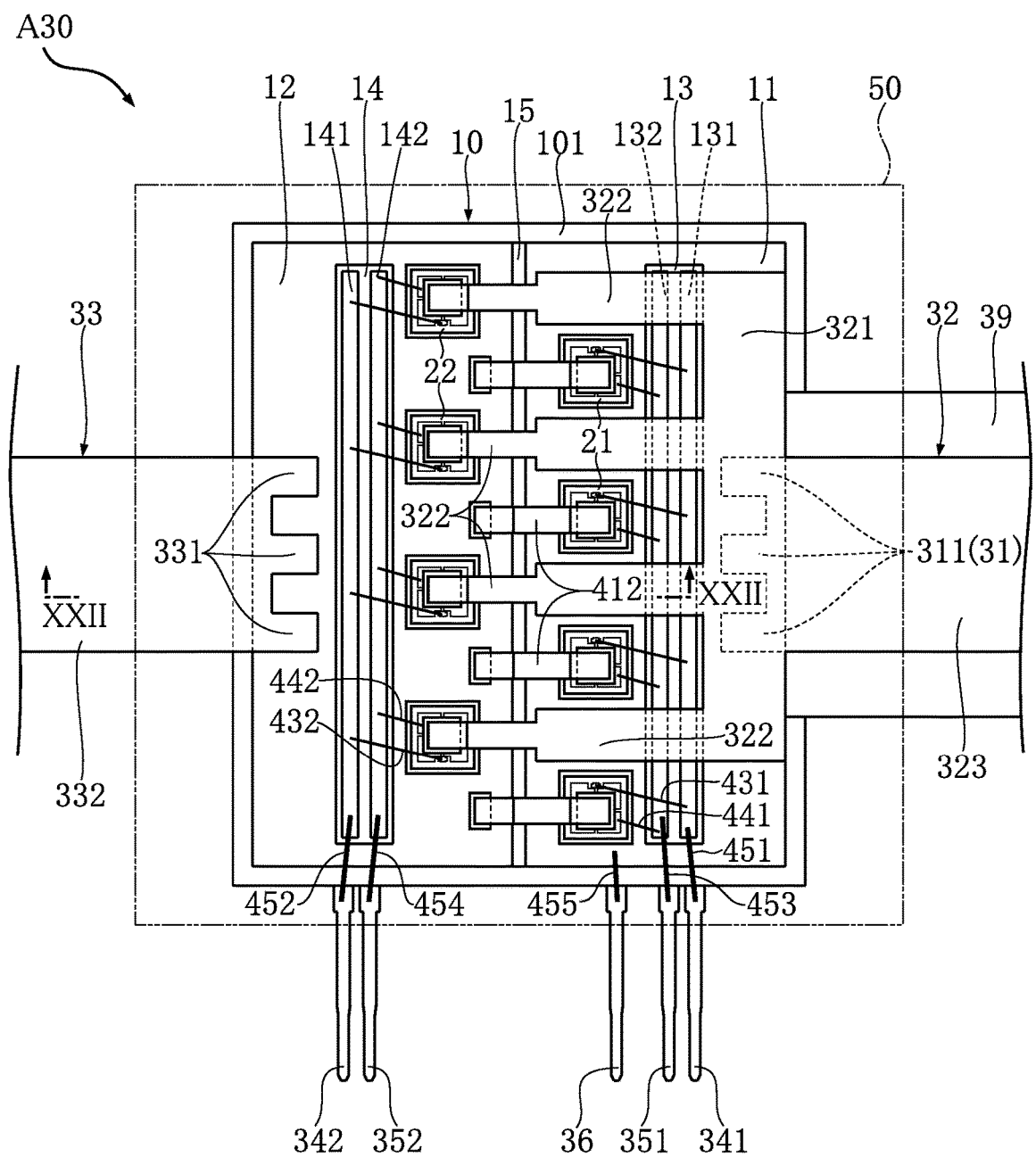
FIG. 21 is a plan view illustrating a semiconductor device according to a third embodiment of the first aspect, with a sealing resin being transparent.

As shown in FIG. 21, the leading ends of the second band-shaped portions 322 of the second supply terminal 32 extend to positions at which they overlap with the main surface electrodes 221 of the second switching elements 22, as viewed in a plan view. As shown in FIGS. 22 and 23, the leading end of the second band-shaped portion 322 is bent into a hook shape in the thickness direction z. The leading end of each second band-shaped portion 322 is electrically bonded to a main surface electrode 211 via a conductive joint layer 49. Accordingly, the main surface electrodes 221 are electrically connected to the second supply terminal 32 without using any of the second conductive wires 421 and the second electrical connection leads 422. Note that, in the semiconductor device A30, since the second band-shaped portions 322 are not bonded to the first conductive plate 11, there is no need to provide the insulators 324.

The following will describe the functions and effects of the semiconductor device A30. According to the configuration of the semiconductor device A30, the same insulating layer 10, first conductive plate 11, and second conductive plate 12 as those of the above-described semiconductor device A10 are provided. Accordingly, the first conductive plate 11 and the second conductive plate 12 function as heat dissipation members and electrically conductive members in the semiconductor device A30. Therefore, also with the semiconductor device A30, it is possible to improve the heat dissipation.

The second band-shaped portions 322 of the second supply terminal 32 are connected to the main surface electrodes 221 of the second switching elements 22. Accordingly, in the semiconductor device A30, there is no need to provide any of the second conductive wires 421, the second electrical connection leads 422, and the insulators 324. It is thus possible to reduce the number of components needed to manufacture the semiconductor device A30.

A semiconductor device A40 according to a fourth embodiment of the first aspect will be described with reference to FIGS. 24 to 29. In these figures, the same reference numerals are given to the same or similar components as those in the above-described semiconductor device A10, and redundant descriptions thereof are omitted. Furthermore, in FIG. 24 out of these figures, the sealing resin 50 is transparent, for convenience of understanding.

Figure 29:
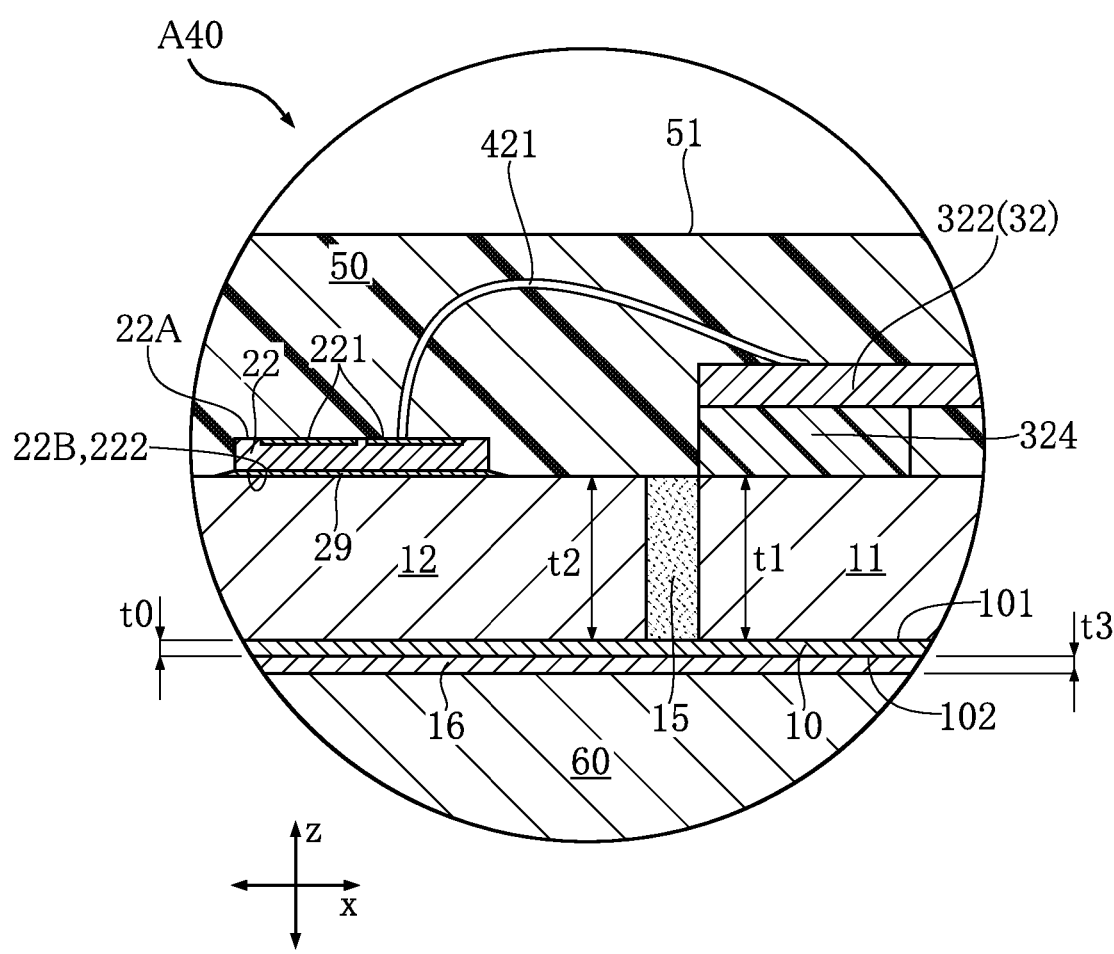
FIG. 29 is an enlarged view of a portion shown in FIG. 28B.

The semiconductor device A40 differs from the above-described semiconductor device A10 in that it is provided with a metal layer 16 and a heat radiator 60. As shown in FIG. 29, the metal layer 16 is a conductive layer bonded to the back surface 102 of the insulating layer 10. The constituent material of the metal layer 16 is Cu. The metal layer 16 has a thickness t3 set to 0.25 to 0.8 mm. Accordingly, the thickness t3 of the metal layer 16 is smaller than the thickness t1 of the first conductive plate 11 and the thickness t2 of the second conductive plate 12. The metal layer 16 is electrically insulated from the first conductive plate 11 and the second conductive plate 12 by the insulating layer 10.

As shown in FIGS. 24 to 29, the heat radiator 60 is bonded to the metal layer 16. In the semiconductor device A40, the heat radiator 60 is plate shaped, but the shape of the heat radiator 60 is not limited. The heat radiator 60 is exposed to the outside of the semiconductor device A40.

Figure 24:
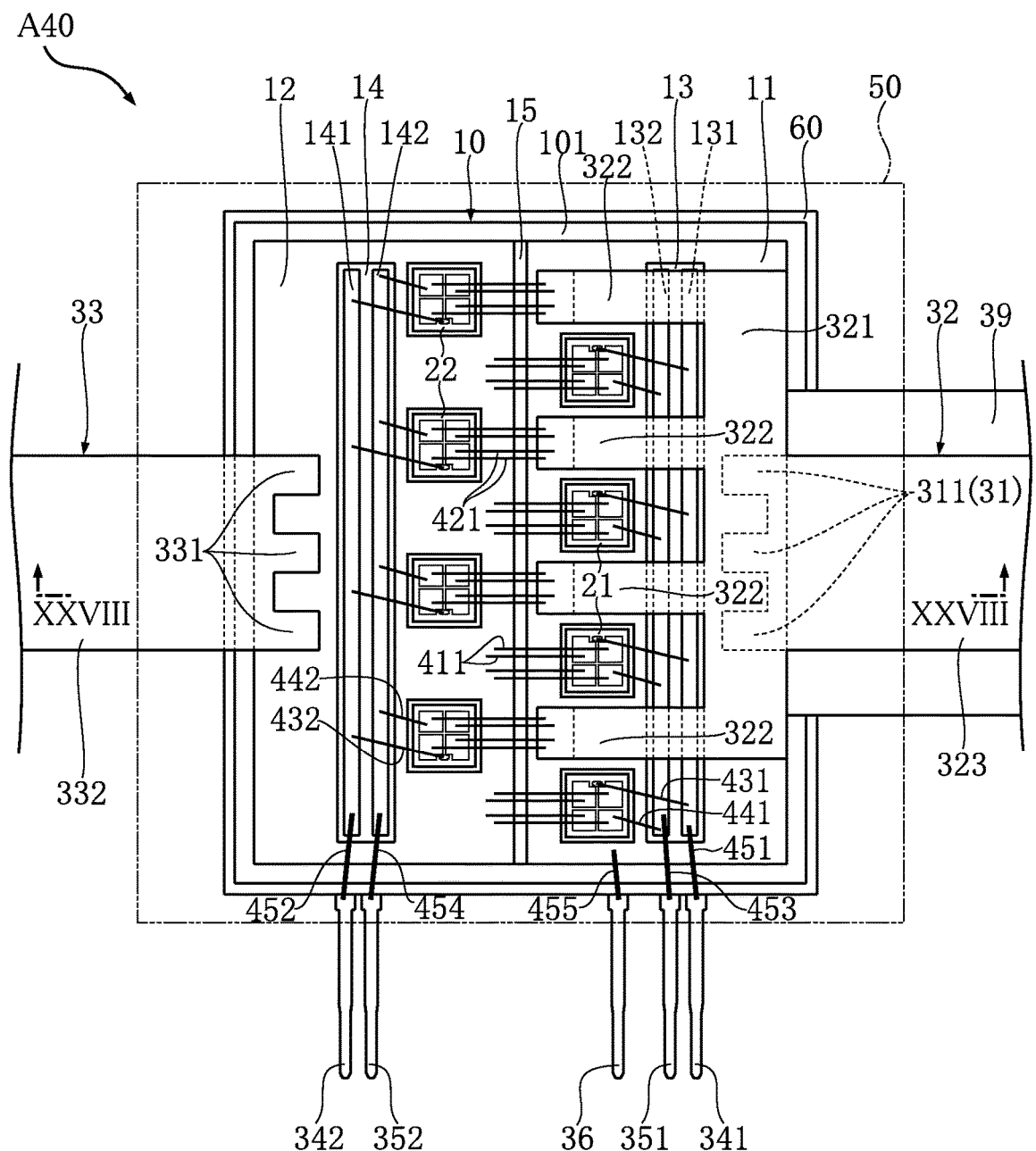
FIG. 24 is a plan view illustrating a semiconductor device according to a fourth embodiment of the first aspect, with a sealing resin being transparent.
Figure 25:
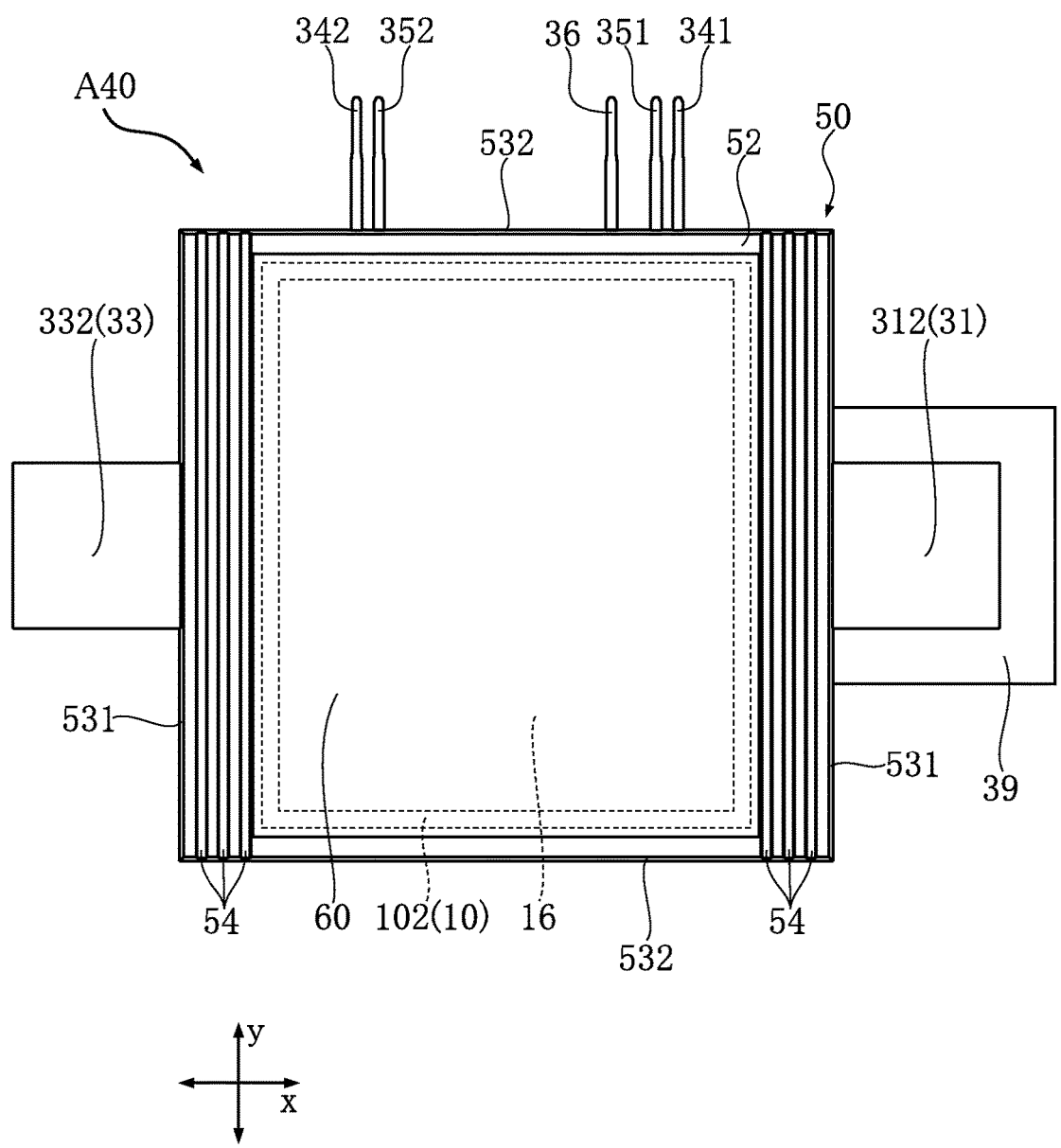
FIG. 25 is a bottom view of the semiconductor device shown in FIG. 24.
Figure 26:
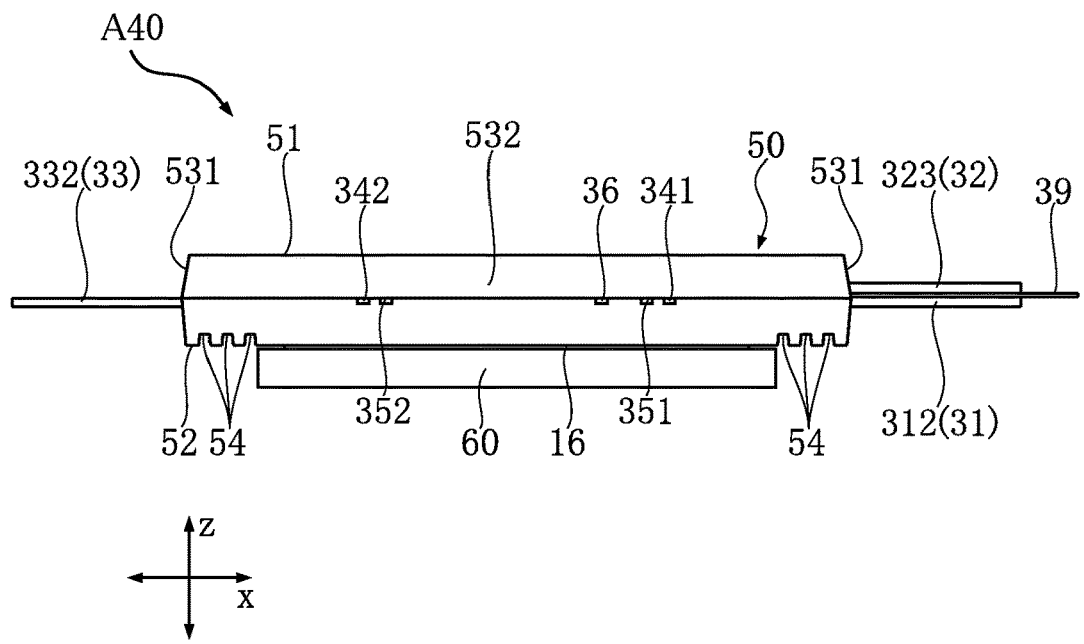
FIG. 26 is a front view of the semiconductor device shown in FIG. 24.
Figure 27:
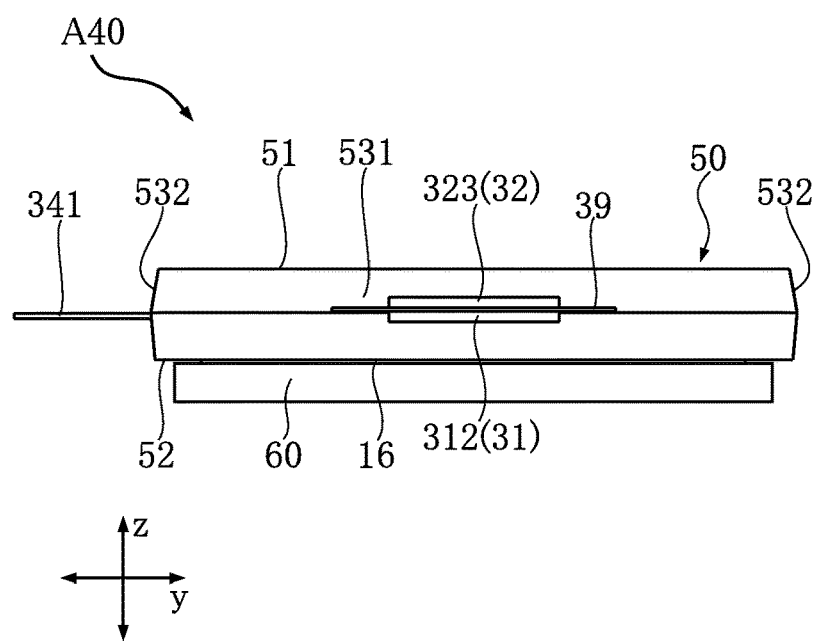
FIG. 27 is a right side view of the semiconductor device shown in FIG. 24.
Figure 28A:
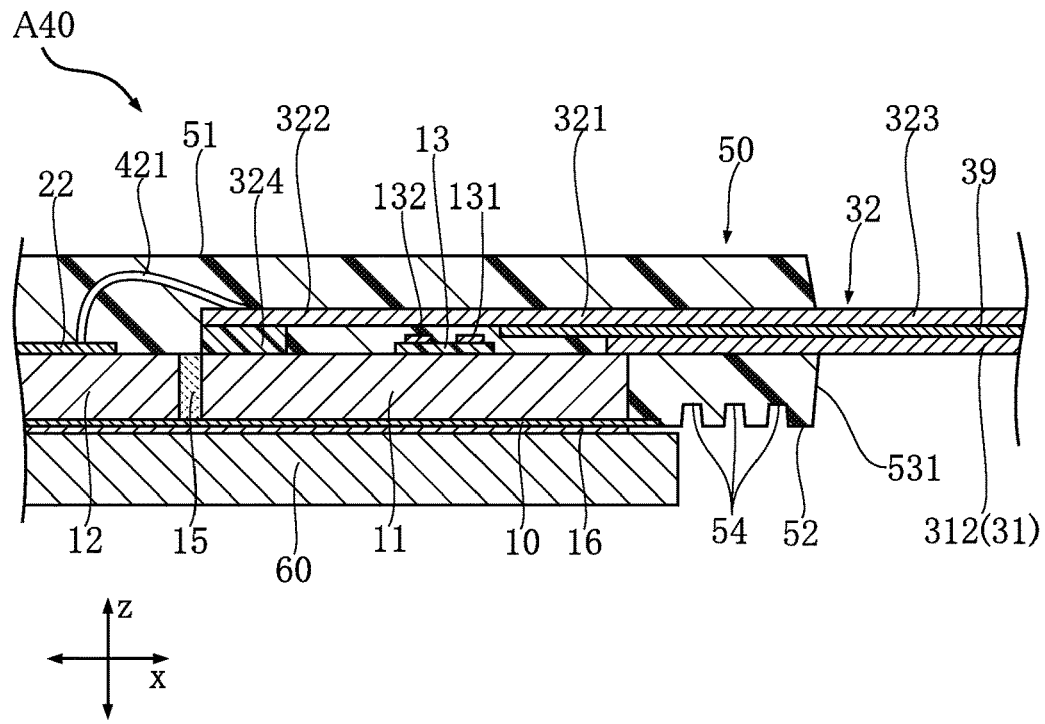
FIG. 28A is a cross-sectional view taken along a line XXVIII-XXVIII in FIG. 24, illustrating the vicinity of a first conductive plate.
Figure 28B:
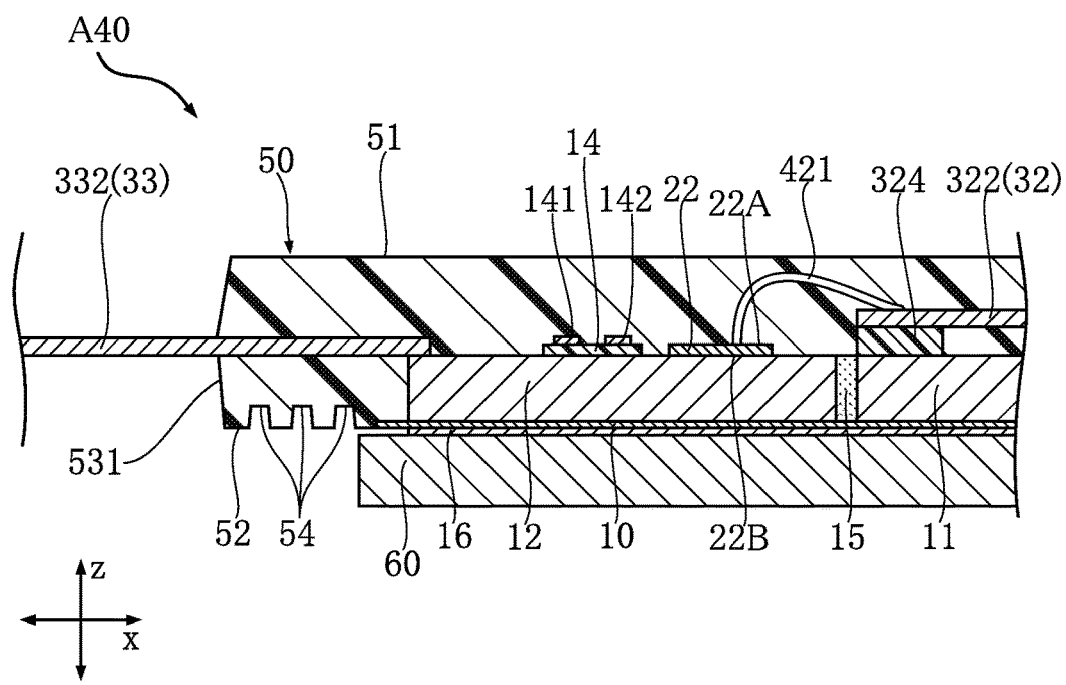
FIG. 28B is a cross-sectional view taken along the line XXVIII-XXVIII in FIG. 24, illustrating the vicinity of a second conductive plate.

As shown in FIG. 24, the semiconductor device A40 is provided with the first conductive wires 411 and the second conductive wires 421, as in the semiconductor device A10. The semiconductor device A40 may also have a configuration in which the first electrical connection leads 412 and the second electrical connection leads 422 are provided in place of the first conductive wires 411 and the second conductive wires 421, as in the semiconductor device A20. Furthermore, the semiconductor device A40 may also have a configuration in which the first electrical connection leads 412 are provided and the second band-shaped portions 322 of the second supply terminal 32 are connected to the main surface electrodes 221 of the second switching elements 22, as in the semiconductor device A30.

The following will describe the functions and effects of the semiconductor device A40. According to the configuration of the semiconductor device A40, the same insulating layer 10, first conductive plate 11, and second conductive plate 12 as those of the above-described semiconductor device A10 are provided. Accordingly, the first conductive plate 11 and the second conductive plate 12 function as heat dissipation members and electrically conductive members in the semiconductor device A40. Therefore, also with the semiconductor device A40, it is possible to improve the heat dissipation.

The semiconductor device A40 is provided with the heat radiator 60. Accordingly, it is possible to further improve the heat dissipation of the semiconductor device A40. Furthermore, by providing the metal layer 16, it is possible to easily join the heat radiator 60 to the metal layer 16 using, for example, a solder or the like.

A semiconductor device A50 according to a fifth embodiment of the first aspect will be described with reference to FIGS. 30 to 32. In these figures, the same reference numerals are given to the same or similar components as those in the above-described semiconductor device A10, and redundant descriptions thereof are omitted. Furthermore, in FIG. 30 out of these figures, the sealing resin 50 is transparent, for convenience of understanding.

The semiconductor device A50 differs from the above-described semiconductor device A10 in that it is provided with the metal layer 16 and the heat radiator 60, and differs in configurations of the first conductive plate 11 and the second conductive plate 12. Note that the configurations of the metal layer 16 and the heat radiator 60 are the same as those of the above-described semiconductor device A40, and thus a description thereof is omitted.

Figure 31A:
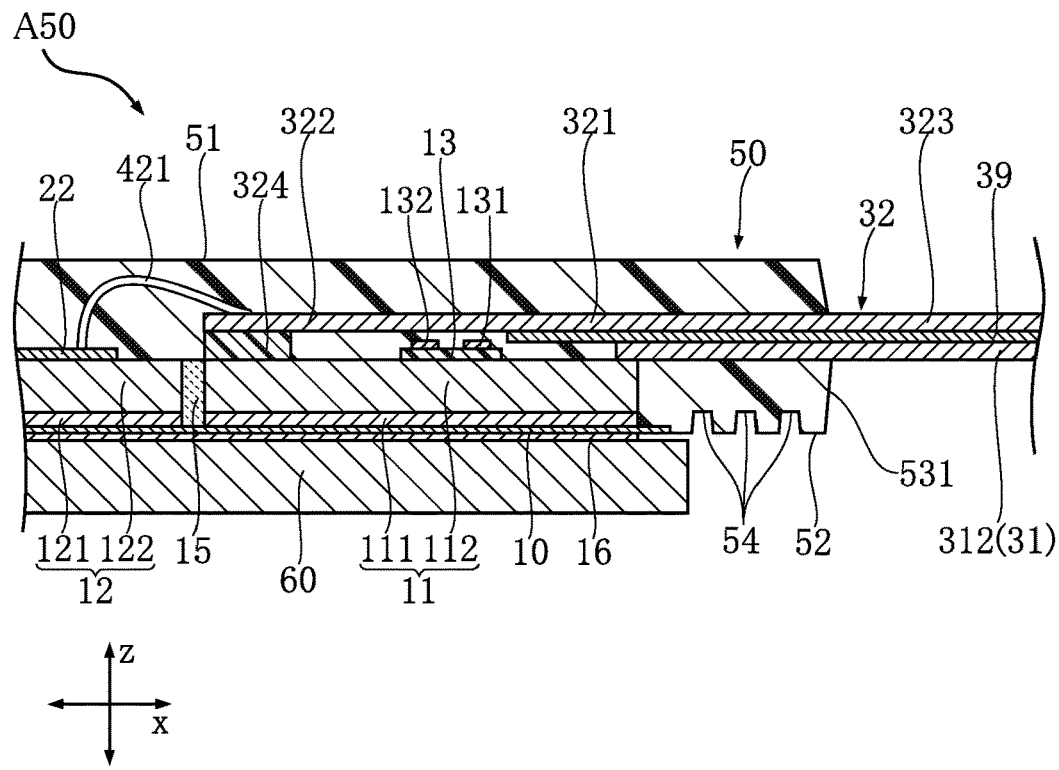
FIG. 31A is a cross-sectional view taken along a line XXXI-XXXI in FIG. 30, illustrating the vicinity of a first conductive plate.
Figure 31B:
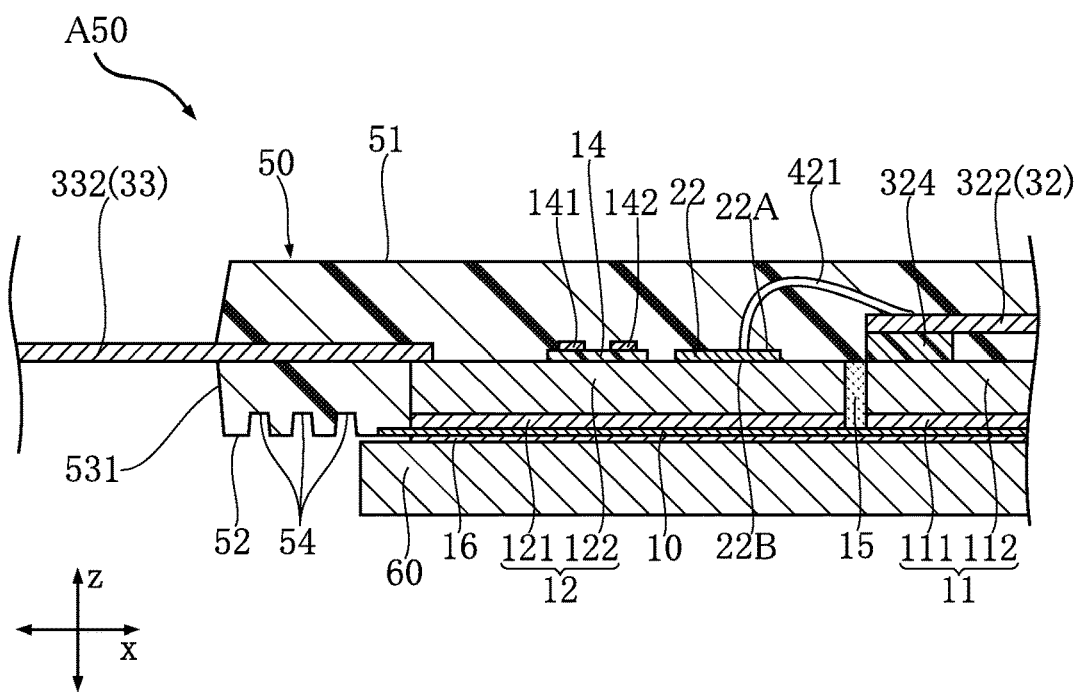
FIG. 31B is a cross-sectional view taken along the line XXXI-XXXI in FIG. 30, illustrating the vicinity of a second conductive plate.
Figure 32:
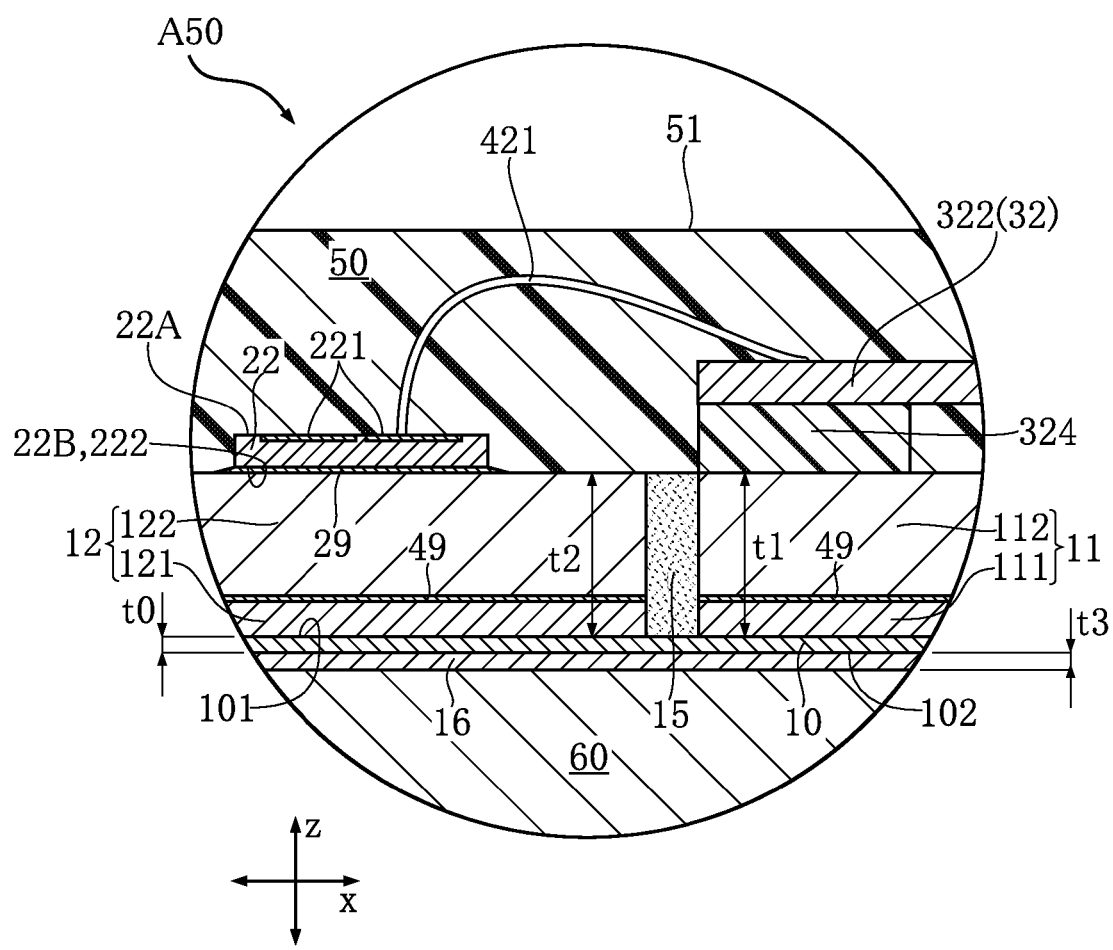
FIG. 32 is an enlarged view of a portion shown in FIG. 31B.

As shown in FIGS. 31A to 32, the first conductive plate 11 has a first layer 111 and a second layer 112. The first layer 111 is bonded to the main surface 101 of the insulating layer 10. The second layer 112 is located on a side of the first layer 111 that is opposite to the insulating layer 10 in the thickness direction z, and is bonded to the first layer 111 with a conductive joint layer 49. The constituent material of both the first layer 111 and the second layer 112 is Cu. The first layer 111 has a thickness set to 0.25 to 0.8 mm. The second layer 112 has a thickness that is equal to or larger than 2.0 mm, and is larger than the thickness of the first layer 111. The semiconductor device A50 is configured such that the thickness t1 of the first conductive plate 11 is obtained by adding the thickness of the conductive joint layer 49 to the thicknesses of the first layer 111 and the second layer 112.

As shown in FIGS. 31A to 32, the second conductive plate 12 has a first layer 121 and a second layer 122. The first layer 121 is bonded to the main surface 101 of the insulating layer 10. The second layer 122 is located on a side of the first layer 121 that is opposite to the insulating layer 10 in the thickness direction z, and is bonded to the first layer 121 with a conductive joint layer 49. The constituent material of both the first layer 121 and the second layer 122 is Cu. The first layer 121 has a thickness that is equal to the thickness of the first layer 111 of the first conductive plate 11. The second layer 122 has a thickness that is equal to the thickness of the second layer 112 of the first conductive plate 11. Accordingly, the thickness of the second layer 122 is larger than the thickness of the first layer 121. The semiconductor device A50 is configured such that the thickness t2 of the second conductive plate 12 is obtained by adding the thickness of the conductive joint layer 49 to the thicknesses of the first layer 121 and the second layer 122.

Figure 30:
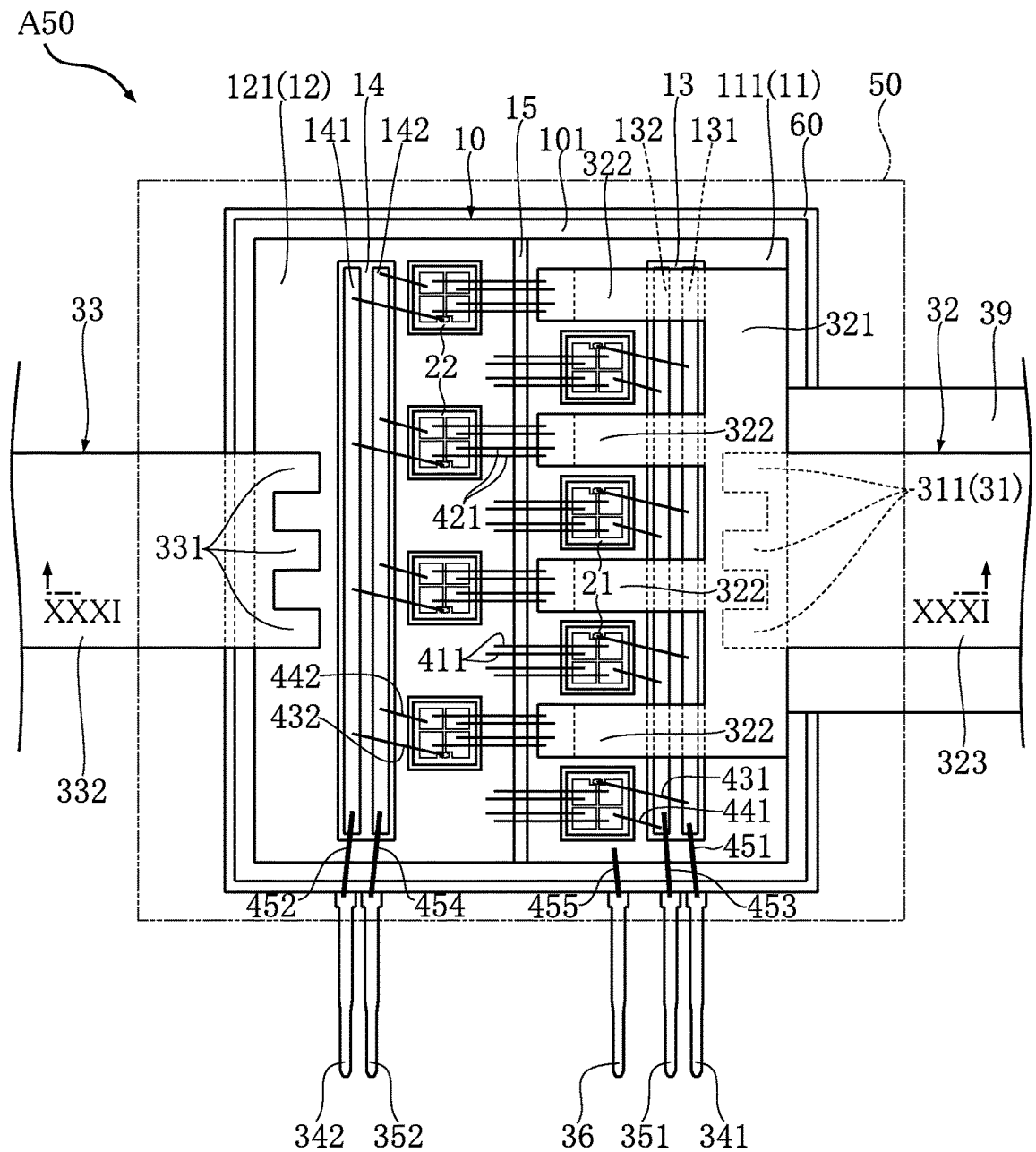
FIG. 30 is a plan view illustrating a semiconductor device according to a fifth embodiment of the first aspect, with a sealing resin being transparent.

As shown in FIG. 30, the semiconductor device A50 is provided with the first conductive wires 411 and the second conductive wires 421, as in the semiconductor device A10. The semiconductor device A50 may also have a configuration in which the first electrical connection leads 412 and the second electrical connection leads 422 are provided in place of the first conductive wires 411 and the second conductive wires 421, as in the semiconductor device A20. Furthermore, the semiconductor device A50 may also have a configuration in which the first electrical connection leads 412 are provided and the second band-shaped portions 322 of the second supply terminal 32 are connected to the main surface electrodes 221 of the second switching elements 22, as in the semiconductor device A30.

The following will describe the functions and effects of the semiconductor device A50. According to the configuration of the semiconductor device A50, the same insulating layer 10, first conductive plate 11, and second conductive plate 12 as those of the above-described semiconductor device A10 are provided. Accordingly, the first conductive plate 11 and the second conductive plate 12 function as heat dissipation members and electrically conductive members in the semiconductor device A50. Therefore, also with the semiconductor device A50, it is possible to improve the heat dissipation.

The first conductive plate 11 has the first layer 111 and the second layer 112, and the thickness of the second layer 112 is larger than the thickness of the first layer 111. Furthermore, the second conductive plate 12 has the first layer 121 and the second layer 122, and the thickness of the second layer 122 is larger than the thickness of the first layer 121. This means that the insulating layer 10, the first conductive plate 11, the second conductive plate 12, and the metal layer 16 can be easily configured, by joining a metal plate to a metal foil layer provided on one side of an existing patterned DBC (Direct Bonding Copper: registered trademark) substrate using the conductive joint layers 49.

In the present invention, a plurality of diodes (such as schottky barrier diodes) constituting parallel circuits that correspond to the first switching elements 21 may also be electrically bonded to the first conductive plate 11. Furthermore, a plurality of diodes constituting parallel circuits that correspond to the second switching elements 22 may also be electrically bonded to the second conductive plate 12. By providing the plurality of diodes, it is possible to avoid, when the plurality of first switching elements 21 are driven, the generation of a reverse current from flowing through the first switching elements 21 even if a back electromotive force is generated by the switching. Similarly, it is also possible to avoid, when the plurality of second switching elements 22 are driven, the generation of a reverse current from flowing through the second switching elements 22.

The above-described various embodiments of the first aspect can be defined, for example, as the following Clauses.

Clause 1. A semiconductor device comprising:
an insulating layer that has a main surface oriented in a thickness direction;
a first conductive plate and a second conductive plate that are bonded to the main surface, and are spaced apart from each other in a first direction which is perpendicular to the thickness direction;
a plurality of first switching elements that are electrically bonded to the first conductive plate and are electrically connected to the second conductive plate;
a plurality of second switching elements that are electrically bonded to the second conductive plate;
a first supply terminal that is electrically bonded to the first conductive plate; and
a second supply terminal that is spaced apart from both the first conductive plate and the first supply terminal in the thickness direction, and is electrically connected to the plurality of second switching elements,
wherein the first conductive plate and the second conductive plate have a thickness that is larger than a thickness of the insulating layer.

Clause 2. The semiconductor device according to Clause 1, wherein the thickness of the first conductive plate and the second conductive plate is 1.5 to 10 mm.

Clause 3. The semiconductor device according to Clause 1, wherein the thickness of the first conductive plate and the second conductive plate is three to one hundred times as large as the thickness of the insulating layer.

Clause 4. The semiconductor device according to Clause 2 or 3, wherein the first conductive plate and the second conductive plate are made of a material that contains Cu.

Clause 5. The semiconductor device according to any one of Clauses 2 to 4, further comprising an insulating material that is interposed between the first conductive plate and the second conductive plate in the first direction.

Clause 6. The semiconductor device according to any one of Clauses 2 to 5, wherein each of the plurality of second switching elements has an element main surface on which a main surface electrode is provided,
the second supply terminal includes a first band-shaped portion that extends in a second direction which is perpendicular to both the thickness direction and the first direction, and a plurality of second band-shaped portions that extend from the first band-shaped portion toward the second conductive plate, and are spaced apart from each other in the second direction, and
the plurality of second band-shaped portions are electrically connected to the main surface electrodes of the plurality of second switching elements.

Clause 7. The semiconductor device according to Clause 6, further comprising a plurality of conductive wires that are connected to the plurality of second band-shaped portions and the main surface electrodes of the plurality of second switching elements,
wherein the plurality of conductive wires extend in the first direction.

Clause 8. The semiconductor device according to Clause 6, further comprising a plurality of electrical connection leads that are connected to the plurality of second band-shaped portions and the main surface electrodes of the plurality of second switching elements,
wherein the plurality of electrical connection leads extend in the first direction.

Clause 9. The semiconductor device according to Clause 7 or 8, wherein each of the plurality of second band-shaped portions is bonded to the first conductive plate via an insulator.

Clause 10. The semiconductor device according to Clause 6, wherein the plurality of second band-shaped portions are bonded to the main surface electrodes of the plurality of second switching elements.

Clause 11. The semiconductor device according to Clause 10, wherein the plurality of second switching elements are spaced apart from each other in the second direction, and
the plurality of second switching elements respectively face the plurality of second band-shaped portions in the first direction.

Clause 12. The semiconductor device according to Clause 11, further comprising: a substrate; a gate layer; and a gate terminal, wherein the substrate extends in the second direction, has an electrical insulating property, and is bonded to the second conductive plate,
the gate layer extends in the second direction, is electrically conductive, and is arranged on the substrate,
the gate terminal is spaced apart from the second conductive plate, and is electrically connected to the gate layer, and
the element main surface of each of the plurality of second switching elements is provided with a gate electrode that is spaced apart from the main surface electrode and is electrically connected to the gate layer.

Clause 13. The semiconductor device according to any one of Clauses 2 to 12, further comprising a metal layer that is bonded to the insulating layer,
wherein the insulating layer has a back surface that is oriented toward a side opposite to the main surface, and the metal layer is bonded to the back surface of the insulating layer, and
the metal layer has a thickness that is smaller than the thickness of the first conductive plate and the second conductive plate.

Clause 14. The semiconductor device according to Clause 13, wherein each of the first conductive plate and the second conductive plate includes a first layer that is bonded to the main surface of the insulating layer, and a second layer that is located on a side of the first layer that is opposite to the insulating layer in the thickness direction, and the second layer has a thickness that is larger than a thickness of the first layer.

Clause 15. The semiconductor device according to Clause 13 or 14, further comprising a heat radiator that is bonded to the metal layer.

Clause 16. The semiconductor device according to any one of Clauses 2 to 15, further comprising a sealing resin that covers the first conductive plate, the second conductive plate, the plurality of first switching elements, and the plurality of second switching elements, wherein the first supply terminal and the second supply terminal each have a portion that extends to a side away from the second conductive plate in the first direction and is exposed from the sealing resin.

Clause 17. The semiconductor device according to Clause 16, further comprising an output terminal that is electrically bonded to the second conductive plate, wherein the output terminal has a portion that extends to a side away from the first conductive plate in the first direction, and is exposed from the sealing resin.

The following will describe semiconductor devices B10 to B30 according to a second aspect with reference to FIGS. 33 to 50. Note that, in the following description, the same reference numerals are given to the same or similar components as those in the above-described semiconductor devices A10 to A50, and descriptions of these components are omitted or simplified as appropriate.

Figure 34:
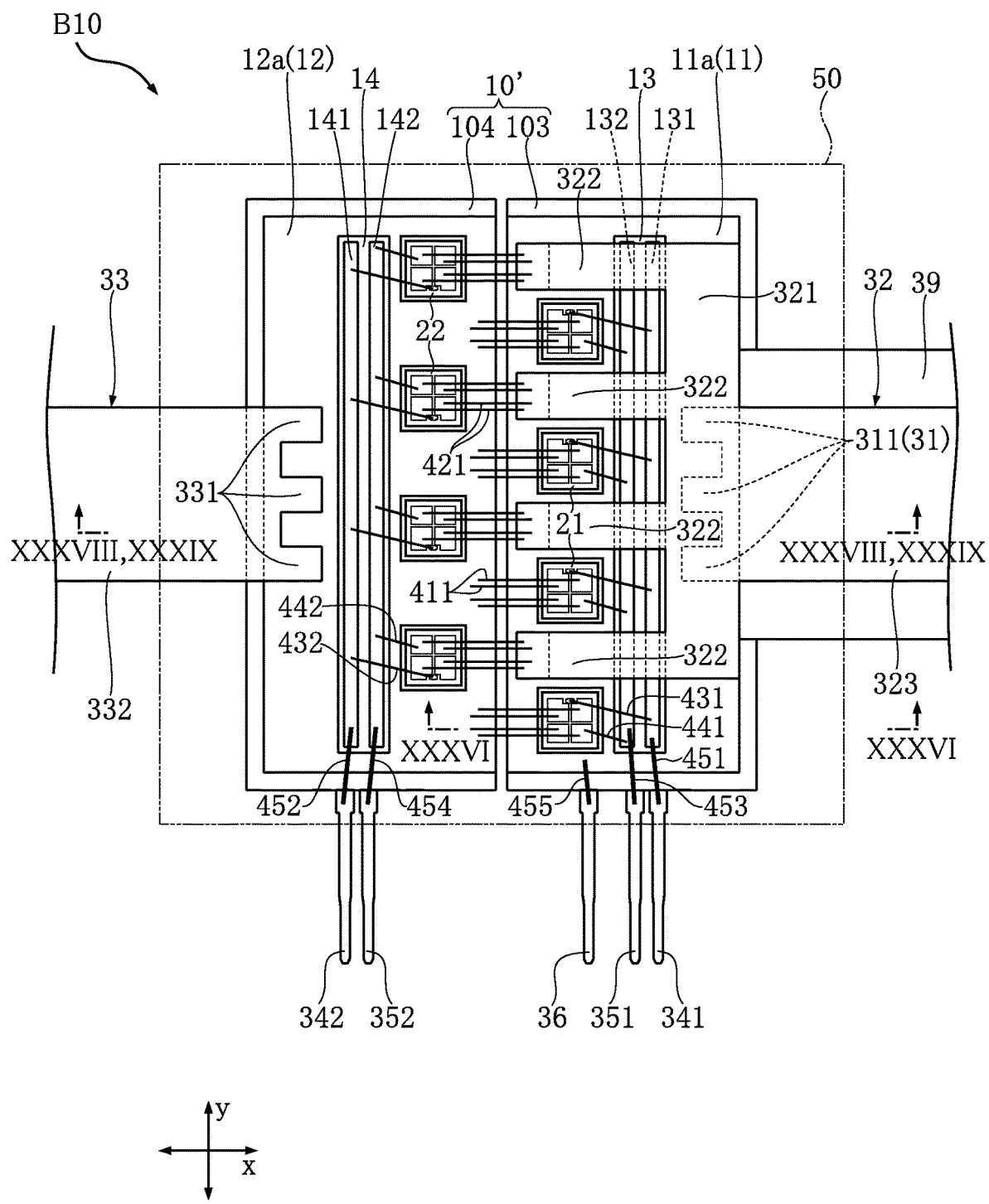
FIG. 34 is a plan view of the semiconductor device shown in FIG. 33, with a sealing resin being transparent.
Figure 35:
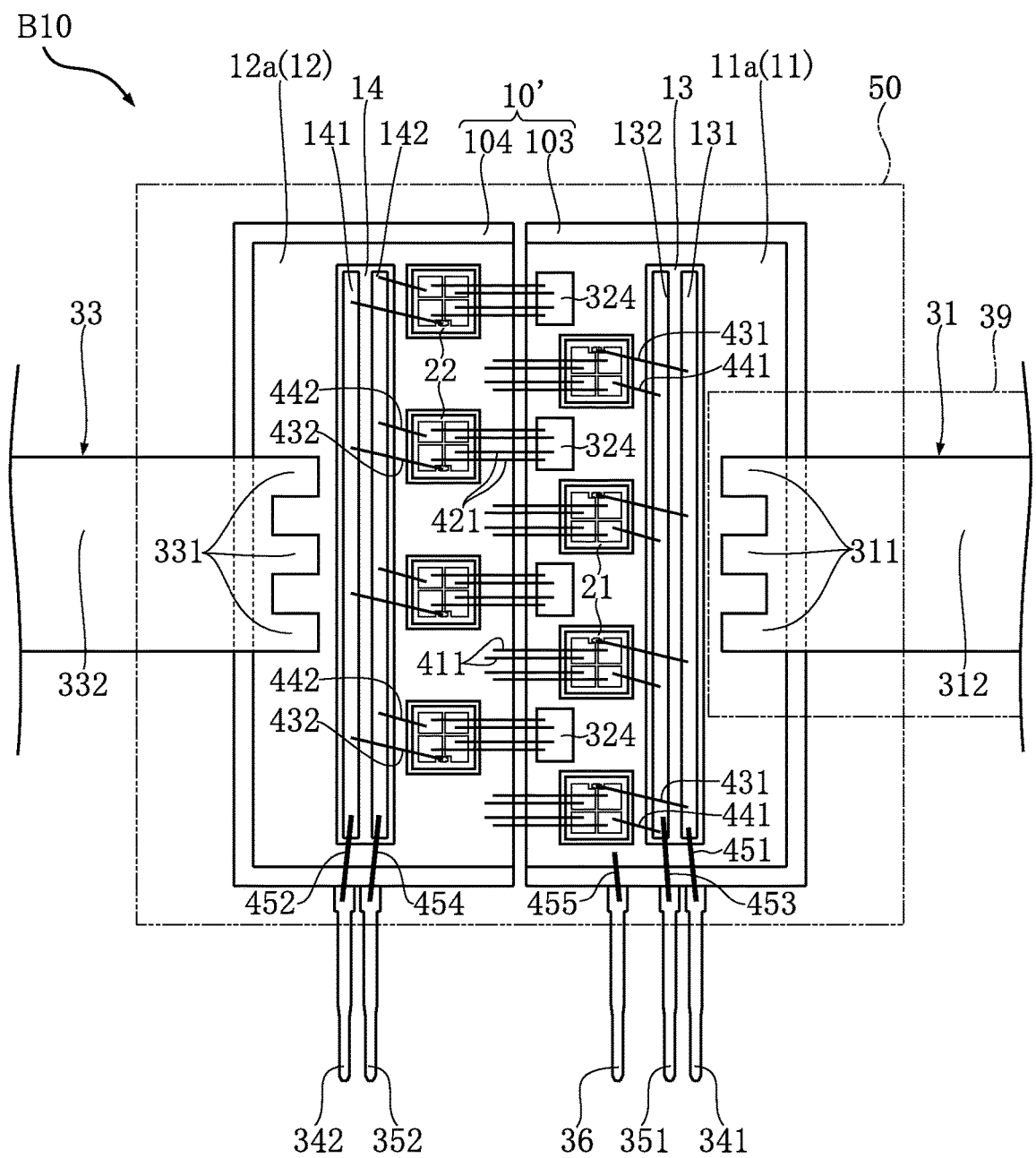
FIG. 35 is a plan view that corresponds to FIG. 34, with a second supply terminal omitted and a terminal insulating member being transparent.
Figure 36:
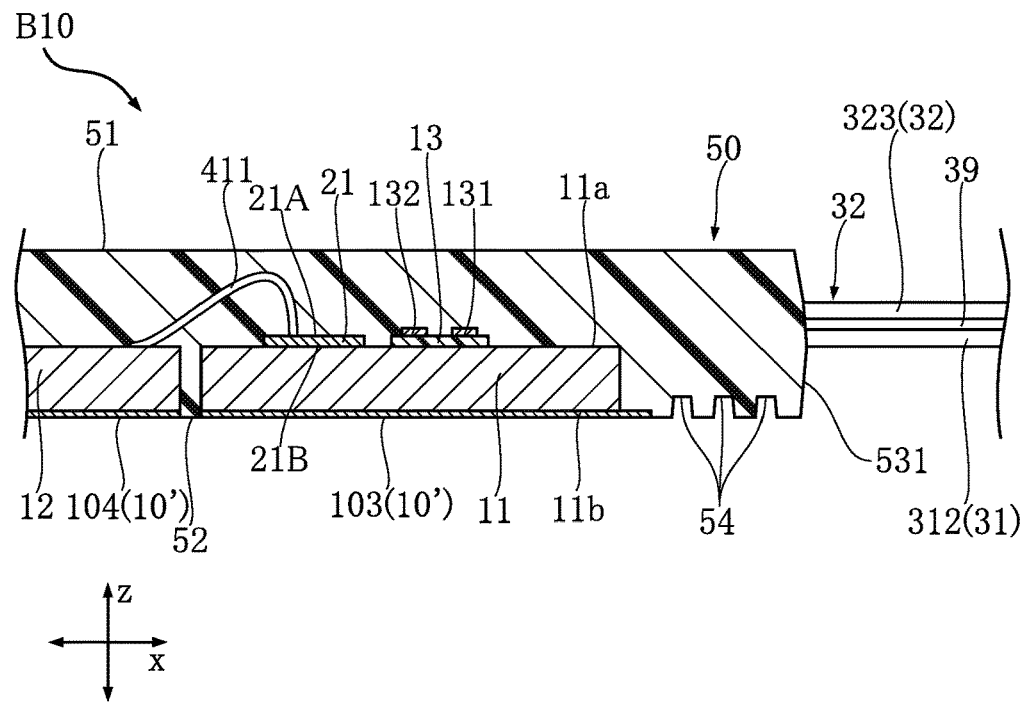
FIG. 36 is a cross-sectional view taken along a line XXXVI-XXXVI in FIG. 34.

The semiconductor device B10 according to a first embodiment of the second aspect will be described with reference to FIGS. 33 to 42. The semiconductor device B10 is provided with the first conductive plate 11, the second conductive plate 12, the plurality of first switching elements 21, the plurality of second switching elements 22, the first supply terminal 31, and the second supply terminal 32. In addition thereto, the semiconductor device B10 is provided with the terminal insulating member 39, the first conductive wires 411, the second conductive wires 421, an insulating layer 10', and the sealing resin 50. In FIG. 34 out of these figures, the sealing resin 50 is transparent, for convenience of understanding. In FIG. 35, for convenience of understanding, the second supply terminal 32 is omitted and the terminal insulating member 39 is transparent. The sealing resin 50 that is transparent in FIGS. 34 and 35, and the terminal insulating member 39 that is transparent in FIG. 35 are indicated by virtual lines (dashed-two dotted lines). Note that the perspective view and the plan view of the semiconductor device B10 are identical to FIG. 1 and FIG. 2.

As shown in FIGS. 34 to 38, the first conductive plate 11 is an electrically conductive member that is made of metal and is plate-shaped, and on which the plurality of first switching elements 21 are mounted. The constituent material of the first conductive plate 11 is Cu (copper) or a Cu alloy. The first conductive plate 11 has a thickness set to 1.5 to 10 mm. The first conductive plate 11 has a first main surface 11a and a first back surface 11b.

As shown in FIGS. 34 to 38 (excluding FIG. 37), the first substrate 13, which has electrical insulating properties, is bonded to the first main surface 11a of the first conductive plate 11. The first substrate 13 is located between the plurality of first switching elements 21 and the first supply terminal 31 in the first direction x, and extends in the second direction y. The first substrate 13 is a ceramic substrate whose constituent material is, for example, $Al_2O_3$ (alumina) or the like, or a printed-wiring board. The first substrate 13 is bonded to the first main surface 11a with an adhesive (not-shown). The first gate layer 131 and the first detection layer 132 are arranged on the first substrate 13. The first gate layer 131 and the first detection layer 132 are electrically conductive, and extend in the second direction y. The first gate layer 131 and the first detection layer 132 are made of a Cu foil, for example.

As shown in FIGS. 34, 35, 39, and 40, the second conductive plate 12 is an electrically conductive member that is made of metal and is plate-shaped, and on which the plurality of second switching elements 22 are mounted. The constituent material and the thickness of the second conductive plate 12 are the same as the constituent material and the thickness of the first conductive plate 11. The second conductive plate 12 has a second main surface 12a and a second back surface 12b. The second conductive plate 12 is spaced apart from the first conductive plate 11 in the first direction x. As shown in, for example, FIG. 37, part of the sealing resin 50 enters a space between the first conductive plate 11 and the second conductive plate 12 and fills up the space.

Figure 39:
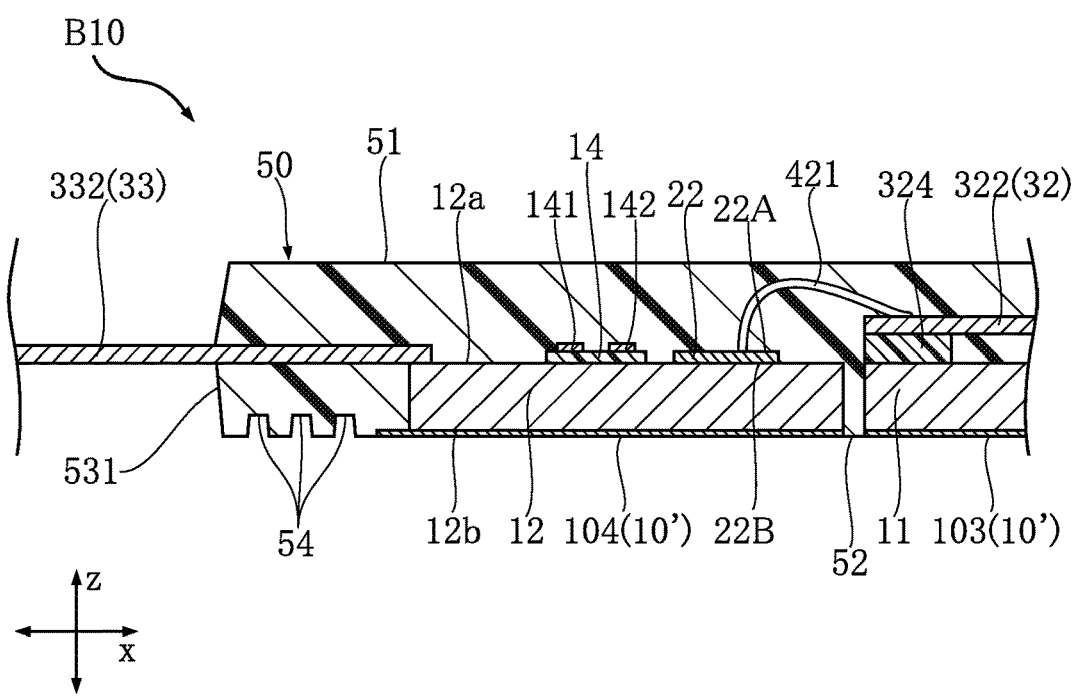
FIG. 39 is a cross-sectional view taken along the line XXXVIII, XXXIX-XXXVIII, XXXIX in FIG. 34, illustrating the vicinity of a second conductive plate.

As shown in FIGS. 34, 35, and 39, the second substrate 14, which has electrical insulating properties, is bonded to the second main surface 12a of the second conductive plate 12. The second substrate 14 is located between the plurality of second switching elements 22 and the output terminal 33 in the first direction x, and extends in the second direction y. The constituent material of the second substrate 14 is the same as the constituent material of the first substrate 13. The second substrate 14 is bonded to the second main surface 12a with an adhesive (not-shown). The second gate layer 141 and the second detection layer 142 are arranged on the second substrate 14. The second gate layer 141 and the second detection layer 142 are electrically conductive, and extend in the second direction y. The second gate layer 141 and the second detection layer 142 are made of a Cu foil, for example.

As shown in FIGS. 34 to 37, the plurality of first switching elements 21 are electrically bonded to the first main surface 11a of the first conductive plate 11, and are electrically connected to the second conductive plate 12. Each first switching element 21 is electrically connected to the second conductive plate 12 via the first conductive wires 411. Each of the first switching elements 21 has a main surface 21A and a back surface 21B.

As shown in FIGS. 34, 35, 39, and 40, the plurality of second switching elements 22 are semiconductor elements that are electrically bonded to (the second main surface 12a of) the second conductive plate 12. Each second switching element 22 is electrically connected to the second supply terminal 32 via the second conductive wires 421. The second switching elements 22 are the same elements as the first switching elements 21. The plurality of second switching elements 22 are lined up in the second direction y. The second switching elements 22 each have the main surface 22A and the back surface 22B.

Figure 40:
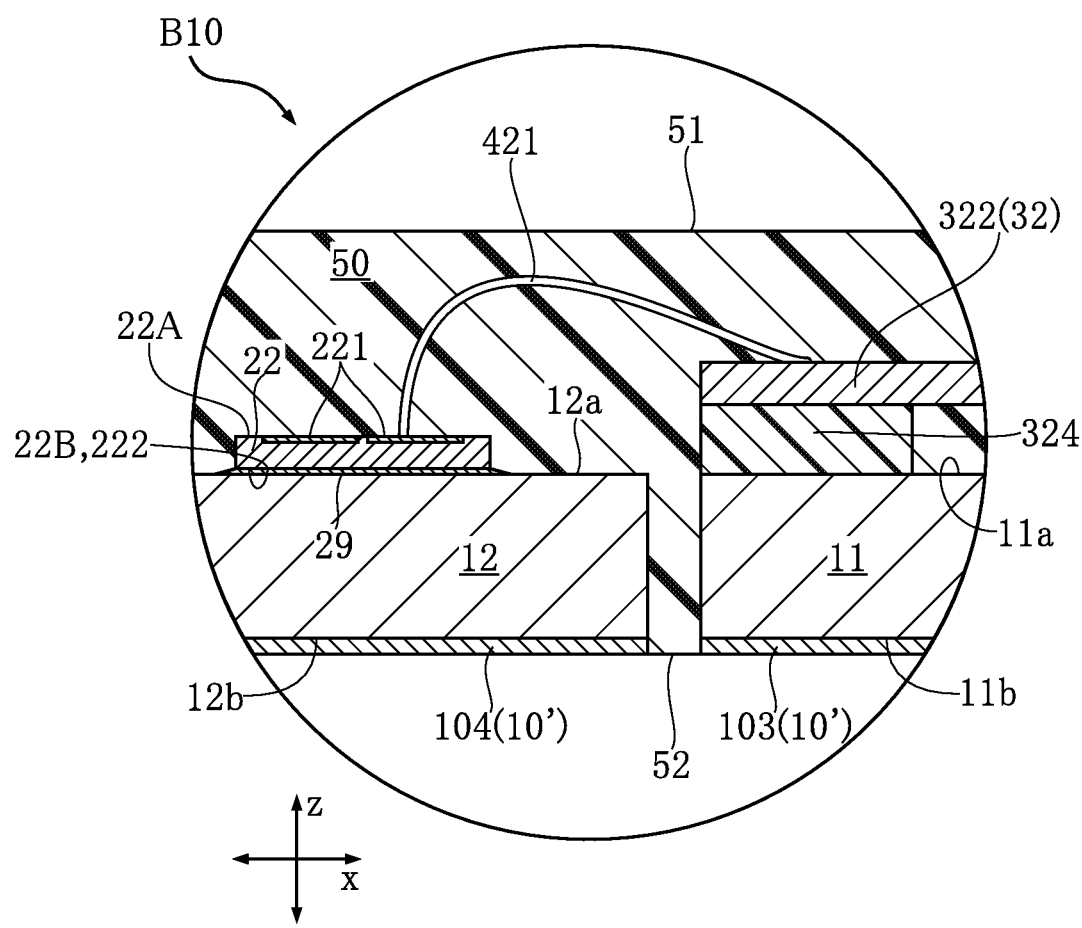
FIG. 40 is an enlarged view of a portion shown in FIG. 39.

As shown in FIG. 40, the main surface 22A is oriented in the same direction as that of the second main surface 12a of the second conductive plate 12. The main surface 22A is provided with the main surface electrode 221 and the gate electrode 223. Furthermore, the back surface 22B is oriented toward a side opposite to the main surface 22A, and faces the second main surface 12a. The back surface 22B is provided with the back surface electrode 222.

Figure 42:
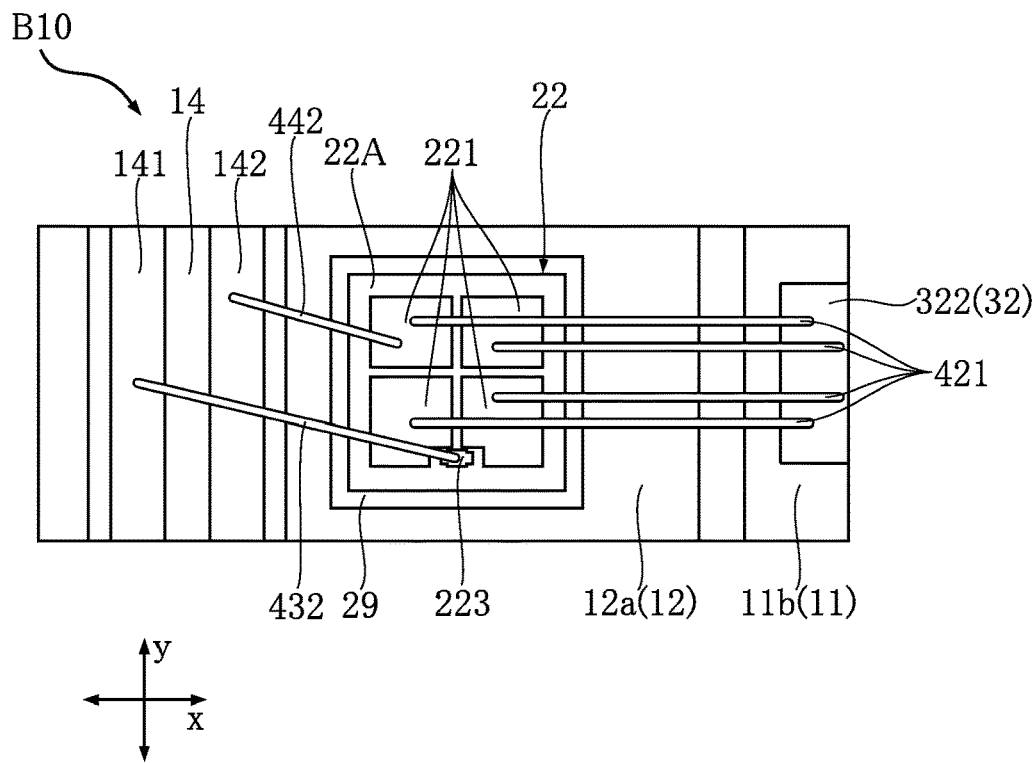
FIG. 42 is a plan view illustrating a second switching element shown in FIG. 34.

A gate voltage for driving the second switching element 22 is applied to the gate electrode 223. As shown in FIG. 42, the gate electrode 223 is located between two regions of the main surface electrode 221 that are spaced apart from each other in the first direction x. The gate electrode 223 has a size smaller than that of any region of the main surface electrode 221.

Figure 37:
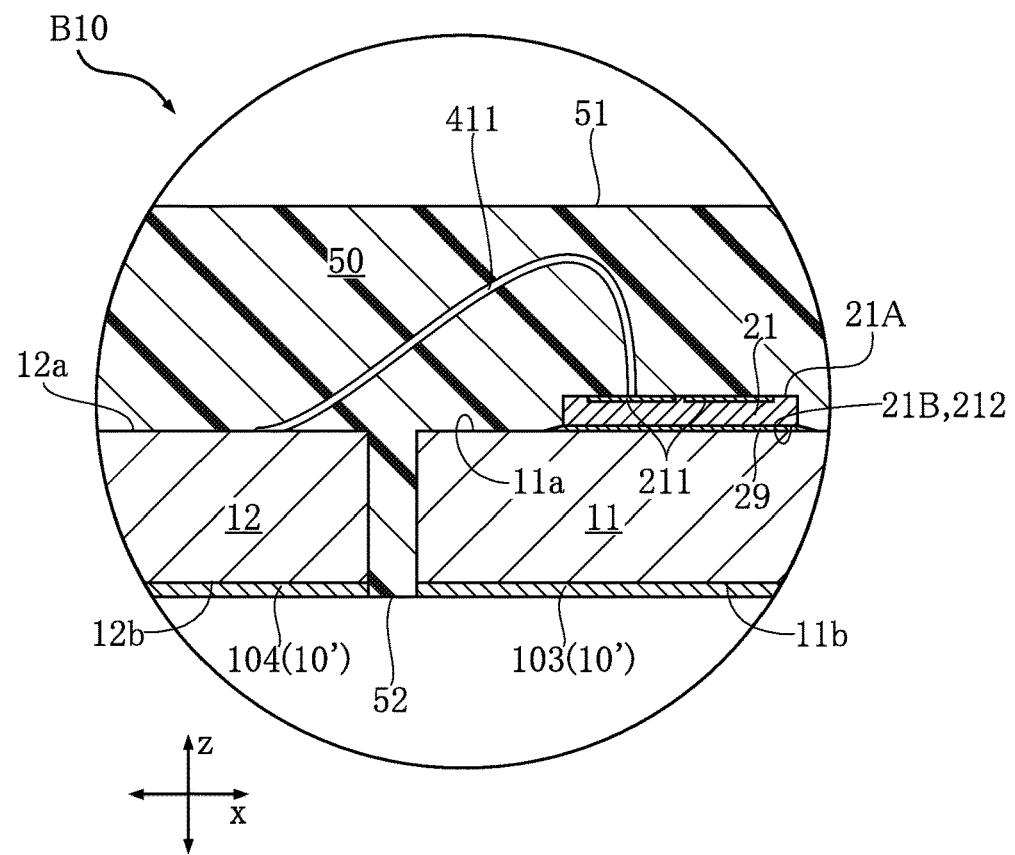
FIG. 37 is a partially enlarged view of FIG. 36.

As shown in FIG. 37, the element joining layer 29 is interposed between the back surface 21B of the first switching element 21 and the first main surface 11a of the first conductive plate 11. Furthermore, as shown in FIG. 40, the element joining layer 29 is interposed between the back surface 22B of the second switching element 22 and the second main surface 12a of the second conductive plate 12. The element joining layers 29 are electrically conductive. The element joining layers 29 are lead-free solders whose main component is Sn (tin), for example. The first switching elements 21 are electrically bonded to the first main surface 11a through die bonding using the element joining layers 29. Similarly, the second switching elements 22 are bonded to the second main surface 12a through die bonding using the element joining layers 29.

Figure 33:
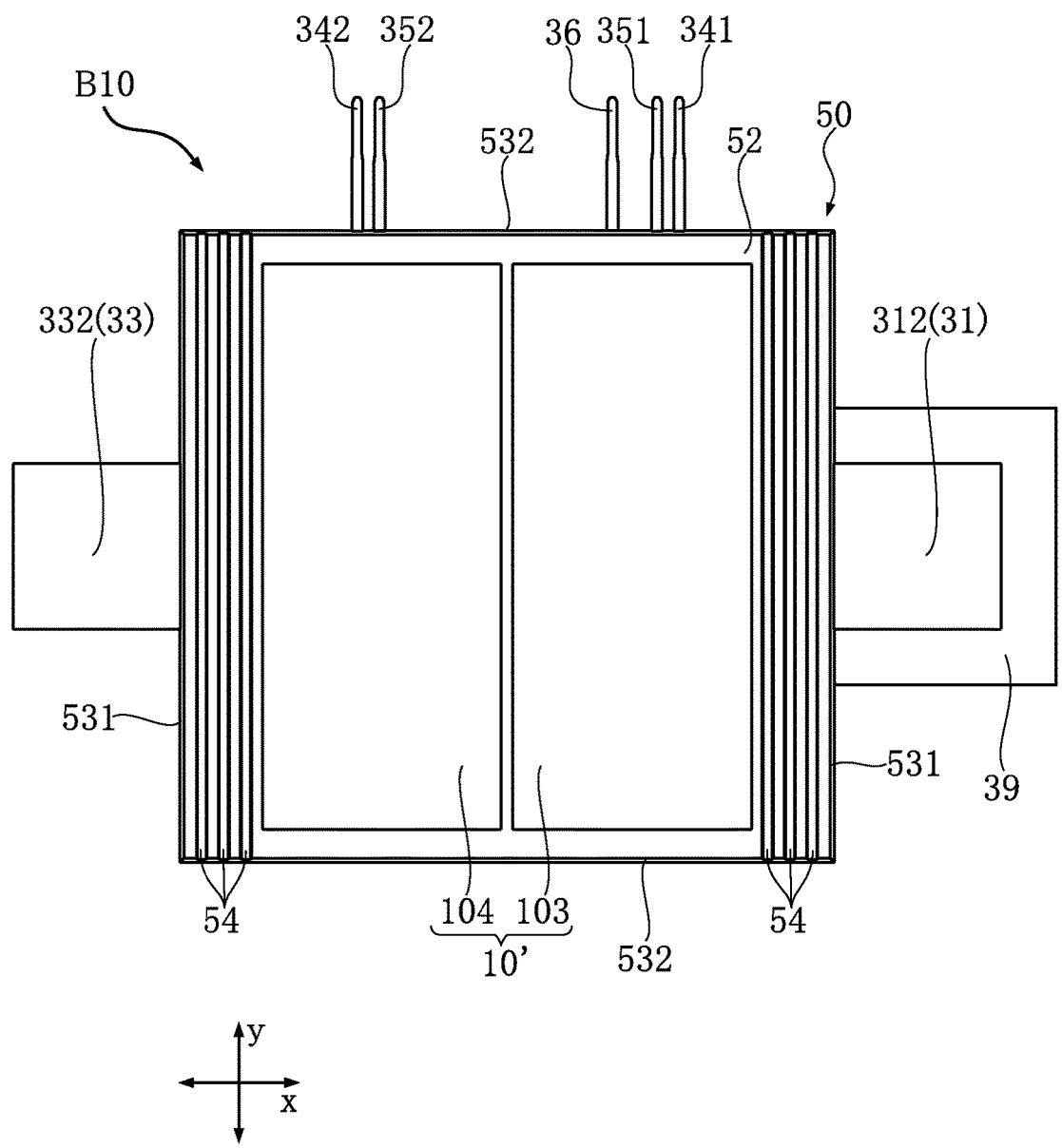
FIG. 33 is a bottom view illustrating a semiconductor device according to a first embodiment of a second aspect.

As shown in FIGS. 33 and 35, the first supply terminal 31 is an electrically conductive member that is made of metal, is plate-shaped, and is electrically bonded to the first conductive plate 11. The first supply terminal 31 serves as a positive electrode (P terminal) of the semiconductor device B10. The constituent material of the first supply terminal 31 is, for example, Cu. The surface of the first supply terminal 31 may also be plated with Ni (nickel). The first supply terminal 31 has a thickness set to 0.5 to 1.5 mm. The first supply terminal 31 has the comb tooth-shaped portions 311 and the external connection portion 312. The comb tooth-shaped portions 311 are adjacent to the first substrate 13 in the first direction x, and overlap with the first conductive plate 11 as viewed in a plan view. The comb tooth-shaped portions 311 are electrically bonded to the first main surface 11a of the first conductive plate 11. The method of joining the comb tooth-shaped portions 311 to the first main surface 11a may be solder joining or ultrasonic joining. The external connection portion 312 is band-shaped and extends, from the comb tooth-shaped portions 311, to a side away from the second conductive plate 12 in the first direction x. The external connection portion 312 is partially exposed to the outside from the semiconductor device B10.

As shown in FIG. 34, the second supply terminal 32 is an electrically conductive member that is made of metal, is plate-shaped, and has a region that overlaps with the first supply terminal 31 as viewed in a plan view. The second supply terminal 32 is spaced apart from all of the first conductive plate 11, the second conductive plate 12, and the first supply terminal 31 in the thickness direction z. Accordingly, the second supply terminal 32 is electrically insulated from all of the first conductive plate 11, the second conductive plate 12, and the first supply terminal 31. The second supply terminal 32 is electrically connected to the plurality of second switching elements 22. The second supply terminal 32 serves as a negative electrode (N terminal) of the semiconductor device B10. The constituent material and the thickness of the second supply terminal 32 are the same as the constituent material and the thickness of the first supply terminal 31. The surface of the second supply terminal 32 may also be plated with Ni. The second supply terminal 32 has the first band-shaped portion 321, the plurality of second band-shaped portions 322, and the external connection portion 323.

Figure 38:
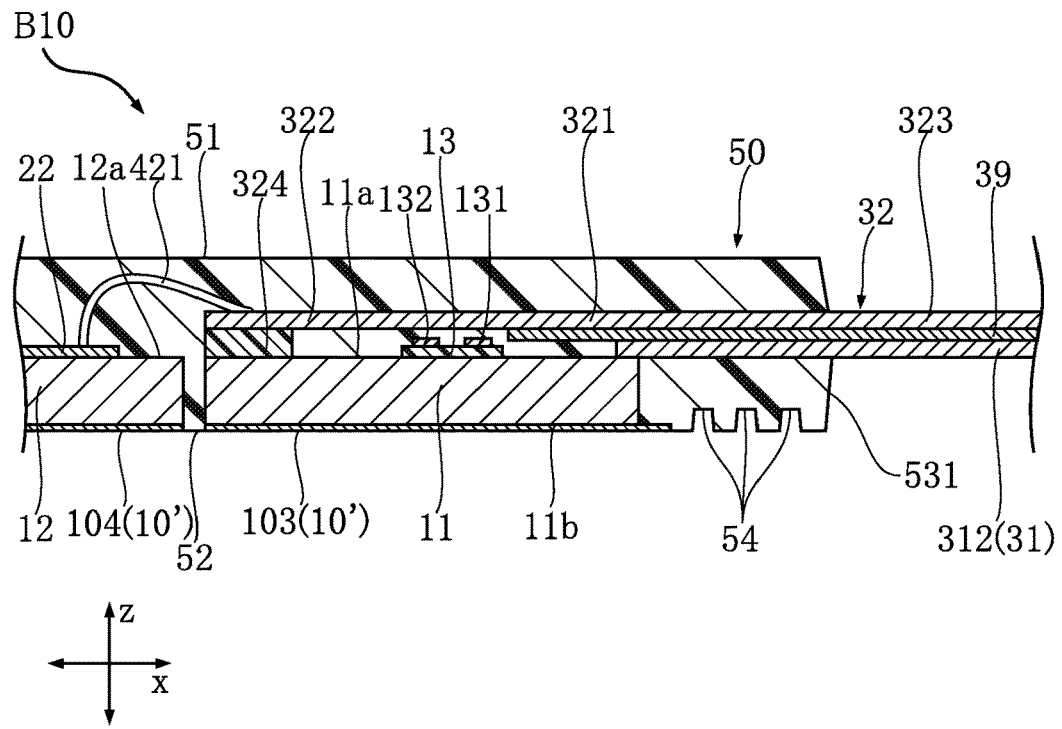
FIG. 38 is a cross-sectional view taken along a line XXXVIII, XXXIX-XXXVIII, XXXIX in FIG. 34, illustrating the vicinity of a first conductive plate.

As shown in FIGS. 38 to 40, the insulator 324 is interposed between the leading end of the second band-shaped portion 322 (of the second supply terminal 32), and the first main surface 11a of the first conductive plate 11. The insulator 324 is an electrically-insulating adhesive. The constituent material of the insulator 324 is, for example, an epoxy resin or polyimide. The second band-shaped portions 322 are bonded to the first main surface 11a via the insulators 324. Due to the insulators 324, the second supply terminal 32 is bonded to the first conductive plate 11, and electric insulation between the first conductive plate 11 and the second supply terminal 32 is ensured.

As shown in FIGS. 33, 34, and 38, the terminal insulating member 39 is plate shaped, and is interposed between the first supply terminal 31 and the second supply terminal 32 in the thickness direction z. The terminal insulating member 39 has electrical insulating properties. The constituent material of the terminal insulating member 39 is a ceramic such as $Al_2O_3$, for example. The terminal insulating member 39 has a thickness set to 0.1 to 1.0 mm. In the semiconductor device B10, the terminal insulating member 39 is in contact with both the first supply terminal 31 and the second supply terminal 32.

As shown in FIG. 34, part of every second band-shaped portion 322 of the second supply terminal 32 is located between two adjacent first switching elements 21. Accordingly, in the semiconductor device B10, a second band-shaped portion 322 extends between two adjacent first switching elements 21 toward the second conductive plate 12. Furthermore, each of the second switching elements 22 faces the corresponding single second band-shaped portion 322 in the first direction x.

As shown in FIGS. 33 to 35, the output terminal 33 is an electrically conductive member that is made of metal, is plate-shaped, and is electrically bonded to the second conductive plate 12. Electric power input to the semiconductor device B10 from the first supply terminal 31 and the second supply terminal 32 is converted by the plurality of first switching elements 21 and the plurality of second switching elements 22, and the converted power is output to the output terminal 33. The constituent material and the thickness of the output terminal 33 are the same as the constituent material and the thickness of the first supply terminal 31. The surface of the output terminal 33 may also be plated with Ni. The output terminal 33 has the comb tooth-shaped portions 331 and the external connection portion 332. The comb tooth-shaped portions 331 are adjacent to the second substrate 14 in the first direction x, and overlap with the second conductive plate 12 as viewed in a plan view. The comb tooth-shaped portions 331 are electrically bonded to the second main surface 12a of the second conductive plate 12. The method of joining the comb tooth-shaped portions 331 to the second main surface 12a may be solder joining or ultrasonic joining. The external connection portion 332 is band-shaped and extends, from the comb tooth-shaped portions 331, to a side away from the first conductive plate 11 in the first direction x. Therefore, the external connection portion 332 extends toward the side opposite to the side to which the external connection portion 312 of the first supply terminal 31 and the external connection portion 323 of the second supply terminal 32 extend. The external connection portion 332 is partially exposed to the outside from the semiconductor device B10.

As shown in FIG. 35, the semiconductor device B10 is provided with the first gate terminal 341. The first gate terminal 341 is electrically conductive, and is arranged opposing, in the second direction y, the first gate layer 131 while extending to a side away from the first gate layer 131. As shown in FIGS. 2 and 33, the first gate terminal 341 is partially exposed to the outside of the semiconductor device B10. The constituent material of the first gate terminal 341 is, for example, Cu. The surface of the first gate terminal 341 is plated with Sn.

As shown in FIG. 35, the first terminal wire 451 is provided. The first terminal wire 451 is electrically conductive, and connects the first gate terminal 341 and the first gate layer 131. The constituent material of the first terminal wire 451 is, for example, Al (aluminum). The first gate terminal 341 is electrically connected to the first gate layer 131 via the first terminal wire 451.

Figure 41:
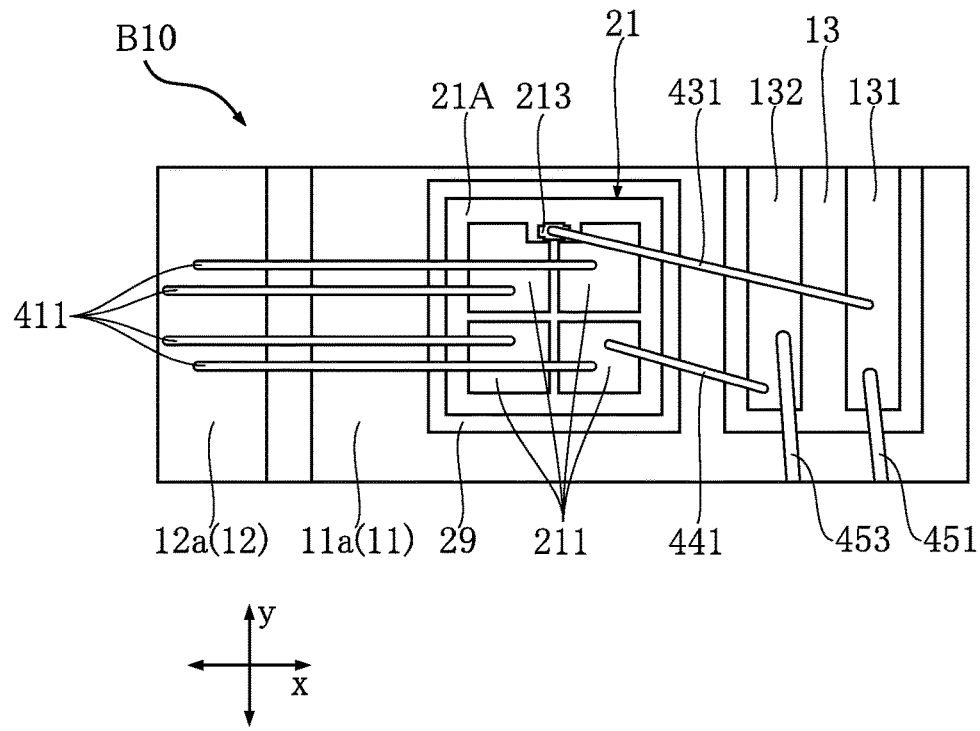
FIG. 41 is a plan view illustrating a first switching element shown in FIG. 34.

As shown in FIGS. 35 and 41, the semiconductor device B10 is provided with the first gate wires 431. The first gate wires 431 are electrically conductive, and connect the gate electrodes 213 of the first switching elements 21 and the first gate layer 131. The constituent material of the first gate wires 431 is Al, for example. The gate electrode 213 is electrically connected to the first gate layer 131 via the first gate wire 431. Accordingly, the first gate terminal 341 is electrically connected to the gate electrode 213. The semiconductor device B10 has a configuration in which the plurality of first switching elements 21 are driven upon application of a gate voltage to the first gate terminal 341.

As shown in FIG. 35, the semiconductor device B10 is provided with the second gate terminal 342. The second gate terminal 342 is electrically conductive, and is arranged opposing, in the second direction y, the second gate layer 141 while extending to a side away from the second gate layer 141. As shown in FIG. 33, the second gate terminal 342 is partially exposed to the outside of the semiconductor device B10. The constituent material of the second gate terminal 342 is the same as the constituent material of the first gate terminal 341. The surface of the second gate terminal 342 is plated with Sn.

As shown in FIG. 35, the semiconductor device B10 is provided with the second terminal wire 452. The second terminal wire 452 is electrically conductive, and connects the second gate terminal 342 and the second gate layer 141. The constituent material of the second terminal wire 452 is the same as the constituent material of the first terminal wire 451. The second gate terminal 342 is electrically connected to the second gate layer 141 via the second terminal wire 452.

As shown in FIGS. 35 and 42, the semiconductor device B10 is provided with the second gate wires 432. The second gate wires 432 are electrically conductive, and connect the gate electrodes 223 of the second switching elements 22 and the second gate layer 141. The constituent material of the second gate wires 432 is the same as the constituent material of the first gate wires 431. The gate electrodes 223 are electrically connected to the second gate layer 141 via the second gate wires 432. Accordingly, the second gate terminal 342 is electrically connected to the gate electrodes 223. In the semiconductor device B10, the plurality of second switching elements 22 are driven upon application of a gate voltage to the second gate terminal 342.

As shown in FIG. 35, the semiconductor device B10 is provided with the first detection terminal 351. The first detection terminal 351 is electrically conductive, and is arranged opposing, in the second direction y, the first detection layer 132 while extending to a side away from the first detection layer 132. As shown in FIGS. 2 and 33, the first detection terminal 351 is partially exposed to the outside of the semiconductor device B10. The first detection terminal 351 is spaced apart from the first gate terminal 341 in the first direction x. The constituent material of the first detection terminal 351 is the same as the constituent material of the first gate terminal 341. The surface of the first detection terminal 351 is plated with Sn.

As shown in FIG. 35, the semiconductor device B10 is provided with the third terminal wire 453. The third terminal wire 453 is electrically conductive, and connects the first detection terminal 351 and the first detection layer 132. The constituent material of the third terminal wire 453 is the same as the constituent material of the first terminal wire 451. The first detection terminal 351 is electrically connected to the first detection layer 132 via the third terminal wire 453.

As shown in FIGS. 35 and 41, the semiconductor device B10 is provided with the first detection wires 441. The first detection wires 441 are electrically conductive, and connect the main surface electrodes 211 of the first switching elements 21 and the first detection layer 132. The constituent material of the first detection wires 441 is, for example, Al. Each first detection wire 441 is connected to one of the regions of the corresponding main surface electrode 211. The main surface electrodes 211 are electrically connected to the first detection layer 132 via the first detection wires 441. Accordingly, the first detection terminal 351 is electrically connected to the main surface electrodes 211. In the semiconductor device B10, a source current (or emitter current) that is input to the plurality of first switching elements 21 is detected by the first detection terminal 351.

As shown in FIG. 35, the semiconductor device B10 is provided with the second detection terminal 352. The second detection terminal 352 is electrically conductive, and is arranged opposing, in the second direction y, the second detection layer 142 while extending to a side away from the second detection layer 142. As shown in FIGS. 2 and 33, the second detection terminal 352 is partially exposed to the outside of the semiconductor device B10. The second detection terminal 352 is spaced apart from the second gate terminal 342 in the first direction x. The constituent material of the second detection terminal 352 is the same as the constituent material of the first gate terminal 341. The surface of the second detection terminal 352 is plated with Sn.

As shown in FIG. 35, the semiconductor device B10 is provided with the fourth terminal wire 454. The fourth terminal wire 454 is electrically conductive, and connects the second detection terminal 352 and the second detection layer 142. The constituent material of the fourth terminal wire 454 is the same as the constituent material of the first terminal wire 451. The second detection terminal 352 is electrically connected to the second detection layer 142 via the fourth terminal wire 454.

As shown in FIGS. 35 and 42, the semiconductor device B10 is provided with the second detection wires 442. The second detection wires 442 are electrically conductive, and connect the main surface electrodes 221 of the second switching elements 22 and the second detection layer 142. The constituent material of the second detection wires 442 is the same as the constituent material of the first detection wires 441. Each second detection wire 442 is connected to one of the regions of the corresponding main surface electrode 221. The main surface electrodes 221 are electrically connected to the second detection layer 142 via the second detection wires 442. Accordingly, the second detection terminal 352 is electrically connected to the main surface electrodes 221. In the semiconductor device B10, a source current (or a drain current) that is input to the plurality of second switching elements 22 is detected by the second detection terminal 352.

As shown in FIG. 35, the semiconductor device B10 is provided with the device current detection terminal 36. The device current detection terminal 36 is electrically conductive, and is arranged between the first detection terminal 351 and the second detection terminal 352 in the first direction x, and is arranged opposing the first conductive plate 11 in the second direction y. The device current detection terminal 36 extends to a side away from the first conductive plate 11 in the second direction y. As shown in FIG. 33, the device current detection terminal 36 is partially exposed to the outside of the semiconductor device B10. The constituent material of the device current detection terminal 36 is the same as the constituent material of the first gate terminal 341. The surface of the device current detection terminal 36 is plated with Sn.

As shown in FIG. 35, the semiconductor device B10 is provided with the fifth terminal wire 455. The fifth terminal wire 455 is electrically conductive, and connects the device current detection terminal 36 and the first main surface 11a of the first conductive plate 11. The constituent material of the fifth terminal wire 455 is the same as the constituent material of the first terminal wire 451. The device current detection terminal 36 is electrically connected to the first conductive plate 11 via the fifth terminal wire 455. In the semiconductor device B10, a current that flows through the first conductive plate 11 is detected by the device current detection terminal 36.

As shown in FIGS. 34 to 37, the first conductive wires 411 are electrically conductive members that connect the main surface electrodes 211 of the first switching elements 21 and the second main surface 12a of the second conductive plate 12. The first conductive wires 411 are thin metal wires that extend in the first direction x. The first conductive wires 411 are connected to the respective regions of the main surface electrodes 211. In the semiconductor device B10, the plurality of first switching elements 21 are electrically connected to the second conductive plate 12 via the first conductive wires 411. The constituent material of the first conductive wires 411 is, for example, Al.

As shown in FIG. 34, the second conductive wires 421 are electrically conductive members that connect the second band-shaped portions 322 of the second supply terminal 32 and the main surface electrodes 221 of the second switching elements 22. The second conductive wires 421 are thin metal wires that extend in the first direction x. The second conductive wires 421 are connected to the respective regions of the main surface electrodes 221. In the semiconductor device B10, the second band-shaped portions 322 are electrically connected to the main surface electrodes 221 via the second conductive wires 421. The constituent material of the second conductive wires 421 is the same as the constituent material of the first conductive wires 411.

As shown in FIGS. 38 and 39, the insulating layer 10' includes two separate regions (a first region 103 and a second region 104), which are respectively bonded to the first back surface 11b of the first conductive plate 11 and the second back surface 12b of the second conductive plate 12. The first region 103 and the second region 104 are spaced apart from each other in the first direction x. The insulating layer 10' (that is, the first region 103 and the second region 104) has electrical insulating properties and relatively high heat conductivity. The constituent material of the insulating layer 10' is, for example, a ceramic such as $Al_2O_3$ or AlN (aluminum nitride), or a heat dissipation sheet whose main component is a synthetic resin. The thickness of the insulating layer 10' is smaller than the thicknesses of the first conductive plate 11 and the second conductive plate 12, and is set to 0.1 to 1.0 mm. Due to the insulating layer 10', the first conductive plate 11 and the second conductive plate 12 are electrically insulated from the outside of the semiconductor device B10. The insulating layer 10' may be omitted. In this case, a configuration is such that both the first back surface 11b and the second back surface 12b are covered with the sealing resin 50.

As shown in FIGS. 33 to 40, the sealing resin 50 covers the first conductive plate 11, the second conductive plate 12, the plurality of first switching elements 21, and the plurality of second switching elements 22. The sealing resin 50 has electrical insulating properties. The constituent material of the sealing resin 50 is, for example, a black epoxy resin. The sealing resin 50 has the front surface 51, the back surface 52, the pair of first side surfaces 531, and the pair of second side surfaces 532.

As shown in FIGS. 36 to 40, the front surface 51 is oriented in the same direction as that of the first main surface 11a of the first conductive plate 11 and the second main surface 12a of the second conductive plate 12. The back surface 52 is oriented in the same direction as that of the first back surface 11b of the first conductive plate 11 and the second back surface 12b of the second conductive plate 12. The insulating layer 10' (the first region 103 and the second region 104) is exposed from the back surface 52. A heat dissipation member may also be bonded to the exposed surface of the insulating layer 10'.

Figure 4:
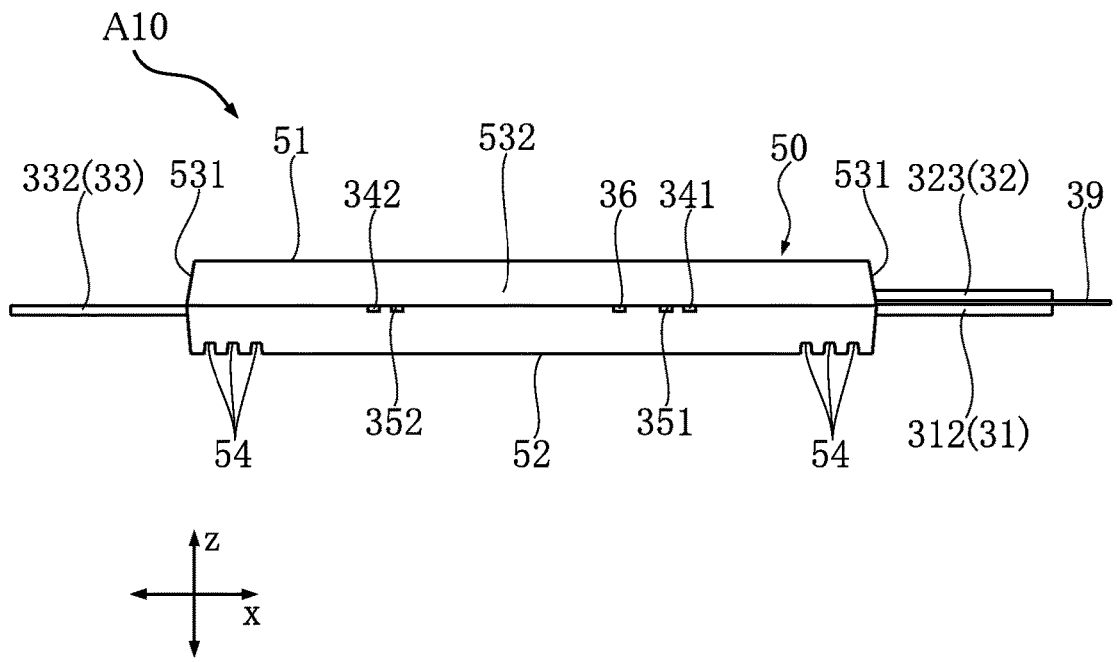
FIG. 4 is a front view of the semiconductor device.
Figure 5:
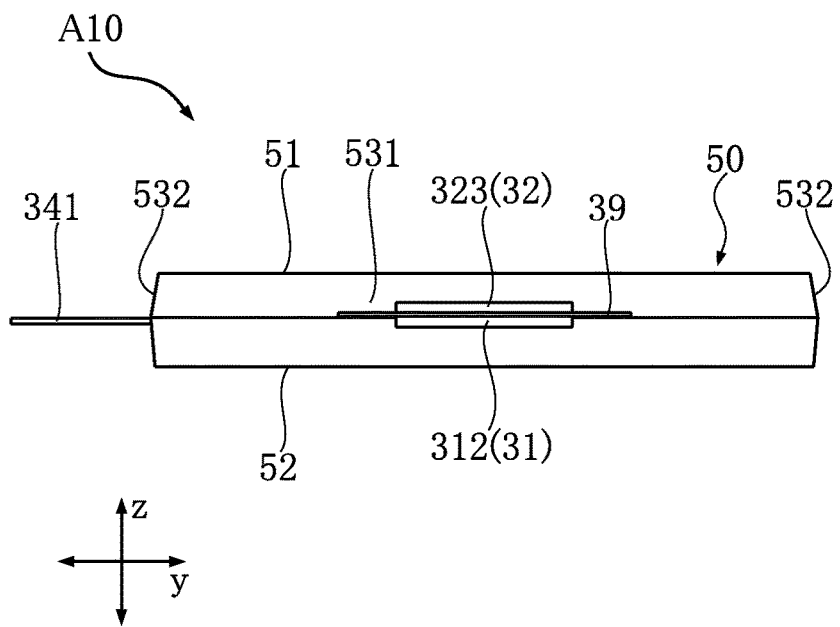
FIG. 5 is a side view of the semiconductor device.

Each of the pair of first side surfaces 531 is connected to both the front surface 51 and the back surface 52, and are spaced apart from each other in the first direction x (see FIG. 4). The external connection portion 312 of the first supply terminal 31, the external connection portion 323 of the second supply terminal 32, and the terminal insulating member 39 are partially exposed from one of the first side surfaces 531. The external connection portion 332 of the output terminal 33 is partially exposed from the other one of the first side surfaces 531. Each of the pair of second side surfaces 532 is connected to both the front surface 51 and the back surface 52, and are spaced apart from each other in the second direction y (see FIG. 5). Both ends, in the first direction x, of each second side surface 532 are connected to the pair of first side surfaces 531. The first gate terminal 341, the second gate terminal 342, the first detection terminal 351, the second detection terminal 352, and the device current detection terminal 36 are partially exposed from one of the second side surfaces 532 (see FIG. 33).

As shown in e.g. FIG. 33, the sealing resin 50 is provided with, on its back surface 52, a plurality of grooves 54 that extend in the second direction y. The plurality of grooves 54 are located at both ends, in the first direction x, of the back surface 52. The plurality of grooves 54 each extend from one of the second side surfaces 532 to the other one of the second side surfaces 532.

The circuit configuration of the semiconductor device B10 is identical to that shown in FIG. 14, and the way in which operation of the switching elements and the like that constitute this circuit operate is also the same as the content described with reference to FIG. 14. Furthermore, an example of usage of the semiconductor device B10 is the same as that described with reference to FIG. 15.

The following will describe the functions and effects of the semiconductor device B10. According to the configuration of the semiconductor device B10, the first conductive plate 11 and the second conductive plate 12 function as heat dissipation members and electrically conductive members in the semiconductor device B10. The thicknesses of the first conductive plate 11 and the second conductive plate 12 are larger than the thickness of a conductive layer made of, for example, a metal foil. Accordingly, in the first direction x and the second direction y, which are perpendicular to the thickness direction z, the cross-sectional areas of the first conductive plate 11 and the second conductive plate 12 are larger than the cross-sectional area of a conductive layer made of a metal foil. Accordingly, in the first direction x and the second direction y, the thermal resistances per unit length of the first conductive plate 11 and the second conductive plate 12 are lower than the thermal resistance per unit length of a conductive layer made of a metal foil. In other words, in the first direction x and the second direction y, heat is more likely to be transferred over a wide range through the first conductive plate 11 and the second conductive plate 12 than a conductive layer made of a metal foil. Therefore, with the semiconductor device B10, it is possible to improve the heat dissipation.

With the improvement in the heat dissipation of the semiconductor device B10, it is possible to reduce the electric resistance of the first conductive plate 11 and the second conductive plate 12. Therefore, with the semiconductor device B10, it is possible to suppress power loss.

Furthermore, the second supply terminal 32 has a region that overlaps with the first supply terminal 31 as viewed in a plan view. According to this configuration, noise generated from the second supply terminal 32 interferes with noise generated from the first supply terminal 31, and thus the self-inductance of the first supply terminal 31 is reduced. Similarly, noise generated from the first supply terminal 31 interferes with noise generated from the second supply terminal 32, and thus the self-inductance of the second supply terminal 32 is reduced. In this way, with the reduction in the self-inductance of the first supply terminal 31 and the second supply terminal 32, it is possible to further reduce power loss of the semiconductor device B10. Furthermore, it is also possible to reduce a surge voltage that is applied to the plurality of first switching elements 21 and the plurality of second switching elements 22. Note that similar technical effects can also be achieved by the semiconductor devices according to the first aspect.

The semiconductor device B10 is provided with the terminal insulating member 39, which has electrical insulating properties and is interposed between the first supply terminal 31 and the second supply terminal 32. With this, it is possible to further reduce the distance, in the thickness direction z, between the first supply terminal 31 and the second supply terminal 32, while ensuring electric insulation between the first supply terminal 31 and the second supply terminal 32. Accordingly, it is possible to further reduce the self-inductance of the first supply terminal 31 and the second supply terminal 32.

The first band-shaped portion 321 and the plurality of second band-shaped portions 322 of the second supply terminal 32 overlap with the first conductive plate 11 as viewed in a plan view. Also, the second band-shaped portions 322 are electrically connected to the main surface electrodes 221 of the second switching elements 22 via the second conductive wires 421, which extend in the first direction x. Accordingly, it is possible to suppress an increase in size of the semiconductor device B10 as viewed in a plan view.

The plurality of first switching elements 21 are lined up in the second direction y, and part of every second band-shaped portion 322 is located between two adjacent first switching elements 21. Accordingly, it is possible to suppress an increase in size, in the second direction y, of the semiconductor device B10. In this case, the plurality of second switching elements 22 are lined up in the second direction y, and each of the second switching elements 22 faces the corresponding single second band-shaped portion 322 in the first direction x. Accordingly, it is possible to shorten the electrical connection paths from the plurality of second switching elements 22 to the second supply terminal 32, while further suppressing an increase in size, in the second direction y, of the semiconductor device B10.

The semiconductor device B10 is provided with the second conductive wires 421, which are connected to the second band-shaped portions 322 of the second supply terminal 32 and the main surface electrodes 221 of the second switching elements 22, and extend in the first direction x. Accordingly, the conductive paths between the plurality of second switching elements 22 and the second supply terminal 32 extend in the first direction x. The semiconductor device B10 is also provided with the first conductive wires 411, which are connected to the first switching elements 21 and the second main surface 12a of the second conductive plate 12, and extend in the first direction x. Accordingly, the conductive paths between the plurality of first switching elements 21 and the second conductive plate 12 extend in the first direction x. Therefore, since the conductive paths extending in the first direction x are formed in the semiconductor device B10, it is possible to improve the dielectric strength voltage of the semiconductor device B10.

The second band-shaped portions 322 of the second supply terminal 32 are bonded to the first main surface 11a of the first conductive plate 11 via the insulators 324, which have electrical insulating properties. Accordingly, the second supply terminal 32 can be supported on the first conductive plate 11. Furthermore, when the second conductive wires 421 are bonded to the second band-shaped portions 322 using wire bonding, the second band-shaped portions 322 are subjected to a reactive force exerted from the first conductive plate 11, thus making it possible to sufficiently ensure the joining strength between the second conductive wires 421 and the second band-shaped portions 322.

The first substrate 13, which has electrical insulating properties, is bonded to the first main surface 11a of the first conductive plate 11. The first substrate 13 is provided with the first gate layer 131, which is electrically connected to both the gate electrodes 213 of the first switching elements 21 and the first gate terminal 341. Furthermore, the first gate terminal 341, which is electrically connected to the first gate layer 131, is spaced apart from the first conductive plate 11 (see e.g. FIG. 34). Accordingly, in the semiconductor device B10, a conductive path for driving the plurality of first switching elements 21 can be configured with the first gate layer 131 electrically insulated from the first conductive plate 11.

The second substrate 14, which has electrical insulating properties, is bonded to the second main surface 12a of the second conductive plate 12. The second substrate 14 is provided with the second gate layer 141, which is electrically connected to both the gate electrodes 223 of the second switching elements 22 and the second gate terminal 342. Furthermore, the second gate terminal 342, which is electrically connected to the second gate layer 141, is spaced apart from the second conductive plate 12. Accordingly, in the semiconductor device B10, a conductive path for driving the plurality of second switching elements 22 can be configured with the second gate layer 141 electrically insulated from the second conductive plate 12.

The semiconductor device B10 is provided with the sealing resin 50, which covers the first conductive plate 11, the second conductive plate 12, and the like. The first supply terminal 31 and the second supply terminal 32 have portions that extend to a side away from the second conductive plate 12 in the first direction x, and are exposed from the sealing resin 50. Furthermore, the semiconductor device B10 is provided with the output terminal 33, which is electrically bonded to the second conductive plate 12. The output terminal 33 has a portion that extends to a side away from the first conductive plate 11 in the first direction x, and is exposed from the sealing resin 50. Accordingly, the first supply terminal 31 and the second supply terminal 32 are spaced apart from the output terminal 33 in the first direction x, which is the same direction as that of the conductive path of the semiconductor device B10. This can further improve the dielectric strength voltage of the semiconductor device B10.

The semiconductor device B10 is provided with the insulating layer 10', which is bonded to the first back surface 11b of the first conductive plate 11 and the second back surface 12b of the second conductive plate 12. The insulating layer 10' is exposed from the back surface 52 of the sealing resin 50. Accordingly, the first conductive plate 11 and the second conductive plate 12 are electrically insulated from the outside of the semiconductor device B10. By making the thickness of the insulating layer 10' as small as possible, it is possible to reduce the thickness of the semiconductor device B10.

The insulating layer 10' includes the first region 103 bonded to the first conductive plate 11, and the second region 104 bonded to the second conductive plate 12, and the first region 103 and the second region 104 are spaced apart from each other in the first direction x. Accordingly, when manufacturing the semiconductor device B10, it is possible to suppress warpage that may occur in the insulating layer 10', and avoid excessive bending distortion of the first conductive plate 11 and the second conductive plate 12.

The sealing resin 50 is provided with the plurality of grooves 54, which are recessed from the back surface 52 in the thickness direction z and extend in the second direction y. The plurality of grooves 54 are located at both ends, in the first direction x, of the back surface 52. With this, the surface, in the first direction x, of the back surface 52 including the plurality of grooves 54 is further extended, and thus it is possible to further improve the dielectric strength voltage of the semiconductor device B10.

Figure 43:
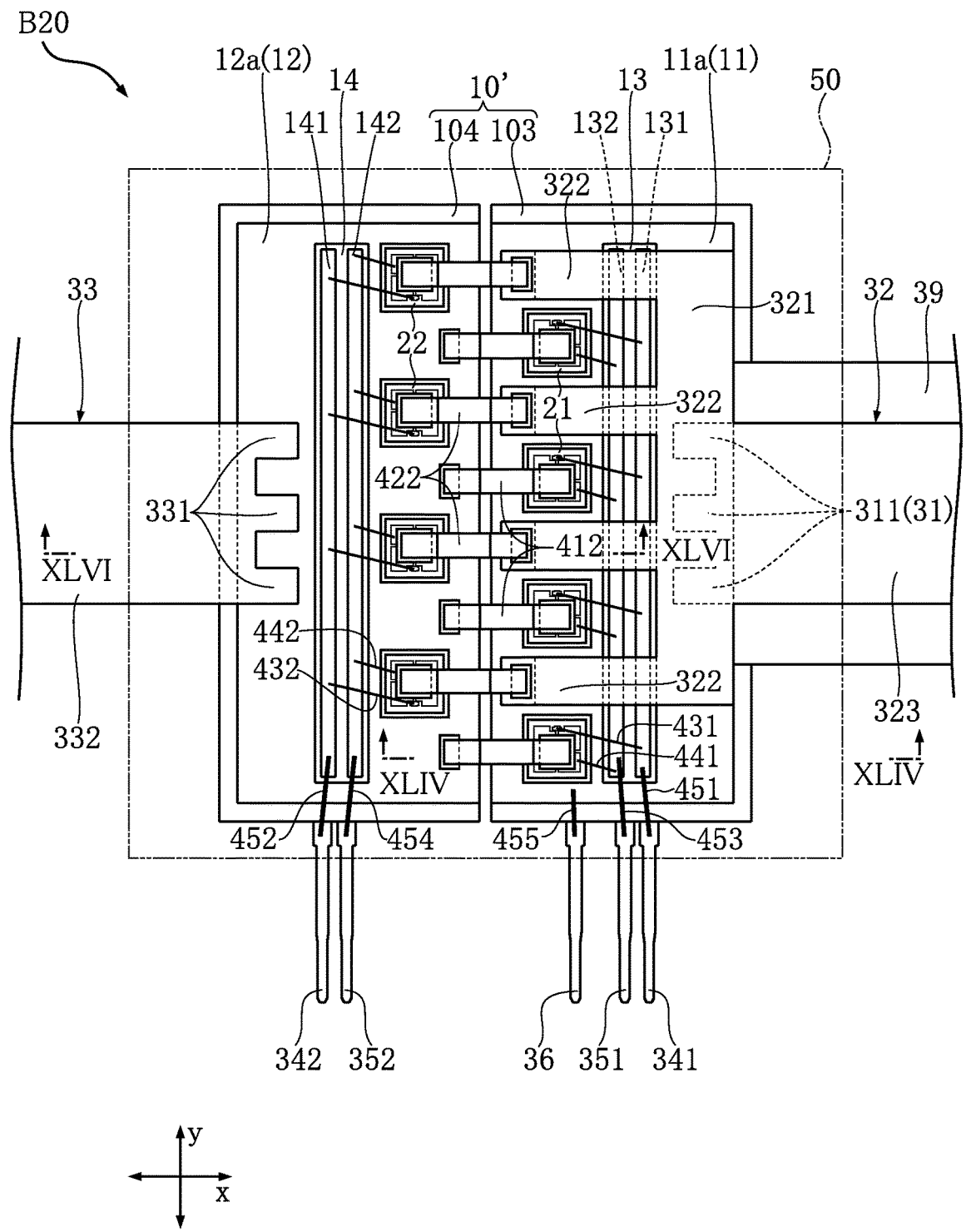
FIG. 43 is a plan view illustrating a semiconductor device according to a second embodiment of the second aspect, with a sealing resin being transparent.

A semiconductor device B20 according to a second embodiment of the second aspect will be described with reference to FIGS. 43 to 47. In FIG. 43 out of these figures, the sealing resin 50 is indicated by a virtual line.

In the semiconductor device B20, the first electrical connection leads 412 are used in place of the first conductive wires 411, and the second electrical connection leads 422 are used in place of the second conductive wires 421.

Figure 44:
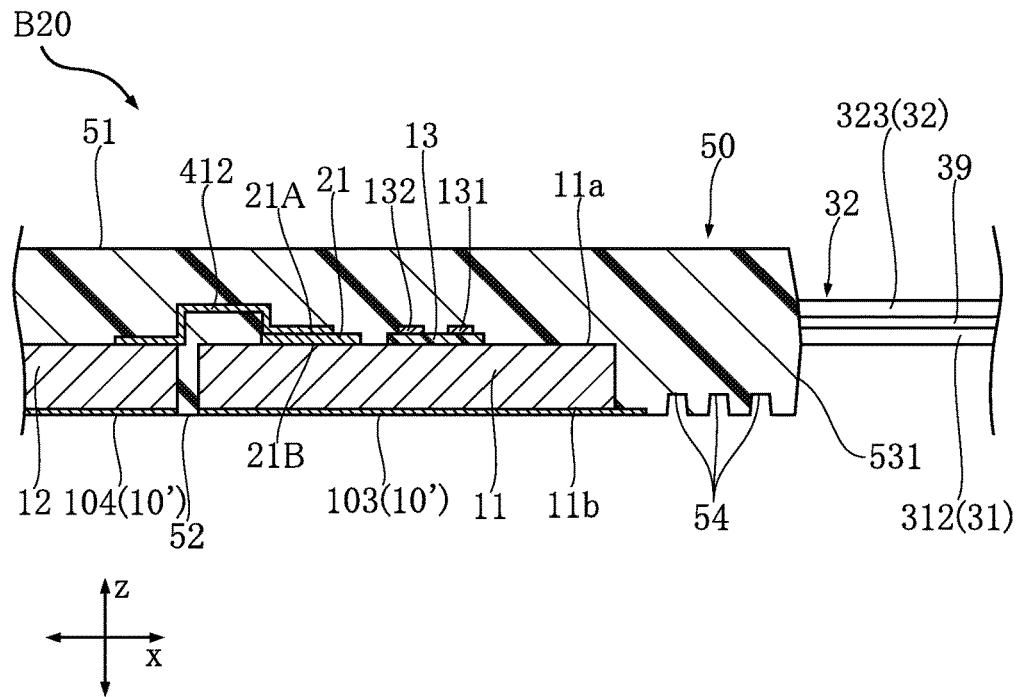
FIG. 44 is a cross-sectional view taken along a line XLIV-XLIV in FIG. 43.
Figure 45:
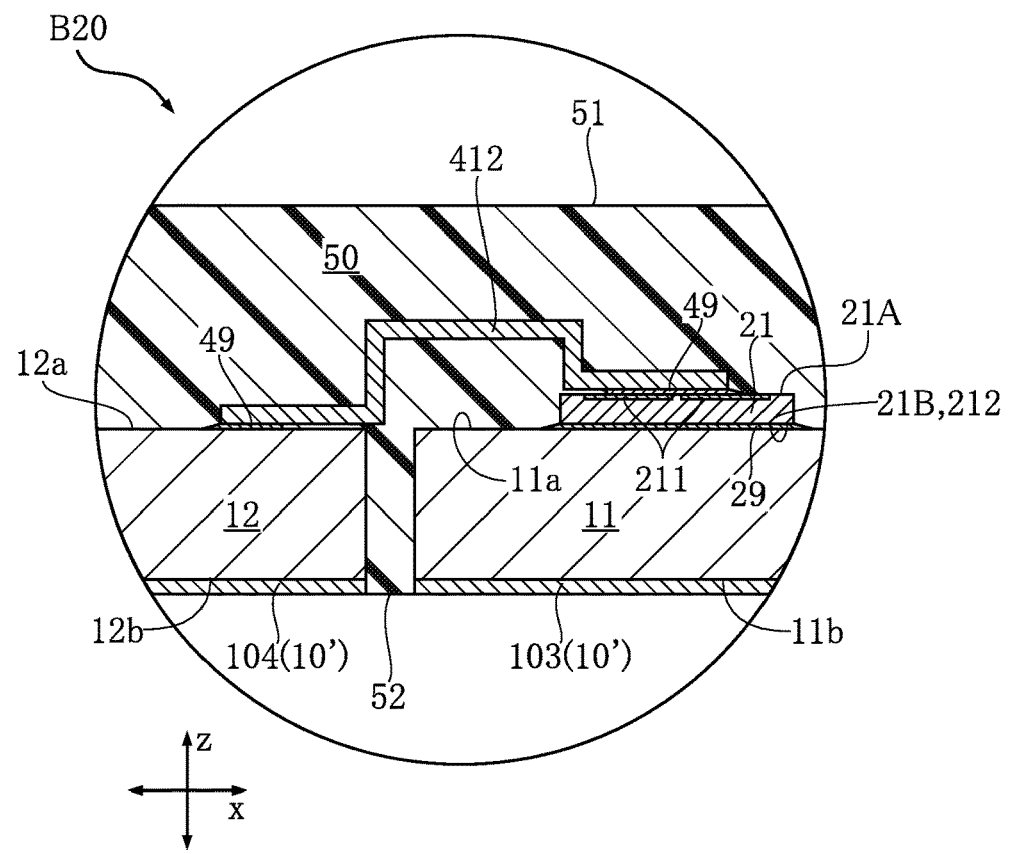
FIG. 45 is an enlarged view of a portion shown in FIG. 44.

As shown in FIGS. 43 to 45, the first electrical connection leads 412 are electrically conductive members that connect the main surface electrodes 211 of the first switching elements 21 and the second main surface 12a of the second conductive plate 12. The first electrical connection leads 412 are metal plates that are band-shaped and extend in the first direction x, and are bent into a hook shape in the thickness direction z. The constituent material of the first electrical connection leads 412 is Cu or a Cu alloy. One end of each first electrical connection lead 412 is electrically bonded to a main surface electrode 211 via a conductive joint layer 49. The other end of the first electrical connection lead 412 is electrically bonded to the second main surface 12a via a conductive joint layer 49. The conductive joint layers 49 are electrically conductive, and are lead-free solder whose main component is Sn (tin), for example.

Figure 46:
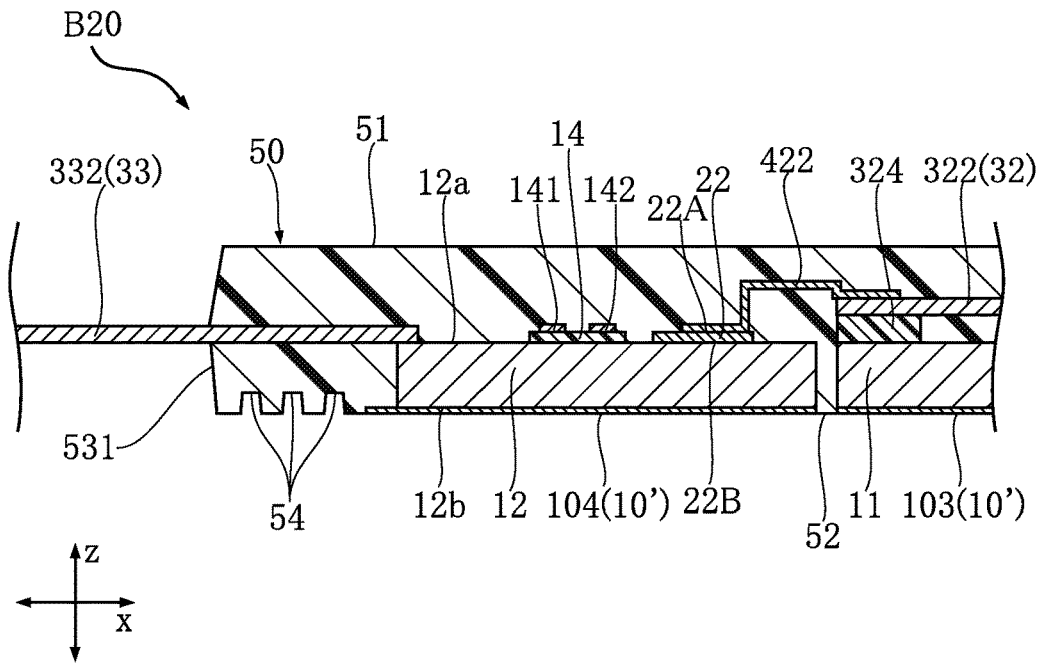
FIG. 46 is a cross-sectional view taken along a line XLVI-XLVI in FIG. 43.
Figure 47:
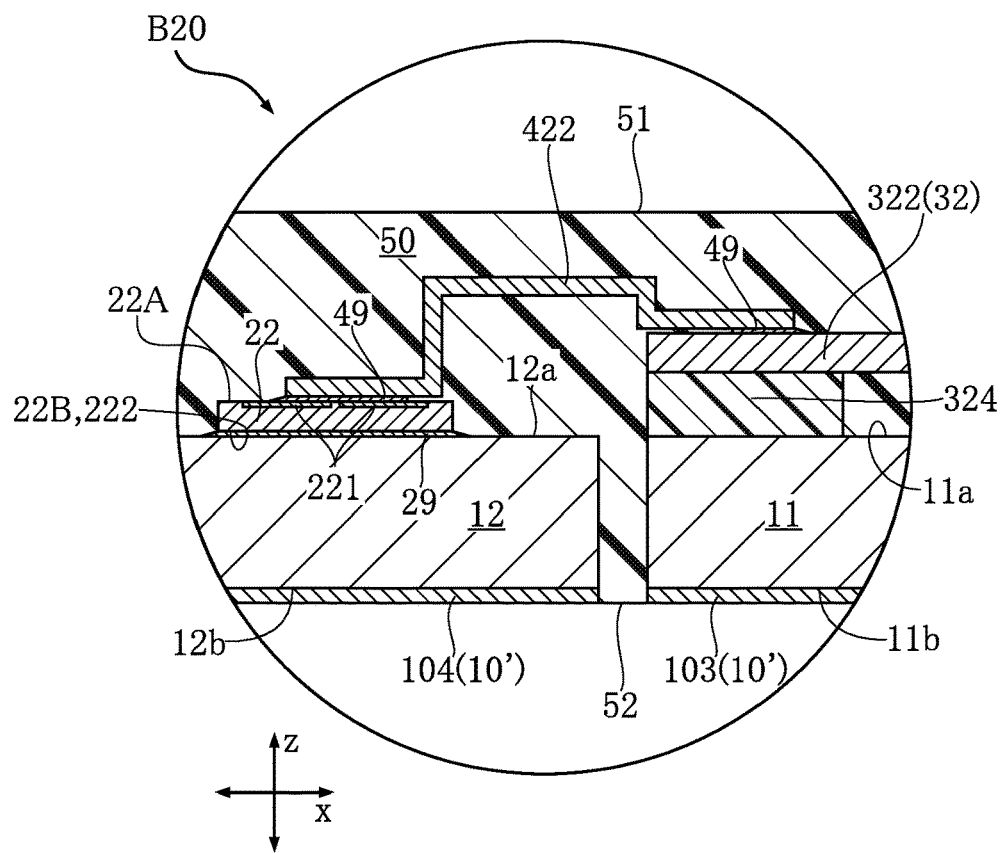
FIG. 47 is an enlarged view of a portion shown in FIG. 46.

As shown in FIGS. 43, 46, and 47, the second electrical connection leads 422 are electrically conductive members that connect the second band-shaped portions 322 of the second supply terminal 32 and the main surface electrodes 221 of the second switching elements 22. The second electrical connection leads 422 are metal plates that are band-shaped and extend in the first direction x, and are bent into a hook shape in the thickness direction z. The constituent material of the second electrical connection leads 422 is the same as the constituent material of the first electrical connection leads 412. One end of each second electrical connection lead 422 is electrically bonded to a second band-shaped portion 322 via a conductive joint layer 49. The other end of the second electrical connection lead 422 is electrically bonded to a main surface electrode 221 via a conductive joint layer 49.

The following will describe the functions and effects of the semiconductor device B20. According to the configuration of the semiconductor device B20, the same first conductive plate 11 and second conductive plate 12 as those of the above-described semiconductor device B10 are provided. Since the first conductive plate 11 and the second conductive plate 12 function as heat dissipation members (and electrically conductive members) in the semiconductor device B20, it is possible to improve the heat dissipation, also with the semiconductor device B20.

The semiconductor device B20 is provided with the first electrical connection leads 412 and the second electrical connection leads 422. The cross-sectional areas of the first electrical connection leads 412 and the second electrical connection leads 422 are larger than the cross-sectional areas of the first conductive wires 411 and the second conductive wires 421. Accordingly, the electric resistance of the first electrical connection leads 412 and the second electrical connection leads 422 is lower than the electric resistance of the first conductive wires 411 and the second conductive wires 421. Accordingly, it is possible to suppress power loss of the semiconductor device B20, compared to that of the semiconductor device B10.

Figure 48:
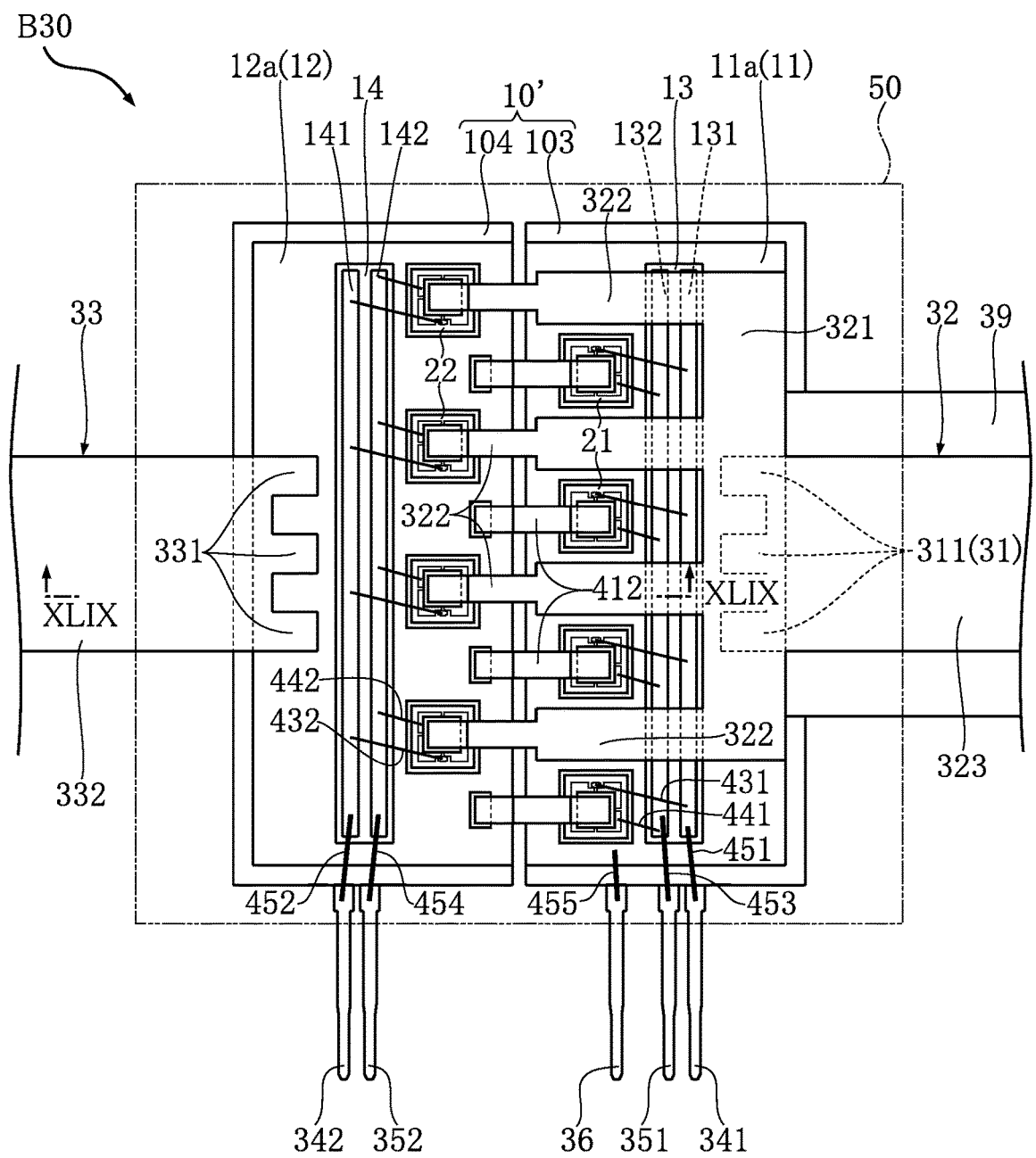
FIG. 48 is a plan view illustrating a semiconductor device according to a third embodiment of the second aspect, with a sealing resin being transparent.
Figure 49:
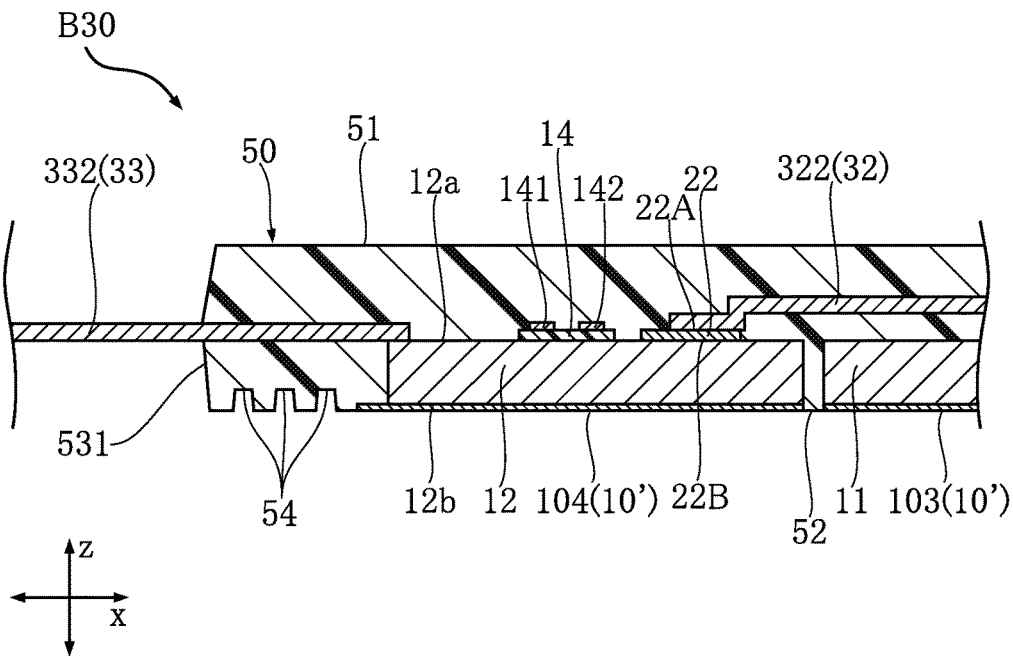
FIG. 49 is a cross-sectional view taken along a line XLIX-XLIX in FIG. 48.
Figure 50:
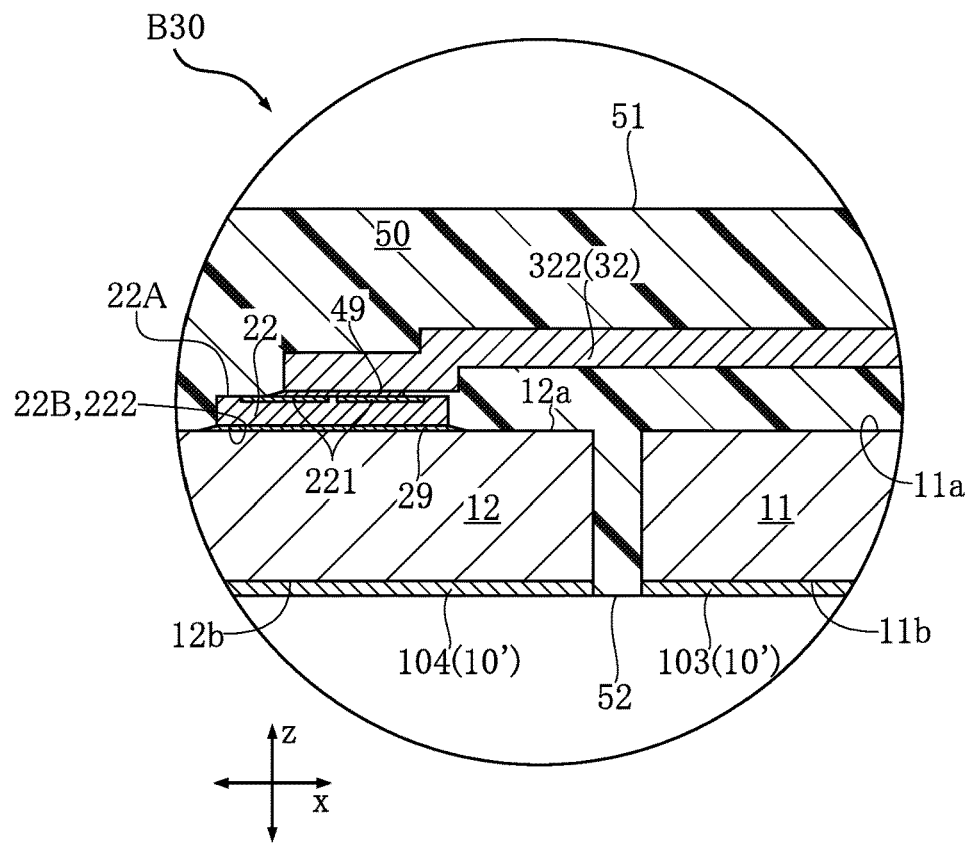
FIG. 50 is an enlarged view of a portion shown in FIG. 49.

A semiconductor device B30 according to a third embodiment of the second aspect will be described with reference to FIGS. 48 to 50. In FIG. 48 out of these figures, the sealing resin 50 is indicated by a virtual line.

The semiconductor device B30 differs from the semiconductor device B10 in that the first electrical connection leads 412 are used in place of the first conductive wires 411, and differs in a configuration of the second band-shaped portions 322 of the second supply terminal 32. The first electrical connection leads 412 have the same configuration as the configuration of the first electrical connection leads 412 of the above-described semiconductor device B20.

As shown in FIG. 48, the leading ends of the second band-shaped portions 322 of the second supply terminal 32 extend to positions at which they overlap with the main surface electrodes 221 of the second switching elements 22, as viewed in a plan view. As shown in FIGS. 49 and 50, the leading ends of the second band-shaped portions 322 are bent into a hook shape in the thickness direction z. The leading ends of the second band-shaped portions 322 are electrically bonded to the main surface electrodes 211 via conductive joint layers 49. Accordingly, the main surface electrodes 221 are electrically connected to the second supply terminal 32 without any of the second conductive wires 421 and the second electrical connection leads 422. In the semiconductor device B30, since the second band-shaped portions 322 are not bonded to the first main surface 11a of the first conductive plate 11, there is no need to provide the insulators 324.

The following will describe the functions and effects of the semiconductor device B30. Also in the semiconductor device B30, the first conductive plate 11 and the second conductive plate 12 function as heat dissipation members (and electrically conductive members), and thus, it is possible to improve the heat dissipation.

The second band-shaped portions 322 of the second supply terminal 32 are connected to the main surface electrodes 221 of the second switching elements 22. Accordingly, in the semiconductor device B30, there is no need to provide any of the second conductive wires 421, the second electrical connection leads 422, and the insulators 324. It is thus possible to reduce the number of components needed to manufacture the semiconductor device B30.

In the embodiments of the second aspect, a plurality of diodes (such as schottky barrier diodes) constituting parallel circuits that correspond to the first switching elements 21 may also be electrically bonded to the first main surface 11a of the first conductive plate 11. Furthermore, a plurality of diodes constituting parallel circuits that correspond to the second switching elements 22 may also be electrically bonded to the second main surface 12a of the second conductive plate 12. By providing the plurality of diodes, it is possible to avoid, when the plurality of first switching elements 21 are driven, the generation of a reverse current from flowing through the first switching elements 21 even if a back electromotive force is generated by the switching. Similarly, it is also possible to avoid, when the plurality of second switching elements 22 are driven, the generation of a reverse current from flowing through the second switching elements 22.

The present invention is not limited to the foregoing embodiments. The specific configurations of the components of the present invention can be designed and modified in various ways.

The invention claimed is:

1. A semiconductor device comprising:
a first conductive plate including a first main surface perpendicular to a thickness direction of the first conductive plate;
a single second conductive plate including a second main surface perpendicular to the thickness direction, the single second conductive plate being spaced apart from the first conductive plate in a first direction perpendicular to the thickness direction;
a plurality of first switching elements, each electrically bonded to the first conductive plate and electrically connected to the single second conductive plate;
a plurality of second switching elements, each electrically bonded to the single second conductive plate;
a first supply terminal electrically bonded to the first conductive plate, the first supply terminal being flat as a whole and comprising a single flat lower surface held in direct contact with the first conductive plate; and
a second supply terminal having a region that overlaps with the first supply terminal as viewed in the thickness direction, the second supply terminal being spaced apart from the first conductive plate and the first supply terminal in the thickness direction,
wherein the second supply terminal is electrically connected to the plurality of second switching elements.

2. The semiconductor device according to claim 1, further comprising:
an insulating member interposed between the first supply terminal and the second supply terminal in the thickness direction; and
a sealing resin that covers the first conductive plate, the second conductive plate, the plurality of first switching elements, and the plurality of second switching elements,
wherein the insulating member comprises a portion protruding to an outside of the sealing resin.

3. The semiconductor device according to claim 2, wherein the first supply terminal and the second supply terminal each have an exposed portion that is exposed from the sealing resin, and the exposed portion extends to a side away from the second conductive plate in the first direction.

4. The semiconductor device according to claim 3, further comprising an output terminal electrically bonded to the second conductive plate,
wherein the output terminal has an exposed portion that is exposed from the sealing resin, and the exposed portion of the output terminal extends to a side away from the first conductive plate in the first direction.

5. The semiconductor device according to claim 3, further comprising an insulating layer, wherein the first conductive plate has a first back surface on a side opposite to the first main surface, the second conductive plate has a second back surface on a side opposite to the second main surface, and the sealing resin has a back surface that is oriented toward the same side, in the thickness direction, as the side toward which the first back surface and the second back surface are oriented, and
the insulating layer is bonded to the first back surface and the second back surface, and is exposed from the back surface of the sealing resin.

6. The semiconductor device according to claim 5, wherein the insulating layer includes a first region bonded to the first back surface, and a second region bonded to the second back surface, and the first region and the second region are spaced apart from each other in the first direction.

7. The semiconductor device according to claim 2, wherein the sealing resin is provided with, on the back surface thereof, a plurality of grooves that extend in the second direction, and the plurality of grooves include a first group of grooves and a second group of grooves, and
the first group and the second group are spaced apart from each other in the first direction.

8. The semiconductor device according to claim 2, wherein said portion of the insulating member protruding to the outside of the sealing resin is greater in area than respective portions of the first supply terminal and the second supply terminal that overlap with said portion of the insulating member.

9. The semiconductor device according to claim 1, wherein the first conductive plate and the second conductive plate are made of a material that contains Cu.

10. The semiconductor device according to claim 1, wherein each of the plurality of second switching elements is provided with a main surface electrode,
the second supply terminal includes a first band-shaped portion and a plurality of second band-shaped portions, the first band-shaped portion extending in a second direction perpendicular to the thickness direction and the first direction, and the plurality of second band-shaped portions extending from the first band-shaped portion toward the second conductive plate and being spaced apart from each other in the second direction, and the plurality of second band-shaped portions are respectively electrically connected to the main surface electrodes of the plurality of second switching elements.

11. The semiconductor device according to claim 10, further comprising a plurality of electrical connection leads that connect the plurality of second band-shaped portions and the plurality of second switching elements to each other,
wherein each of the plurality of electrical connection leads extends in the first direction.

12. The semiconductor device according to claim 10, wherein each of the plurality of second band-shaped portions is bonded to the first main surface of the first conductive plate via insulators.

13. The semiconductor device according to claim 10, wherein each of the plurality of second band-shaped portions is bonded to the main surface electrode of a corresponding one of the plurality of second switching elements.

14. The semiconductor device according to claim 10, wherein the plurality of first switching elements are spaced apart from each other in the second direction, and
one of the plurality of second band-shaped portions is located between two adjacent first switching elements of the plurality of first switching elements.

15. The semiconductor device according to claim 10, wherein the plurality of second switching elements are spaced apart from each other in the second direction, and
the plurality of second switching elements respectively face the plurality of second band-shaped portions in the first direction.

16. The semiconductor device according to claim 1, further comprising: a first substrate; a first gate layer; and a first gate terminal, wherein the first substrate extends in the second direction, has an electrical insulating property, and is bonded to the first main surface of the first conductive plate,
the first gate layer extends in the second direction, is electrically conductive, and is bonded to the first substrate,
the first gate terminal is spaced apart from the first conductive plate, and is electrically connected to the first gate layer, and
the plurality of first switching elements are electrically connected to the first gate layer.

17. The semiconductor device according to claim 16, further comprising:
a second substrate;
a second gate layer; and
a second gate terminal, wherein the second substrate extends in the second direction, has an electrical insulating property, and is bonded to the second main surface of the second conductive plate,
the second gate layer extends in the second direction, is electrically conductive, and is bonded to the second substrate,
the second gate terminal is spaced apart from the second conductive plate, and is electrically connected to the second gate layer, and
the plurality of second switching elements are electrically connected to the second gate layer.

18. The semiconductor device according to claim 1, further comprising an insulating layer including a main surface perpendicular to the thickness direction,
wherein the first conductive plate and the second conductive plate are bonded to the main surface of the insulating layer, and
the first conductive plate and the second conductive plate have a thickness that is larger than a thickness of the insulating layer.

19. The semiconductor device according to claim 18, wherein the thickness of the first conductive plate and the second conductive plate is 1.5 to 10 mm.

20. The semiconductor device according to claim 18, wherein the thickness of the first conductive plate and the second conductive plate is three to one hundred times as large as the thickness of the insulating layer.

21. The semiconductor device according to claim 18, further comprising a metal layer, wherein the insulating layer has a back surface on a side opposite to the main surface, and the metal layer is bonded to the back surface of the insulating layer, and
the metal layer has a thickness that is smaller than the thickness of the first conductive plate and the second conductive plate.

22. The semiconductor device according to claim 21, further comprising a heat radiator bonded to the metal layer.

23. The semiconductor device according to claim 18, wherein the first conductive plate and the second conductive plate each have a first layer and a second layer, the first layer being bonded to the main surface of the insulating layer, and the second layer being located on a side of the first layer opposite to the insulating layer in the thickness direction, and
the second layer has a thickness that is larger than a thickness of the first layer.

24. A semiconductor device, comprising:
a first conductive plate including a first main surface perpendicular to a thickness direction of the first conductive plate;
a second conductive plate including a second main surface perpendicular to the thickness direction, the second conductive plate being spaced apart from the first conductive plate in a first direction perpendicular to the thickness direction;
a plurality of first switching elements electrically bonded to the first conductive plate and electrically connected to the second conductive plate;
a plurality of second switching elements electrically bonded to the second conductive plate;
a first supply terminal electrically bonded to the first conductive plate;
a second supply terminal having a region that overlaps with the first supply terminal as viewed in the thickness direction, the second supply terminal being spaced apart from the first conductive plate and the first supply terminal in the thickness direction, wherein
the second supply terminal is electrically connected to the plurality of second switching elements,
each of the second switching elements is provided with a main surface electrode,
the second supply terminal includes a first band-shaped portion and a plurality of second band-shaped portions, the first band-shaped portion extending in a second direction perpendicular to the thickness direction and the first direction, and the plurality of second band-shaped portions extending from the first band-shaped portion toward the second conductive plate and being spaced apart from each other in the second direction, and
the plurality of second band-shaped portions are respectively electrically connected to the main surface electrodes of the plurality of second switching elements; and a plurality of conductive wires that connect the plurality of second band-shaped portions and the plurality of second switching elements to each other,
wherein each of the plurality of conductive wires extends in the first direction.

* * * * *